United States Patent [19]
Ozawa et al.

[11] Patent Number: 5,107,447
[45] Date of Patent: Apr. 21, 1992

[54] ABNORMALITY DIAGNOSING SYSTEM AND METHOD FOR A HIGH VOLTAGE POWER APPARATUS

[75] Inventors: Jun Ozawa; Fumihiro Endo; Youichi Ohshita, all of Hitachi; Izumi Yamada, Ibaraki; Tokio Yamagiwa, Hitachi; Hiroshi Yamada, Hitachi; Mitsuo Sawairi, Hitachi; Hashime Nagai, Kitaibaraki, all of Japan

[73] Assignee: Hitachi, Ltd., Tokyo, Japan

[21] Appl. No.: 352,490

[22] Filed: May 16, 1989

[30] Foreign Application Priority Data

May 16, 1988 [JP] Japan .................. 63-116828

[51] Int. Cl.$^5$ ............................. G01R 31/08
[52] U.S. Cl. ............... 364/551.01; 324/536; 324/544
[58] Field of Search ........... 364/550, 551.01, 492, 364/578, 802, 481, 484, 485; 324/536, 541, 544, 551, 557; 361/111, 113

[56] References Cited

U.S. PATENT DOCUMENTS

| | | | |
|---|---|---|---|
| H536 | 10/1988 | Strickland et al. | 324/536 |
| 4,249,126 | 2/1981 | McConnell | 324/544 |
| 4,446,420 | 5/1984 | Drouet | 324/536 |
| 4,476,535 | 10/1984 | Loshing et al. | 364/550 |
| 4,630,218 | 12/1986 | Hurley | 364/481 |
| 4,707,796 | 11/1987 | Calabro et al. | 364/550 |
| 4,761,748 | 8/1988 | Le Rat et al. | 364/551.01 |
| 4,773,028 | 9/1988 | Tallman | 364/578 |
| 4,829,256 | 5/1989 | Yamagiwa et al. | 324/536 |
| 4,882,682 | 11/1989 | Takasuka et al. | 364/551.01 |
| 4,894,785 | 1/1990 | Fernandes | 364/481 |

OTHER PUBLICATIONS

IEEE Transactions on Power Apparatus and Systems; vol. PAS-100; No. 6; Jun. 1981.

*Primary Examiner*—Parshotam S. Lall
*Assistant Examiner*—Michael Zanelli
*Attorney, Agent, or Firm*—Antonelli, Terry, Stout & Kraus

[57] ABSTRACT

An abnormality diagnosing system and method for high voltage power apparatus wherein a plurality of detectors for detecting abnormalities of the high voltage power apparatus and providing outputs indicative thereof are disposed to detect predetermined phenomena indicative of at least an insulation abnormality, power supply abnormality and foregin matter among abnormalities existing inside of the high voltage power apparatus. A monitoring arrangement responsive to the outputs of the detectors provides at least one of an output and display of the kind of abnormality detected.

24 Claims, 38 Drawing Sheets

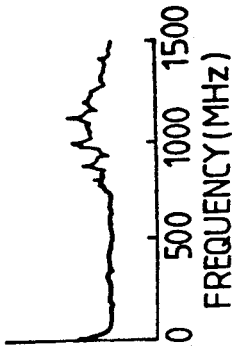
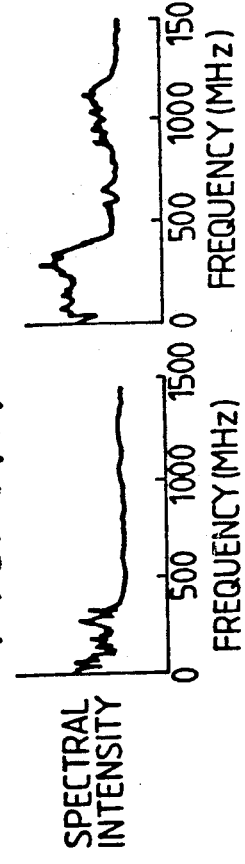
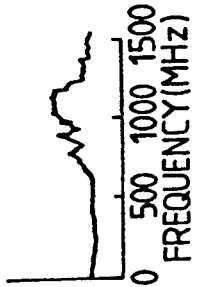
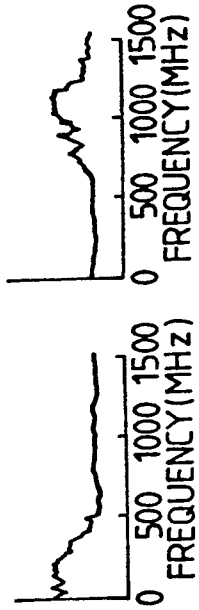
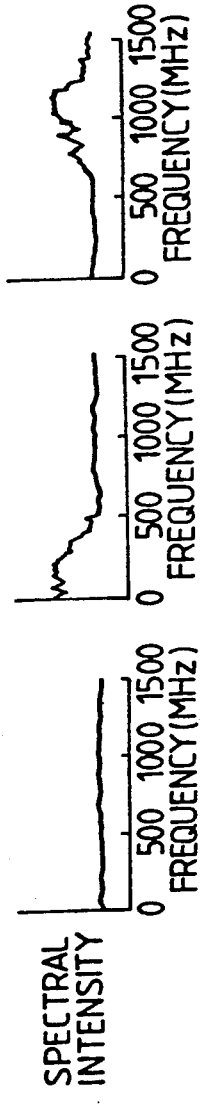
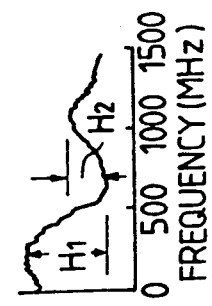
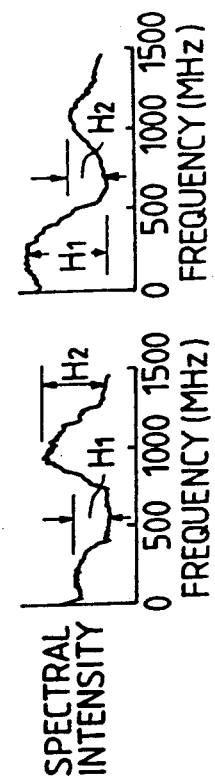

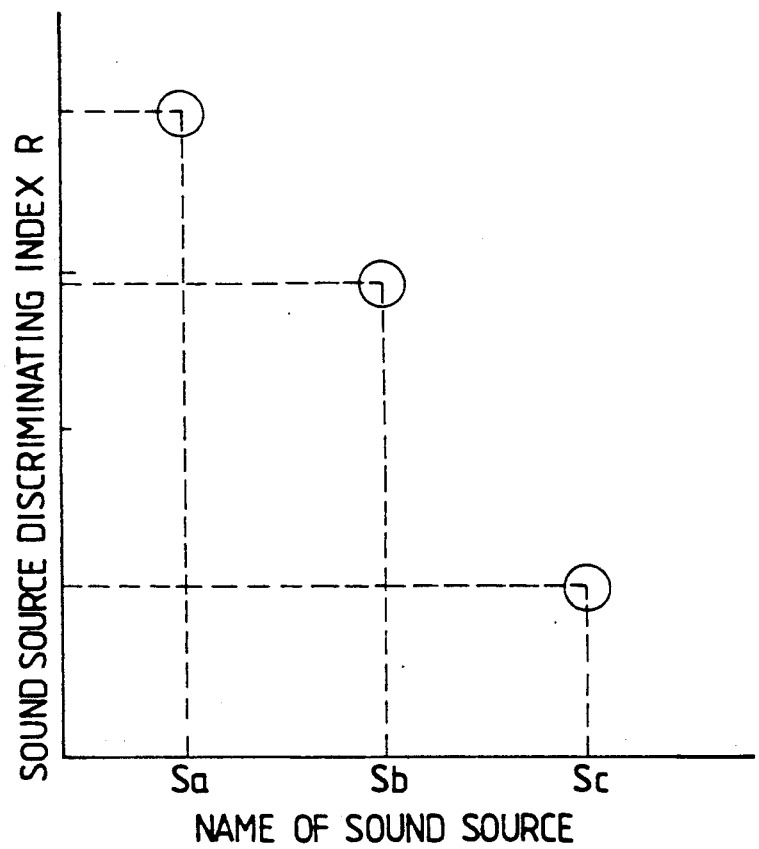

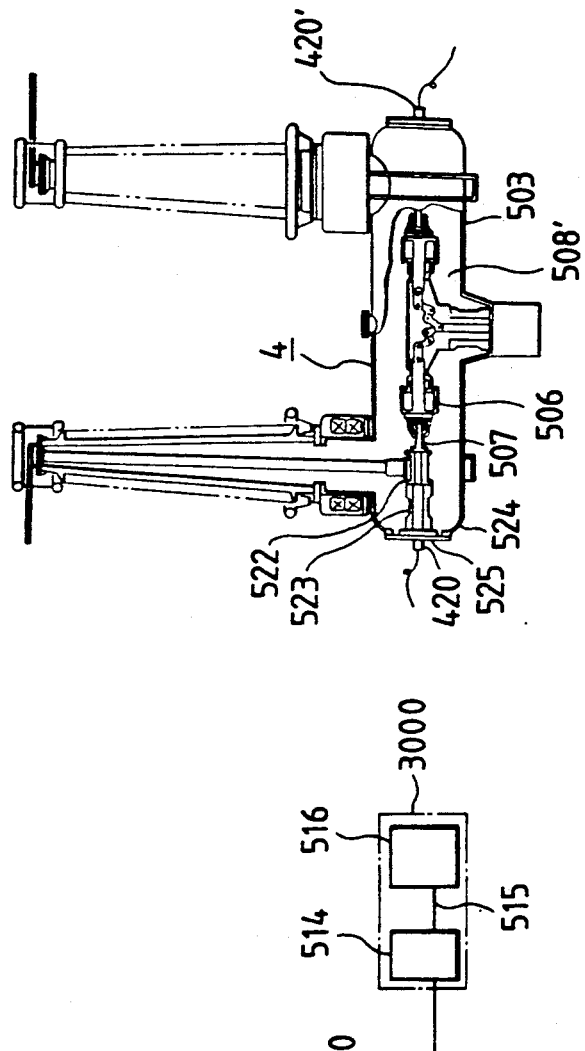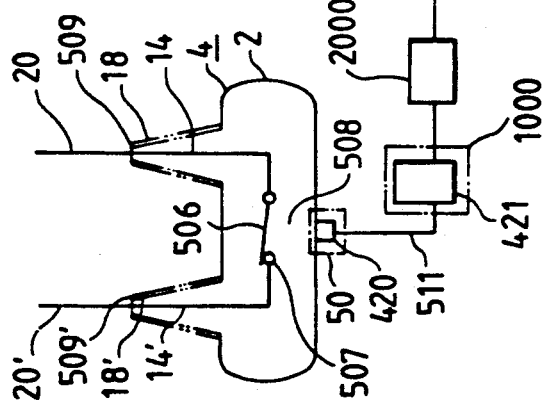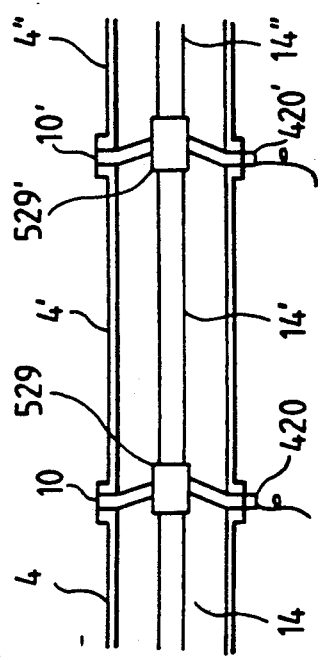

FIG. 53

| NO. | ITEM | DISPLAY CONTENT |
|---|---|---|
| 1 | GAS PRESSURE DROP | (1) GAS SUPPLY METHOD<br>(2) POSSIBILITY OF OPERATION CONTINUATION (JUDGEMENT BY GAS PRESSURE CHANGE TREND)<br>(3) GAS-SEAL TEST METHOD<br>(4) COMMUNICATION ADDRESS AND NECESSARY ITEMS OF COMMUNICATION |
| 2 | INSULATION ABNORMALITY | (1) ABNORMALITY DETECTED PORTION<br>(2) COUNTER MEASURE GUIDANCE<br>  1) SYSTEM OPERATION METHOD<br>  2) JUDGEMENT OF OPERATION<br>  3) PRECISE INSPECTION METHOD<br>(3) COMMUNICATION ADDRESS AND NECESSARY ITEMS OF COMMUNICATION |
| 3 | SWITCH OPERATION ABNORMALITY (CB, DS, ES) | (1) SWITCH OPERATION ABNORMALITY<br>(2) COUNTER MEASURE GUIDANCE<br>  1) SYSTEM OPERATION METHOD<br>  2) JUDGEMENT OF OPERATION<br>  3) PRECISE INSPECTION METHOD<br>(3) COMMUNICATION ADDRESS AND NECESSARY ITEMS OF COMMUNICATION |

FIG. 57

| NO | YR | MO | DAY | HR | MIN | SEC | CLOSE T1 | JUDGE-MENT | T2 | JUDGE-MENT |
|---|---|---|---|---|---|---|---|---|---|---|
| 31 | 88 | 01 | 09 | 01 | 01 | 10 | 85 |   | 115 |   |
| 32 | 88 | 01 | 10 | 01 | 01 | 01 | 65 |   | 120 |   |
| 33 | 88 | 01 | 10 | 01 | 01 | 05 | 60 |   | 125 |   |
| 34 | 88 | 01 | 10 | 01 | 01 | 10 | 55 |   | 110 |   |
| 35 | 88 | 01 | 11 | 01 | 01 | 15 | 45 | * | 135 |   |
| 36 | 88 | 01 | 11 | 01 | 01 | 01 | 35 | * | 120 |   |
| 37 | 88 | 01 | 11 | 01 | 01 | 15 | 60 |   | 150 | * |
| 38 | 88 | 01 | 12 | 01 | 01 | 20 | 55 |   | 145 |   |
| 39 | 88 | 01 | 12 | 01 | 01 | 01 | 40 | * | 105 |   |
| 40 | 88 | 01 | 12 | 01 | 01 | 05 | 80 |   |   |   |
| 41 | 88 | 01 | 12 | 01 | 01 | 10 | 85 |   | 115 |   |
| 42 | 88 | 01 | 13 | 01 | 01 | 01 | 65 |   | 120 |   |
| 43 | 88 | 01 | 13 | 01 | 01 | 05 | 60 |   | 125 |   |
| 44 | 88 | 01 | 13 | 01 | 01 | 10 | 55 |   | 110 |   |
| 45 | 88 | 01 | 13 | 01 | 01 | 15 | 45 | * | 135 |   |
| 46 | 88 | 01 | 14 | 01 | 01 | 01 | 35 | * | 120 |   |
| 47 | 88 | 01 | 14 | 01 | 01 | 15 | 60 |   | 150 | * |
| 48 | 88 | 01 | 15 | 01 | 01 | 20 | 55 |   | 145 |   |
| 49 | 88 | 01 | 15 | 01 | 01 | 01 | 40 | * | 105 |   |
| 50 | 88 | 01 | 15 | 01 | 01 | 05 | 80 |   |   |   |

CB SWITCH CHARACTERISTICS RECORDING

REFERENCE VALUE: 88/03/11 11:01:17  T1 = 60  T2 = 125  T3 = 26  T4 = 40

| NO | YR | MO | DAY | HR | MIN | SEC | OPEN T3 | JUDGE-MENT | T4 | JUDGE-MENT |
|---|---|---|---|---|---|---|---|---|---|---|
| 31 | 88 | 01 | 14 | 01 | 01 | 01 | 15 |   | 49 |   |
| 32 | 88 | 01 | 15 | 01 | 01 | 01 | 28 | * | 40 |   |
| 33 | 88 | 01 | 15 | 01 | 01 | 05 | 16 |   | 41 |   |
| 34 | 88 | 01 | 15 | 01 | 01 | 10 | 20 |   | 35 |   |
| 35 | 88 | 01 | 15 | 01 | 01 | 15 | 30 |   | 45 |   |
| 36 | 88 | 01 | 16 | 01 | 01 | 01 | 15 |   | 48 |   |
| 37 | 88 | 01 | 16 | 01 | 01 | 15 | 24 |   | 32 | * |
| 38 | 88 | 01 | 16 | 01 | 01 | 20 | 25 |   | 28 | * |
| 39 | 88 | 01 | 16 | 01 | 01 | 01 | 36 | * | 35 |   |
| 40 | 88 | 01 | 17 | 01 | 01 | 05 | 20 |   | 31 |   |
| 41 | 88 | 01 | 17 | 01 | 01 | 10 | 37 | * | 48 |   |
| 42 | 88 | 01 | 18 | 01 | 01 | 01 | 20 |   | 41 |   |
| 43 | 88 | 01 | 18 | 01 | 01 | 05 | 21 |   | 42 |   |
| 44 | 88 | 01 | 18 | 01 | 01 | 20 | 18 |   | 51 | * |
| 45 | 88 | 01 | 19 | 01 | 01 | 01 | 20 |   | 47 |   |
| 46 | 88 | 01 | 19 | 01 | 01 | 05 | 21 |   | 46 |   |
| 47 | 88 | 01 | 19 | 01 | 01 | 10 | 14 |   | 40 |   |
| 48 | 88 | 01 | 19 | 01 | 01 | 20 | 25 |   | 29 | * |
| 49 | 88 | 01 | 20 | 01 | 01 | 01 | 28 |   | 30 |   |
| 50 | 88 | 01 | 20 | 01 | 01 | 05 | 18 |   | 33 |   |

ABNORMALITY DIAGNOSING SYSTEM AND METHOD FOR A HIGH VOLTAGE POWER APPARATUS

BACKGROUND OF THE INVENTION

This invention relates to an abnormality diagnosing system and method for high voltage power apparatus, and more particularly to a system and method which will be suitable for diagnosing at least an insulation of a abnormality, a power supply abnormality, and for detection of a mixture of foreign matter.

Conventional abnormality diagnosing techniques for high voltage power machinery or apparatus are of a discrete type. As to an insulation abnormality, reference is made to Japanese Patent Laid-Open No. 2518/1984, Japanese Patent Laid Open No. 41135/1980, Int. Symp. on Gas Insulated Substations, L1(1985) and the like, and as to a power supply abnormality, Japanese Patent Laid-Open No. 31323/1981, IEEE Trans. Power Apparatus and Systems, Vol. PAS-100, No. 6 (1981), pp. 2733-2739, and the like. The Int. Symp. on Gas Insulated Substations, L1, for example, describes means for detecting signals of partial discharge from a few MHz to a few GHz. Japanese Patent Laid-open No. 41135/1980 detects an impingement sound of foreign matter jumping due to the oscillation of GIS or to the electric field and monitors the existence of the foreign matter. Furthermore, as the diagnosis of a power supply abnormality, Japanese Patent Laid-Open No. 117421/1980 proposes a processor having a complicated algorithm for detecting the oscillation from a tank. Document PE-87-7 of Power Technique diagnosing system of substation apparatuses and abnormality diagnosis is made by the employment of an external diagnosis system, primary processing of sensor signals, function bearing between field panels and a center panel, the employment of optical transmission and a computer.

The conventional technique described above contemplates to detect individually the insulation abnormality and power supply abnormality of high voltage power machinery. However, processing techniques of abnormality signals do not always match the needs and sometimes overlook the abnormality signals. Furthermore, a sufficient consideration is not paid to the algorithm of abnormality diagnosis by various signals and the problem remains that highly accurate diagnosis cannot be made from the determination of the factor and degree of abnormality to the determination of position.

For example, although the Symp. on Gas Insulated Substations, L1 describes means for detecting partial discharge as the symptom of an insulation abnormality by detecting a high frequency electrical signal of above several MHz, the document does not discuss means for eliminating noise when the noise is so great that a delicate partial discharge cannot be detected. The same noise problem occurs in means for detecting the jumping oscillation of very small foreign matter by AE (Acoustic Emission), and this problem also exists in detection means of a power supply abnormality.

A document of the Power Technique Research Section of Electric Science Society introduces a diagnosing system of substation apparatuses, but even though such system can detect the abnormality signals, it cannot diagnose qualitatively and quantitatively the abnormality because the correlation between the kind, degree and position of the abnormality and the signal is not known sufficiently. Furthermore, a sufficient consideration is not paid to the consistent system of method of abnormality diagnosis, display, recording and transfer means and the system lacks therefore rationality and economy.

SUMMARY OF THE INVENTION

It is therefore an object of the present invention to eliminate the problems described above, and to provide a system and method which can diagnose highly accurately the insulation performance and power supply performance of high voltage power apparatus and can enable suitable prevention, anticipation and preservation such as processing guidance of abnormality, life anticipation, and so forth.

In accordance with the present invention, the object described above can be accomplished by detecting a peculiar frequency component of a very small signal occurring due to an insulation abnormality, a power supply abnormality or the mixture of very small foreign matter, executing calculation processing with a signal of another phase, for example, to eliminate the noise, optically transmitting the resulting abnormality signal, whenever necessary, inputting the abnormality signal with atmospheric signals or the like as the data for an abnormality diagnosing program by an expert system, determining their relation with the signals that have already been recorded, diagnosing exclusively the abnormality, and outputting the points, processing guidance, life anticipation, etc., as the result of diagnosis on a CRT, a printer, or the like.

Electrical signals having a frequency above some hundreds of MHz generated by partial discharge of the insulation abnormality, for example, are collected as a frequency spectrum, and the spectrum from each phase is subtracted with others so that the noise can be eliminated. Next, the polarity and phase of a commercial frequency voltage this in which signal occurs is determined, and signals such as an acoustic signal from a container are inputted so that the position of a gas insulated apparatus at which an electrically conductive foreign matter having such length exists can be diagnosed.

As to the signal processing portions, the present invention uses a local or field panel system for integrating the signals of many sensors, analog/digital conversion, optical transmission, a field panel buildup system of diagnostic information, a high function mobile diagnosing car, a time division system of signal recording, an atmospheric start system, a continuous system, a system for checking soundness of a signal detection system, a loop system of transmission, a star system, and the like, because most of the signals are weak and remote transmission is necessary. In this manner signal transmission can be effected with high reliability and high accuracy.

As to the collective diagnosing portion, the usable period of the gas insulated apparatus is anticipated by the comparison with the abnormality critical values and the past data on the basis of various processed signals, a repair method is judged on the basis of inspection/repair method data, the anticipated cost for the repair is outputted from repair cost data, and the result is either displayed or printed out for easy use by users. Moreover, external signals such as atmospheric data and data of the unusual change of weather are detected, too, and are inputted to the collective diagnosing input. Furthermore, the signal detection period is optimized so as to accomplish effective diagnosis having higher reliability and processing guidance.

The existence of partial discharge as the symptom of the insulation abnormality can be discriminated and the jump of very small conductive foreign matter can be detected by detecting the electrical signals and acoustic signals of a frequency range in accordance with the present invention by means of sensors disposed in the high voltage power machinery. The symptom of the power supply abnormality can also be detected.

A partial discharge occurs if the conductive foreign matter adhere to the surface of high voltage conductors and spacers inside the high voltage power machinery and its electrical signal contains a wide range of frequency components ranging from some hundreds of KHz to some hundreds of GHz, but the atmospheric partial discharge containing many low frequency components can be distinguished easily by detecting the signals in the range of some hundreds of MHz to some hundreds of GHz among them. If the noise is so great that discrimination cannot be effected, the balance with the signal of other phases not containing the abnormality, for example, is calculated, and by so doing the noise elimination can be made more accurately.

When a fine foreign matter impinges against the container of the high voltage power apparatus, a high frequency component of some hundreds of KHz comes to be contained because the contact time is short. This frequency distribution varies with the material and impinging speed of the foreign matter. On the other hand, the sound of rain, the impact sound and the noise have a low frequency. Therefore, the noise of the rain sound and the impact sound can be eliminated by measuring the acoustic signals of the high frequency components by AE, measuring the acoustic signals of the low frequency components and calculating their ratio.

It has been found out as the result of experiments that the vibration of from 200 to 5,000 Hz propagates through the tank at an initial abnormality of the power supply and this is some multiples of the commercial frequency. The abnormality can be judged by detecting this acoustic signal. At a later stage of the power supply abnormality, heat transfers to the tank and the surface temperature of the tank rises. This can be measured easily by an infrared camera, but since the influences of the solar radiation are found to exist, the infrared camera is optimized in consideration of measurement at night time or a radiation factor to eliminate the influences of the solar radiation.

The signals such as described above are weak and large in number and must be transferred to a remote place. Therefore, a system capable of integrating these signals, amplifying, converting, calculating, recording, checking and transmitting them is disposed at site so that the collective diagnosis can be made in a control/instruction room. As to the sympton having a low frequency of occurrence, a highly accurate mobile type diagnosing car exhibits a suitable and economical function.

The collective diagnosing portion can output with high relilability the life anticipation, the repair method judgment and the repair cost calculation by optimization means such as comparison of the external signals with the abnormality signals, the detection period of the abnormality signals and the diagnosing sequence. Accordingly, diagnosis can be made highly efficiently and quantitatively and suitable processing guidance can be obtained.

These and further objects, features and advantages of the present invention will become more obvious from the following description when taken in connection with the accompanying drawings, wherein.

Figure 10A:
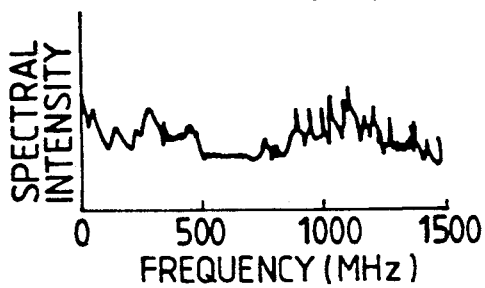
Figure 10B:
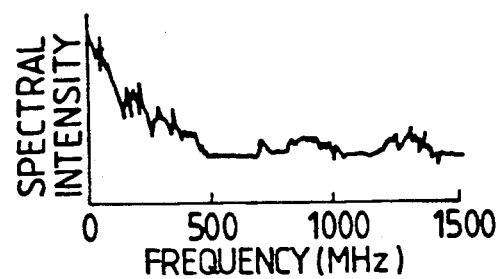
Figure 10C:
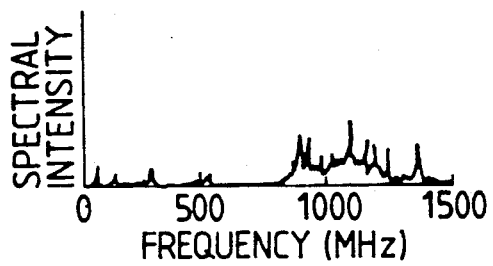
Figure 11A:
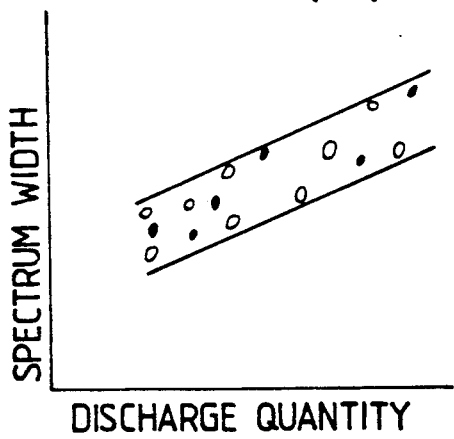
Figure 11B:
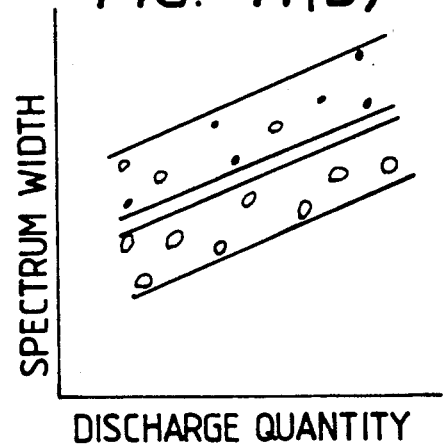
Figure 12A:
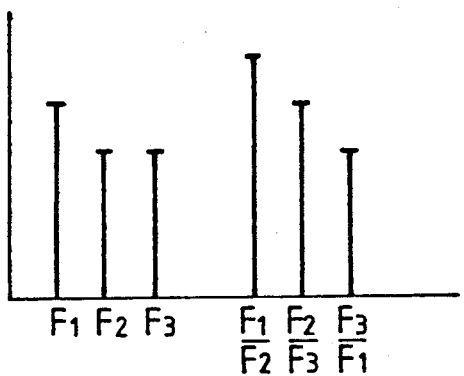
Figure 12B:
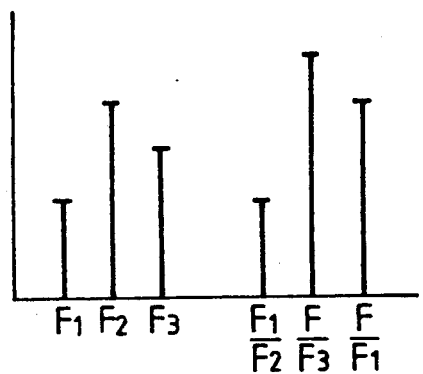
Figure 12C:
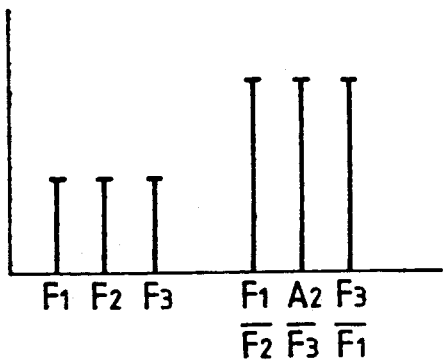
Figure 13:
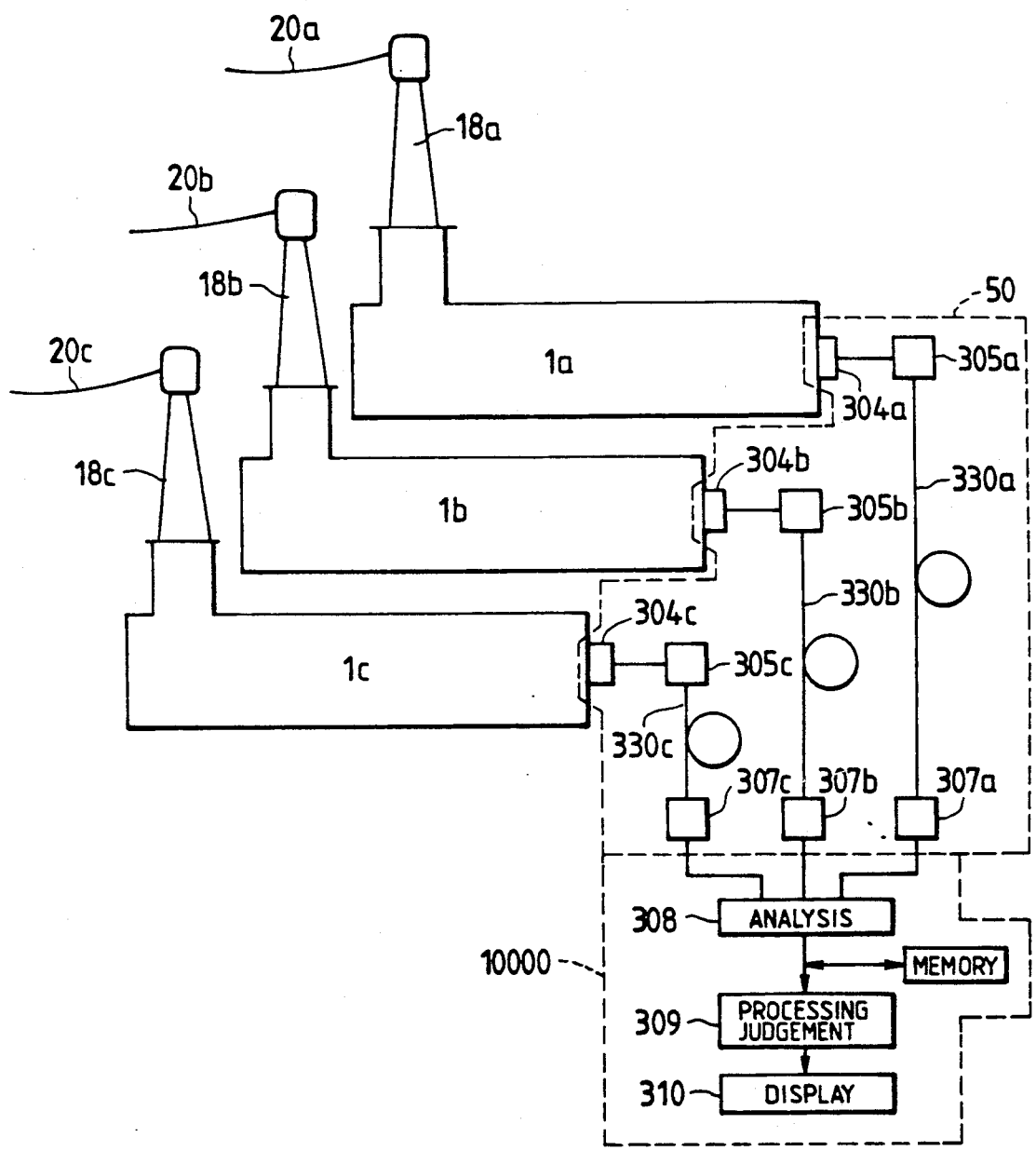
Figure 14:
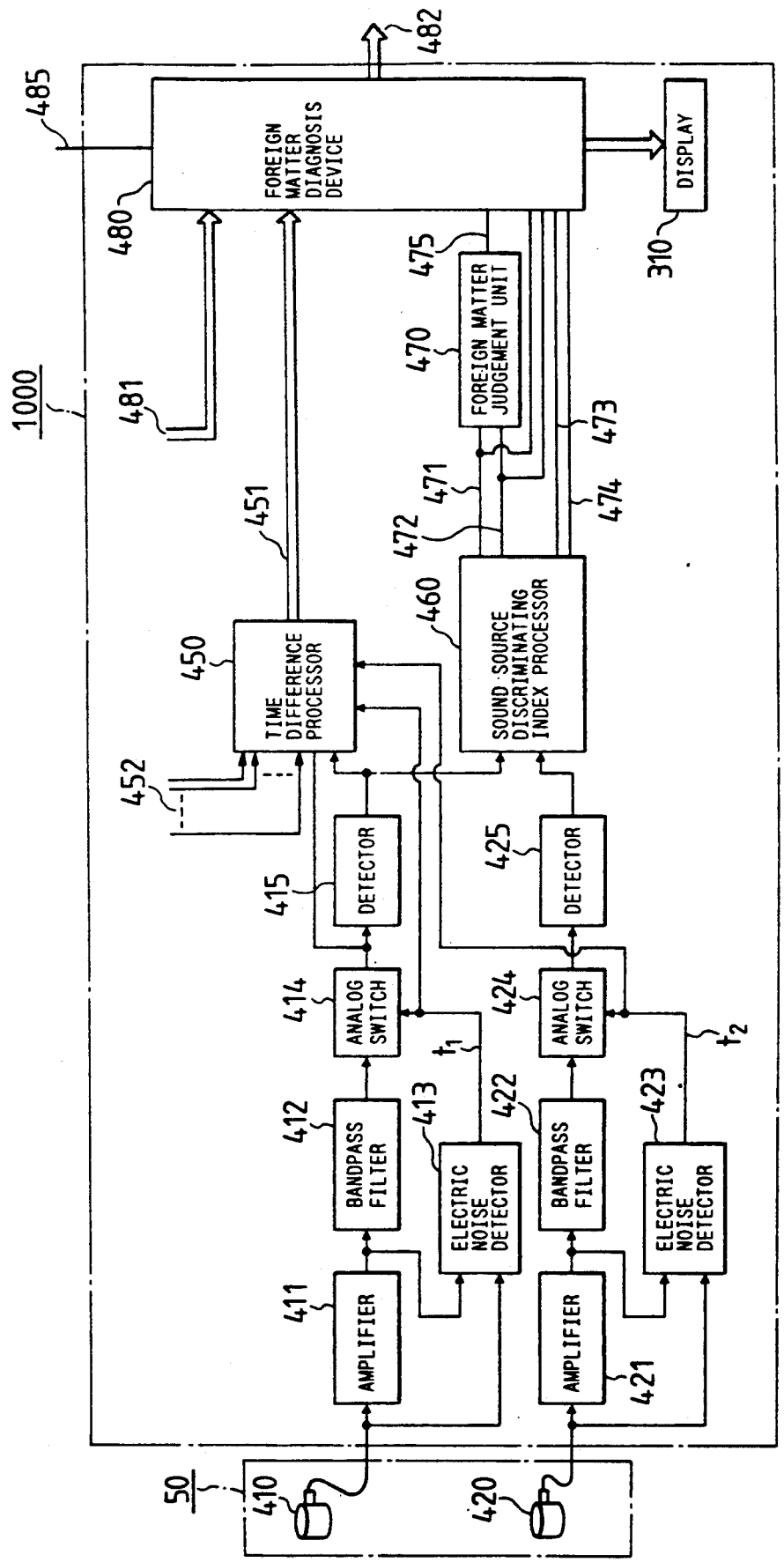
Figure 15:
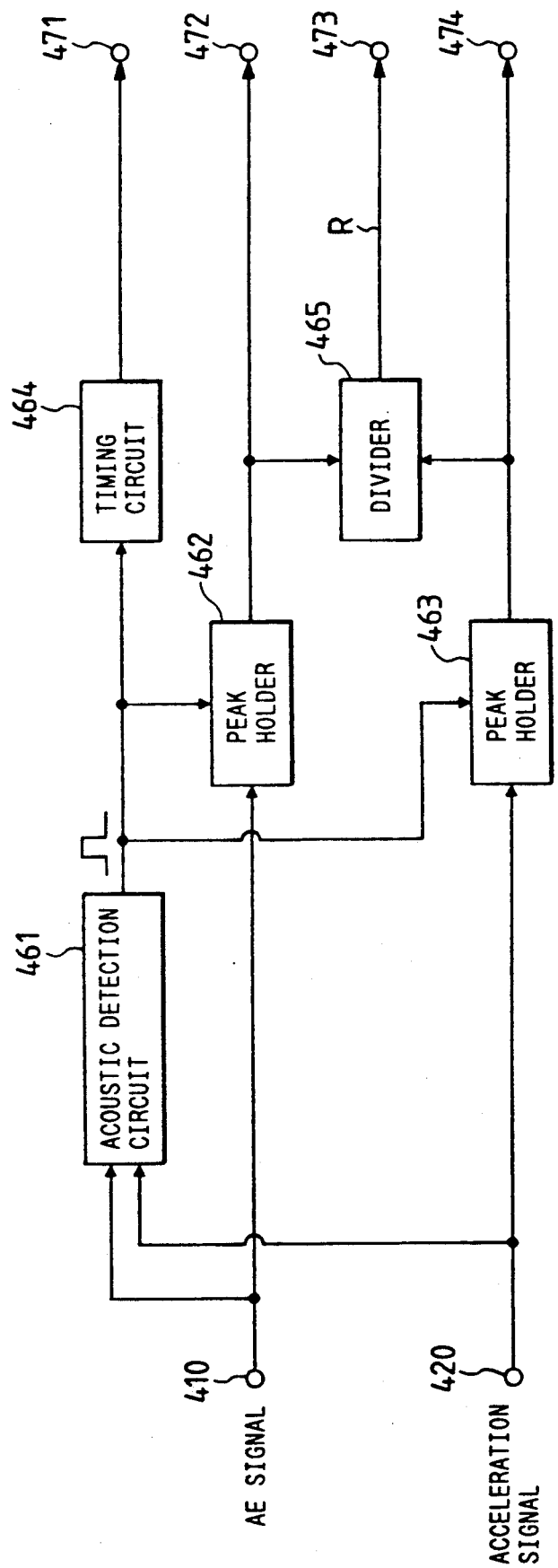
Figure 17A:
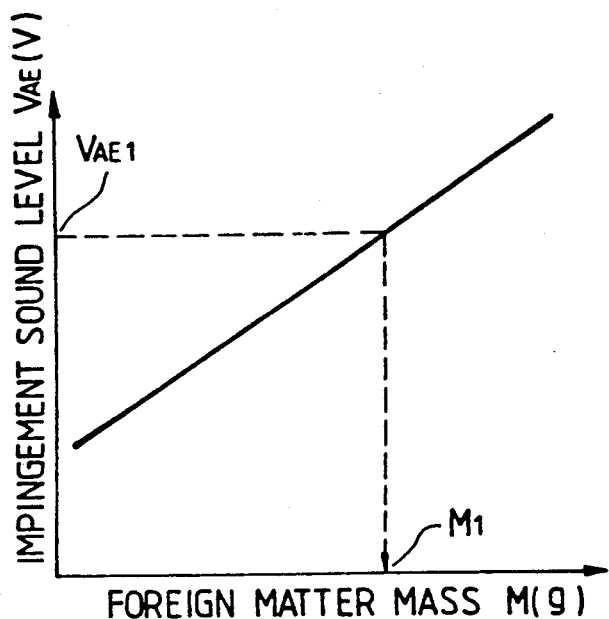
Figure 17B:
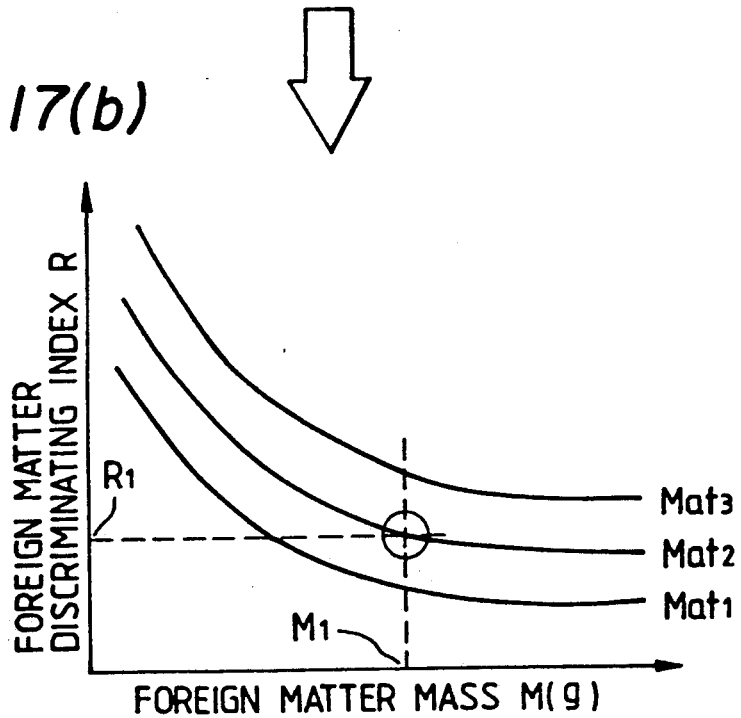

FIGS. 8(a)-8(c) illustrate spectrum distribution for explaining the difference of the spectrum distribution in accordance with the occurring position of partial discharge in the present invention;

FIGS. 9(a)-9(e) illustrate five spectrum patterns;

FIGS. 10(a)-10(c) illustrate the principle of spectrum subtraction in the present invention;

FIGS. 11(a)-(b) illustrate the difference of the spectrum width due to the gas space discharge and the spacer creep discharge;

FIGS. 12(a)-12(c) illustrate and show the principle and relation between the internal discharge position and the standard pattern of the spectral intensity by causing simulated internal discharge;

FIG. 13 is a schematic explanatory view showing another embodiment of the present invention;

FIG. 14 is a block diagram for fine foreign material detection;

FIG. 15 is a block diagram of an acoustic discrimination calculator;

FIG. 16 shows an example of the result of acoustic discrimination calculation;

FIGS. 17(a)-17(b) are views showing judgement of the material of the foreign matter.

Figure 21:
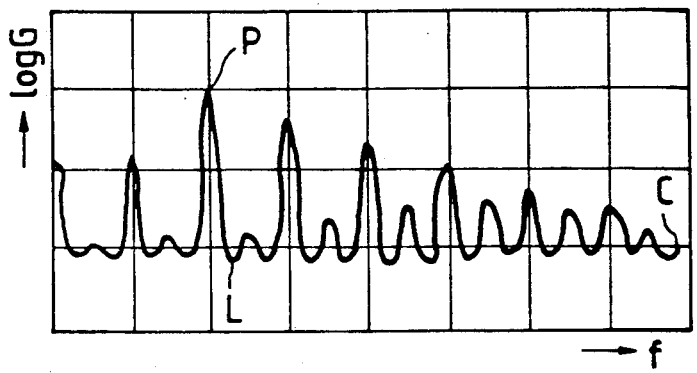
Figure 22:
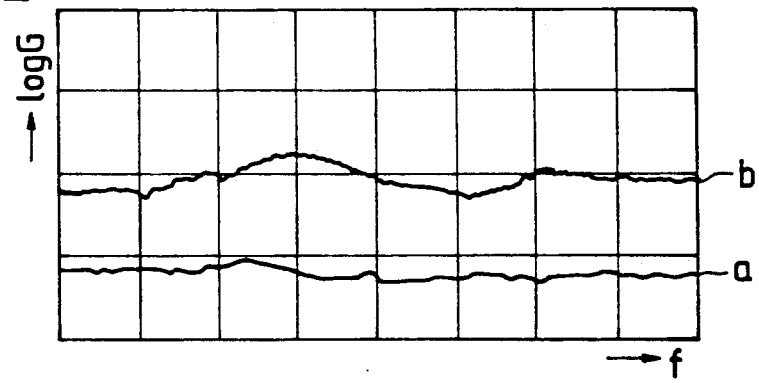
Figure 23:
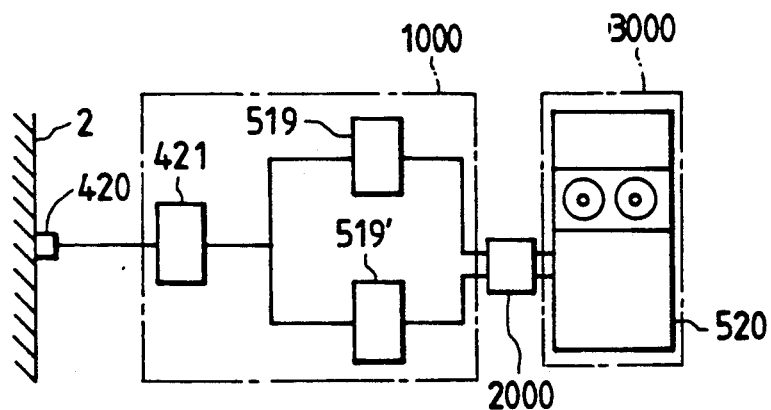
Figure 24:
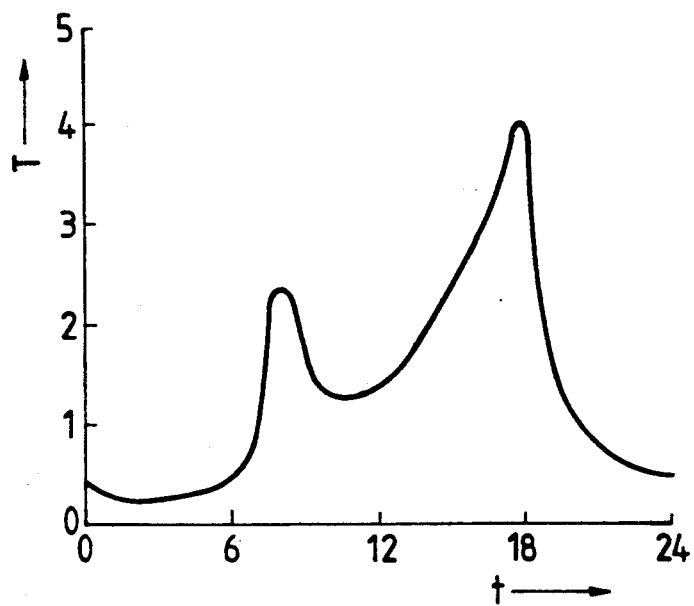
Figure 25:
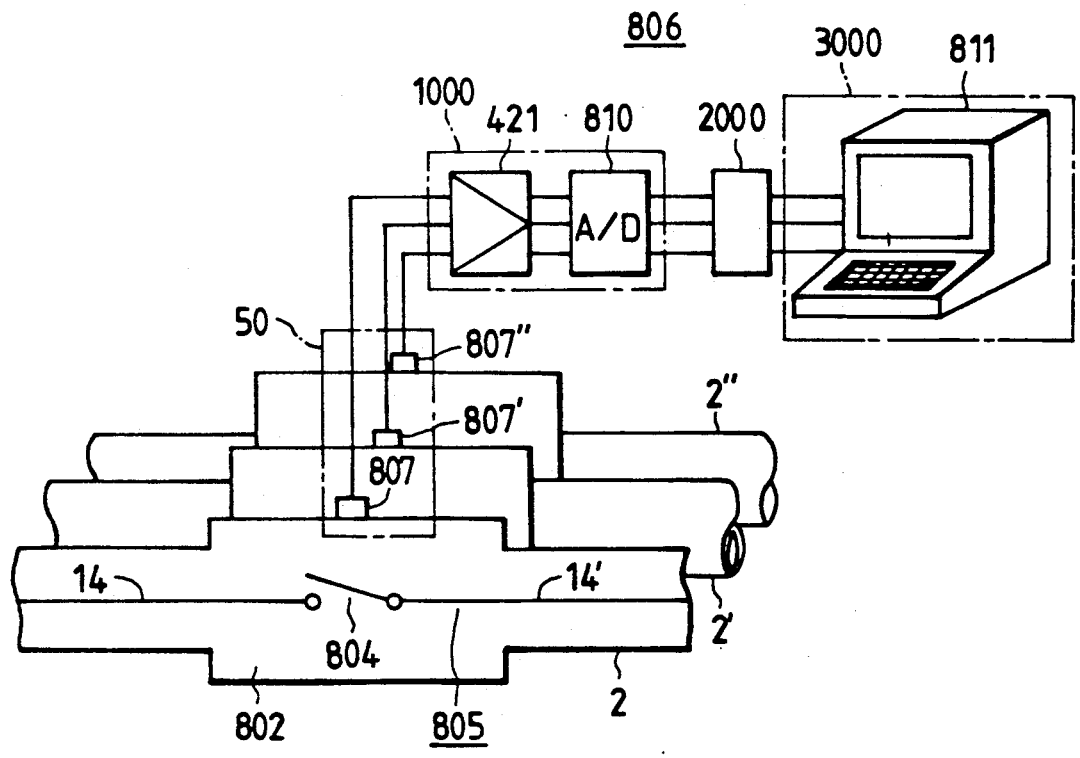
Figure 26:
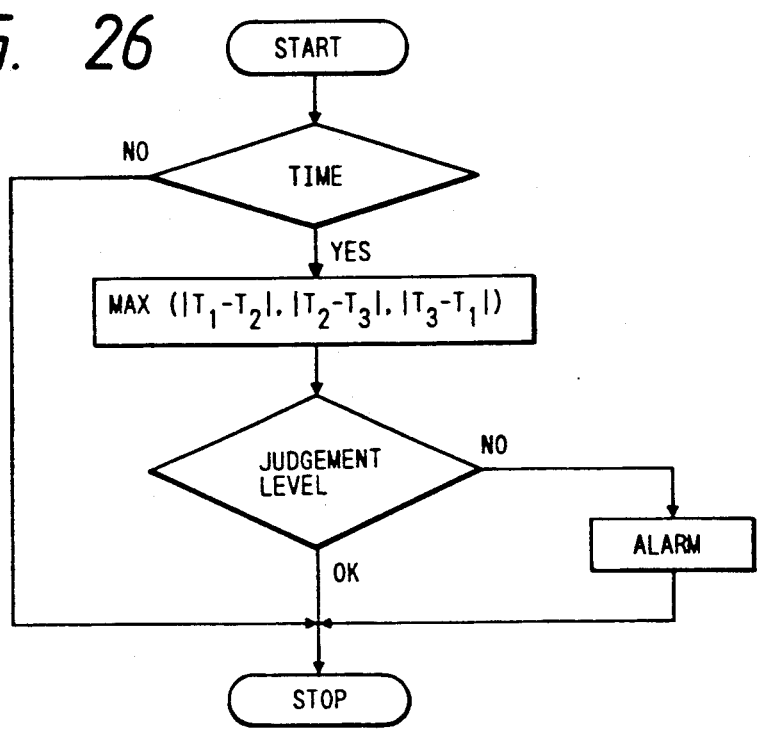
Figure 27:
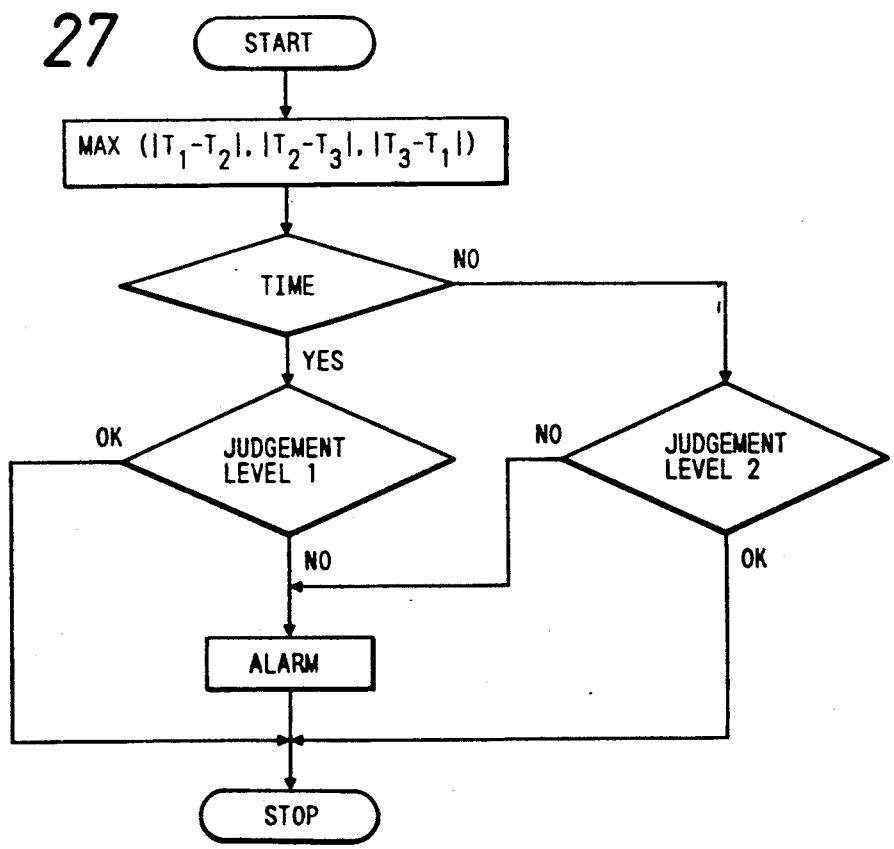
Figure 28:
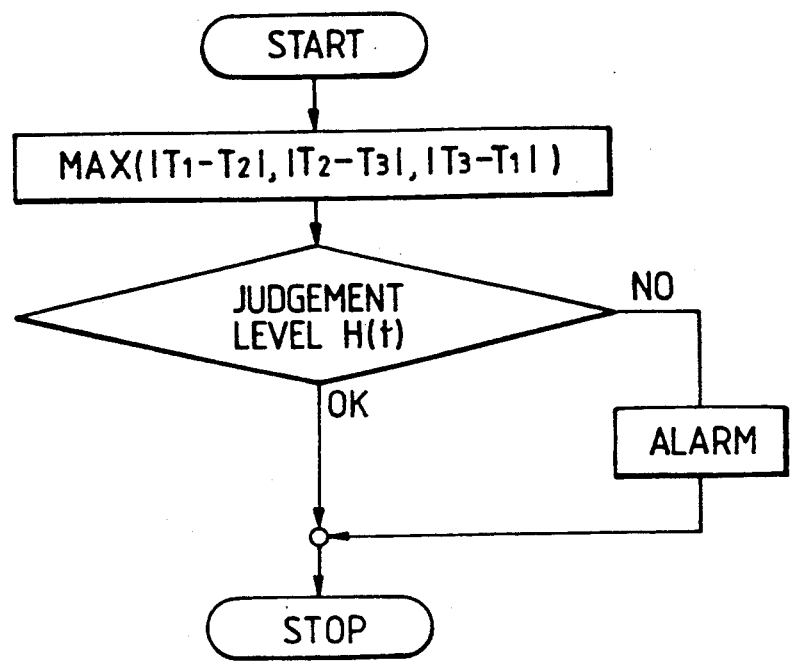
Figure 29A:
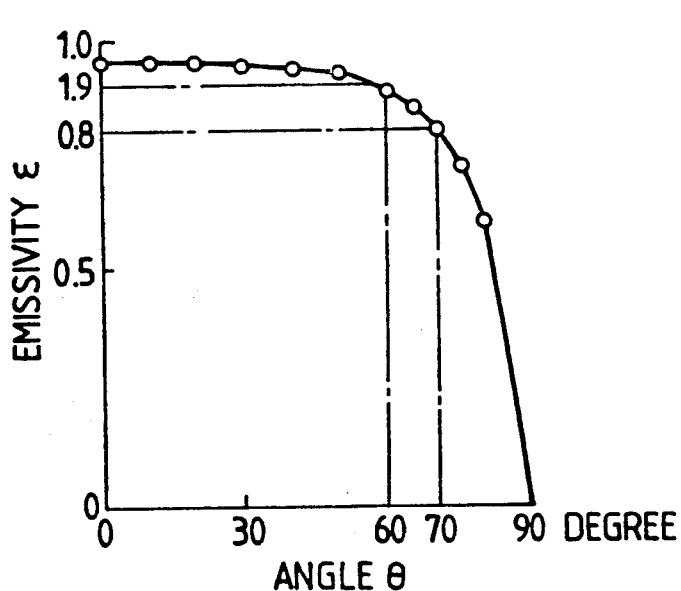
Figure 29B:
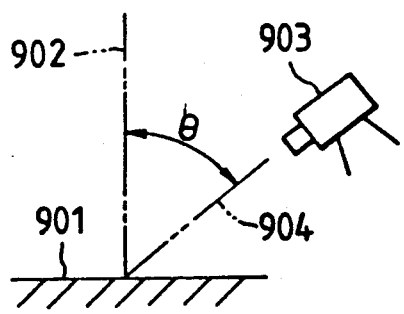
Figure 30:
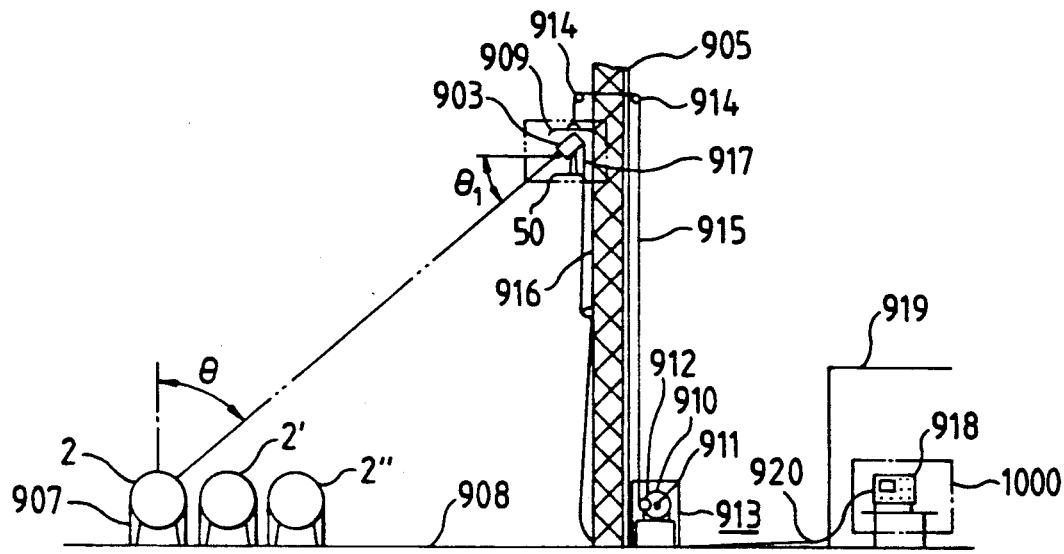
Figure 31:
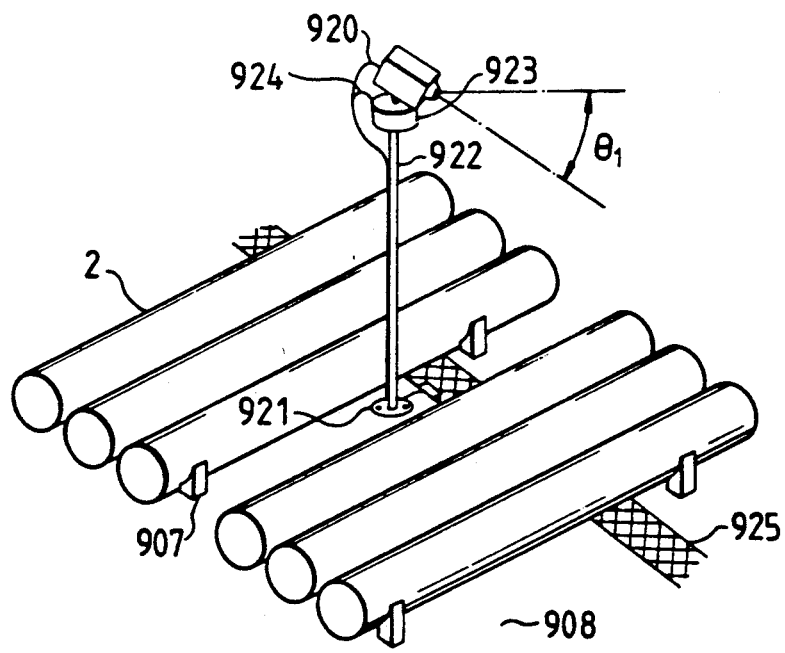
Figure 32:
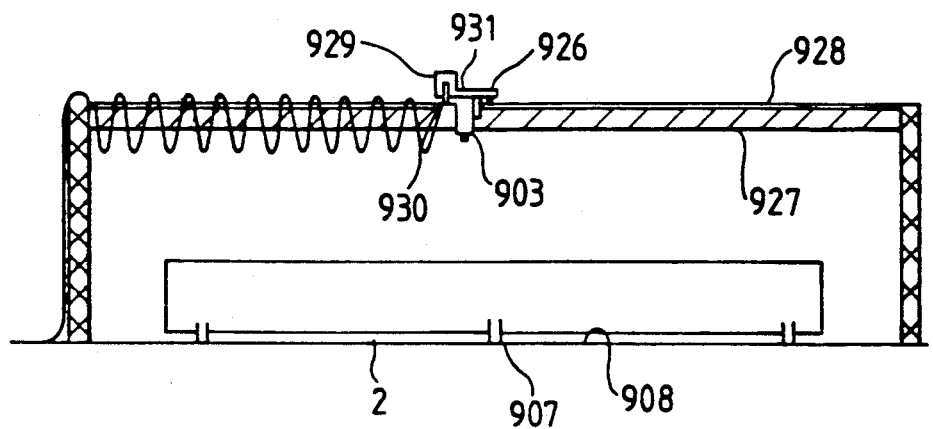
Figure 33:
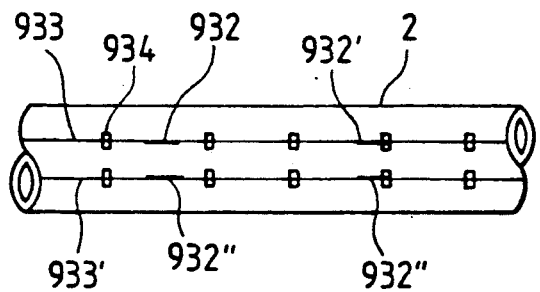
Figure 34:
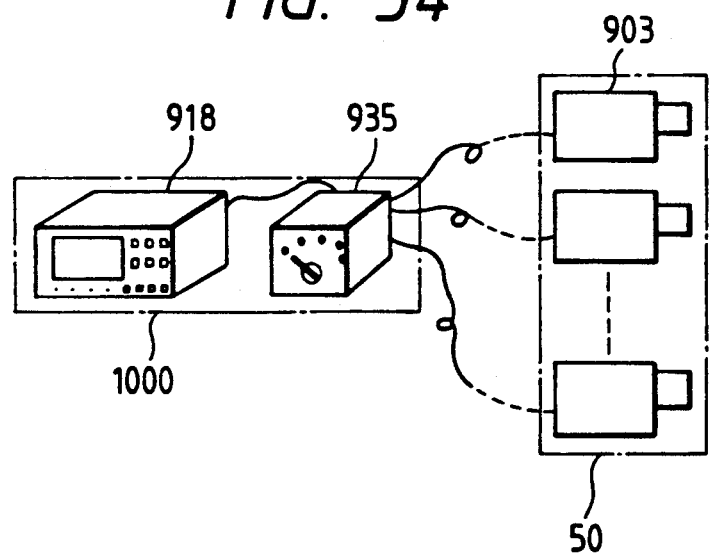
Figures 35A, 35B, 35C:
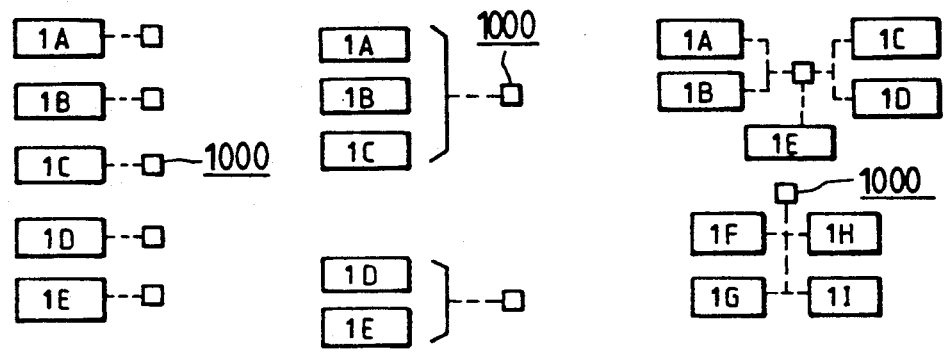

FIG. 18 shows a structural example of an oscillation measurement system of the present invention;

FIG. 19 shows an example of the application of the present invention to a breaker;

FIG. 20 shows an example of the application of the present invention to a gas insulated switching apparatus;

FIGS. 21 and 22 show the examples of frequency analysis output waveforms;

FIG. 23 shows another structural example of the oscillation measurement system;

FIG. 24 illustrates the principle of the temperature measurement method of the present invention;

FIG. 25 shows a structural example of the temperature measurement system of the present invention;

FIGS. 26 to 28 show the functions of a temperature measurement processor;

FIGS. 29(a)-29(b) show an example of measurement of an infrared radiation ratio and a relational diagram of the tank of the gas insulation apparatus and an infrared camera;

FIG. 30 shows a fitting example of the infrared camera inside a substation;

FIGS. 31 and 32 show other embodiments of the embodiment shown in FIG. 30;

FIG. 33 shows an example of marking;

FIG. 34 shows a connection example of the infrared camera and the processor;

FIGS. 35(a)-35(c) show examples of a signal transfer method.

Figure 36:
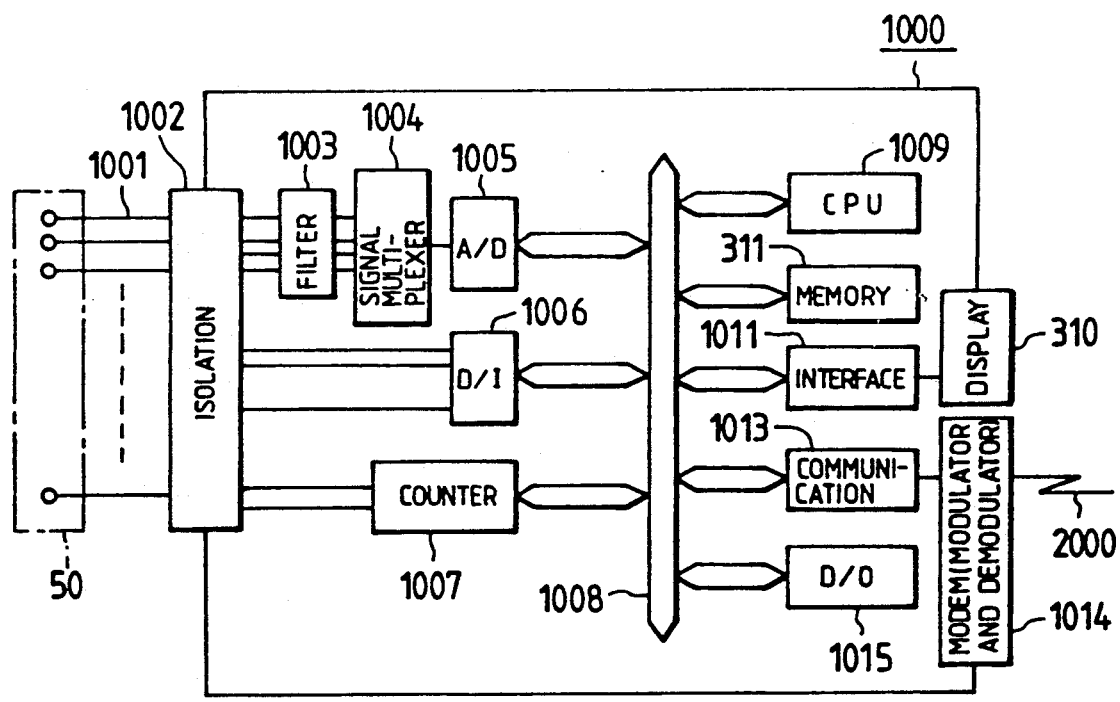
Figure 37:
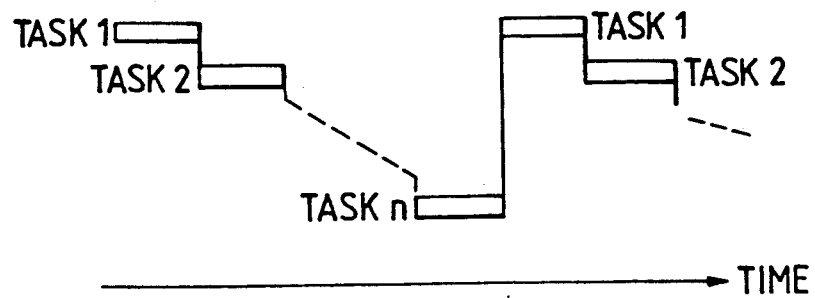
Figure 38:
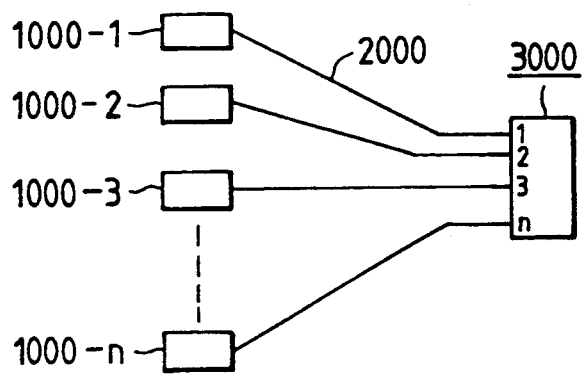
Figure 39A:
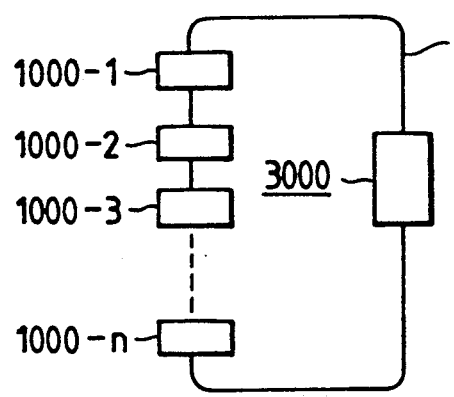
Figure 39B:
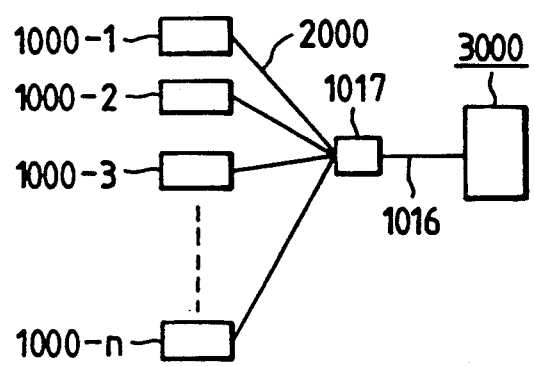
Figure 40A:
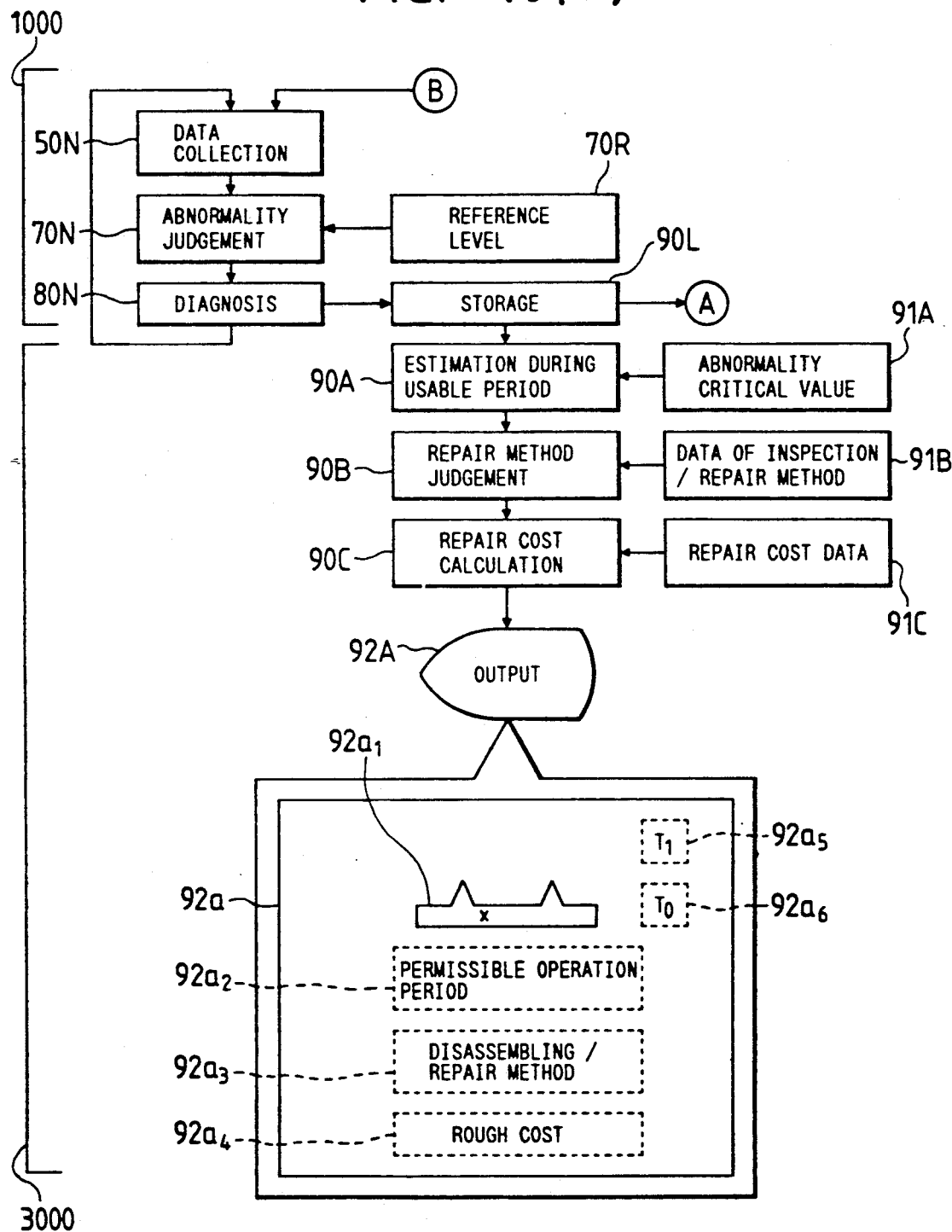
Figure 40B:
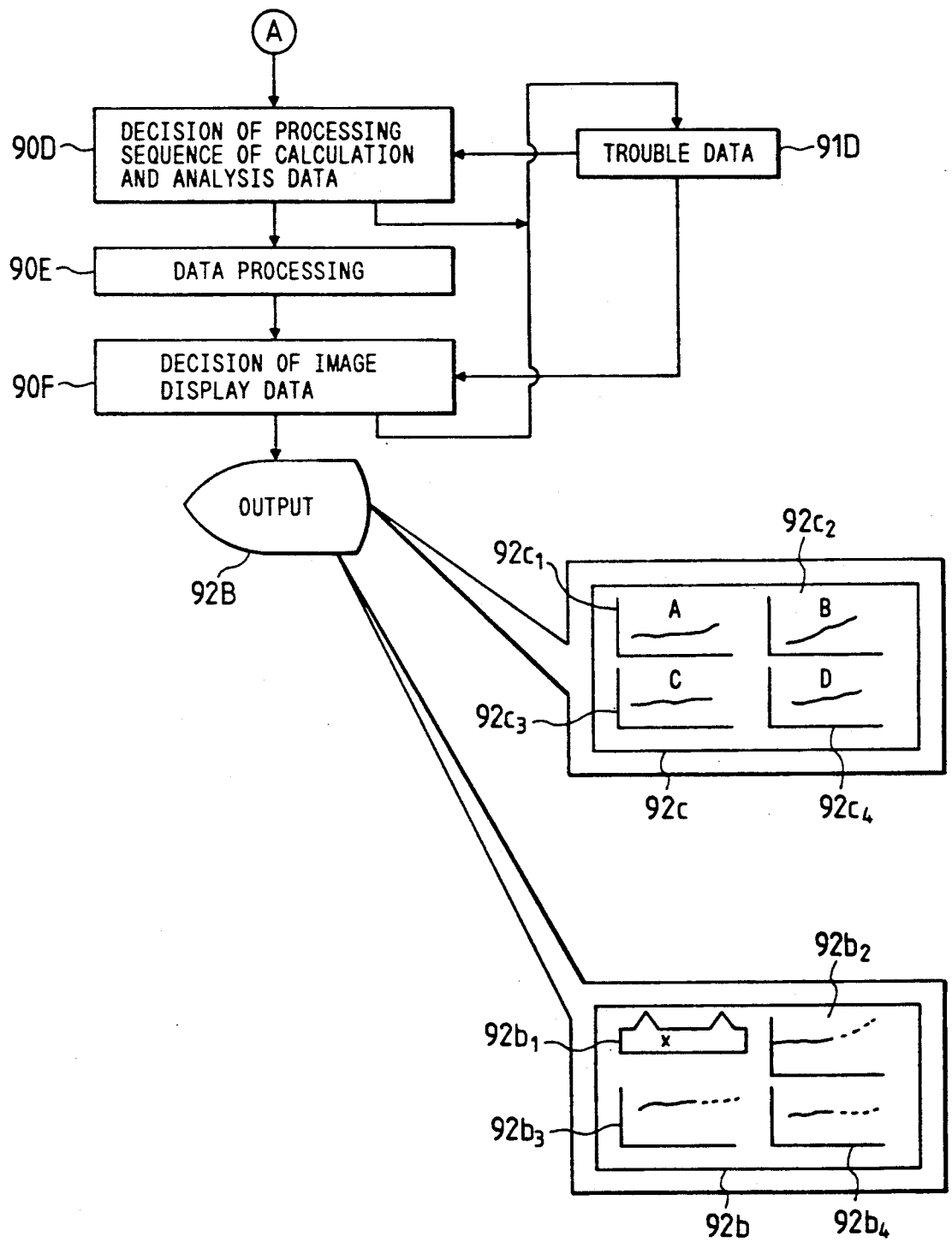
Figure 40C:
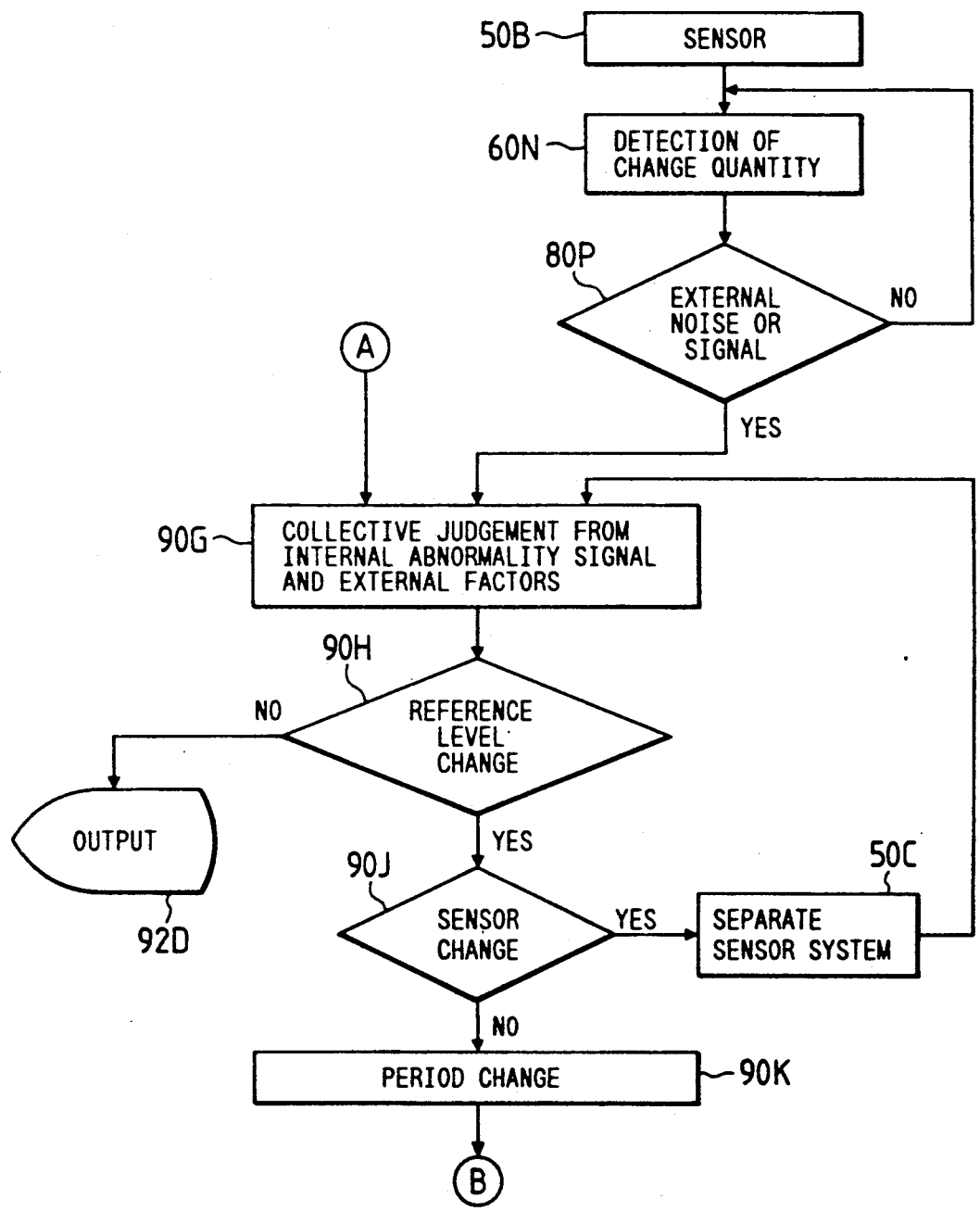
Figure 41:
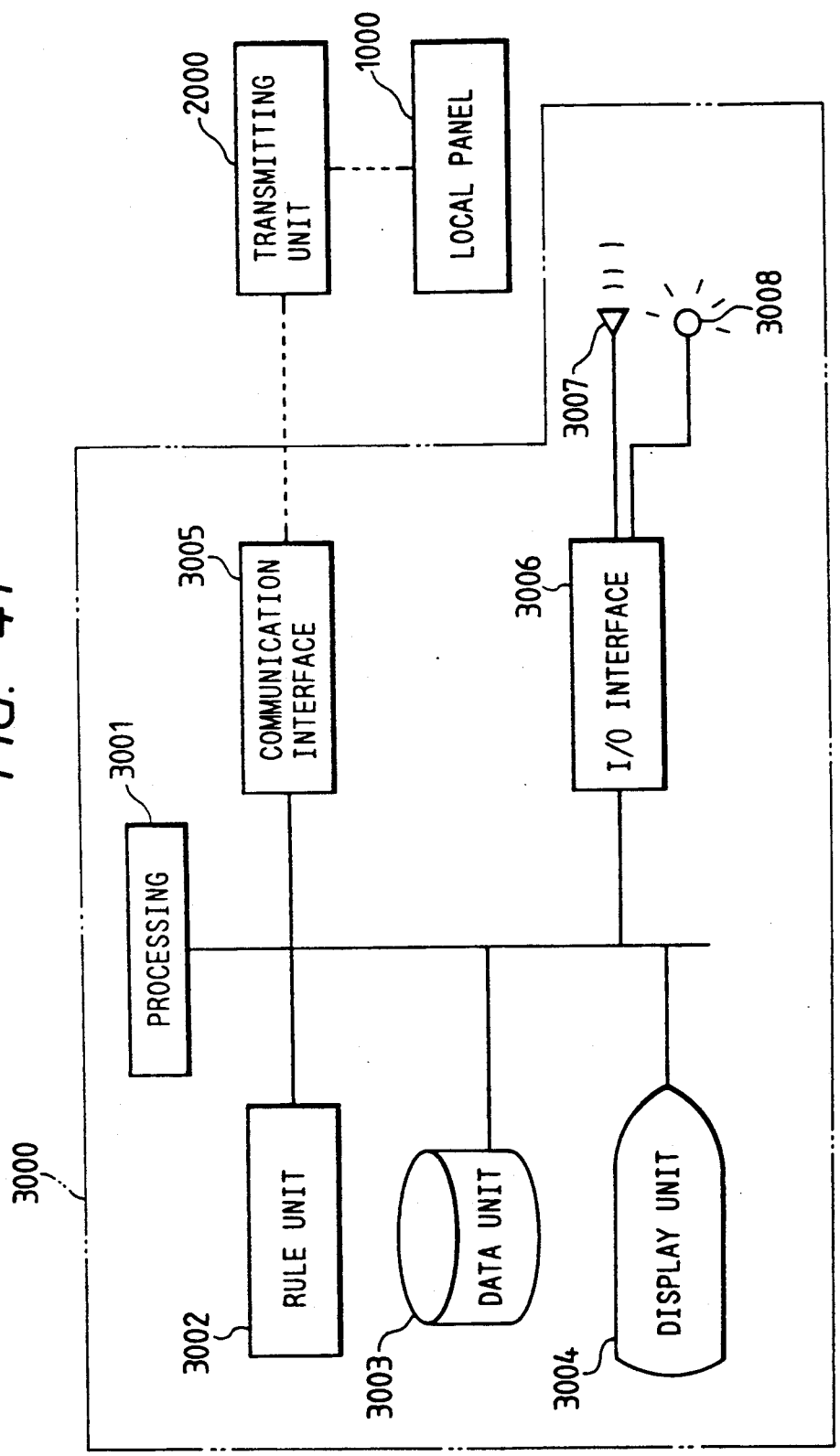
Figure 42:
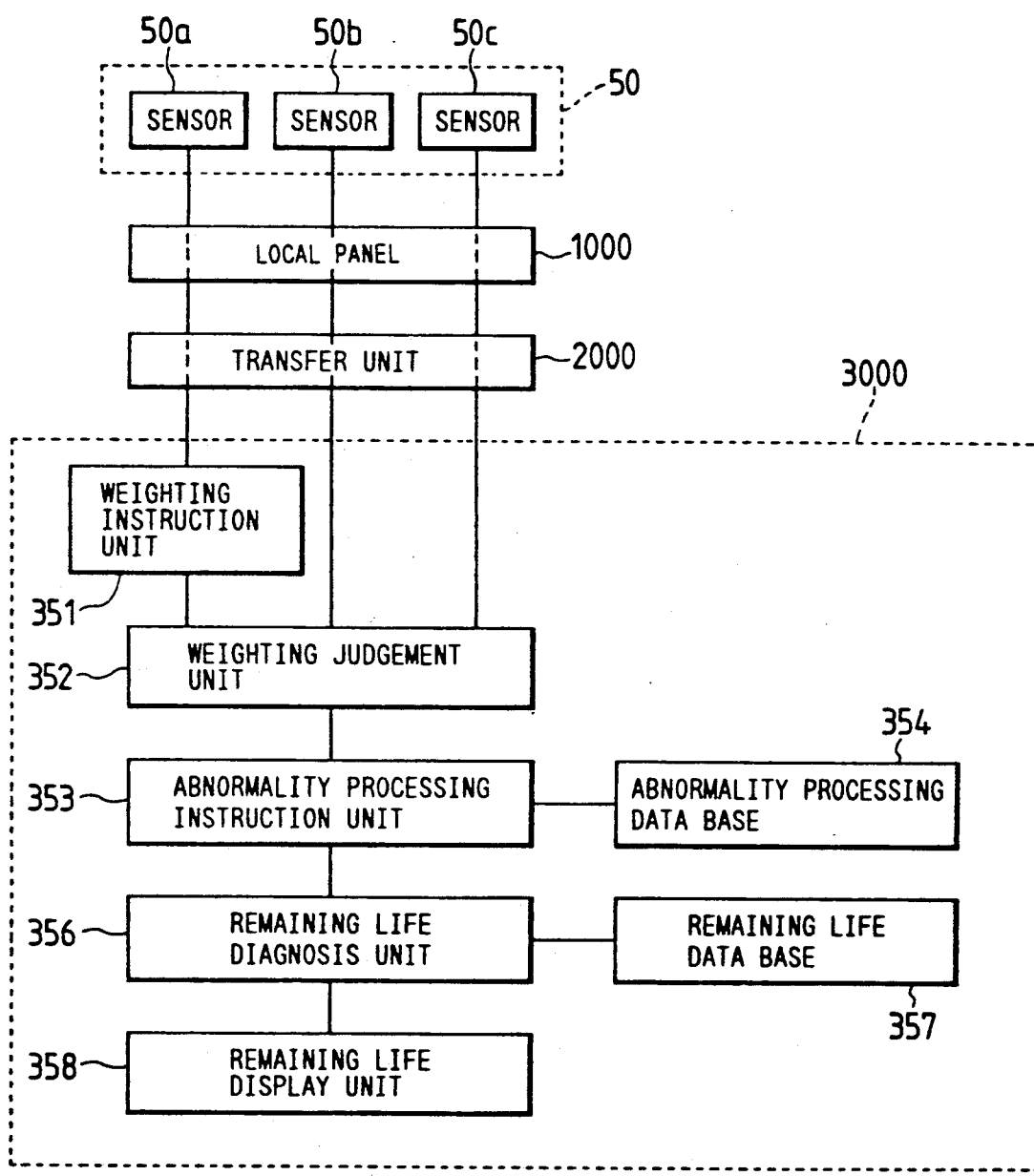
Figure 43:
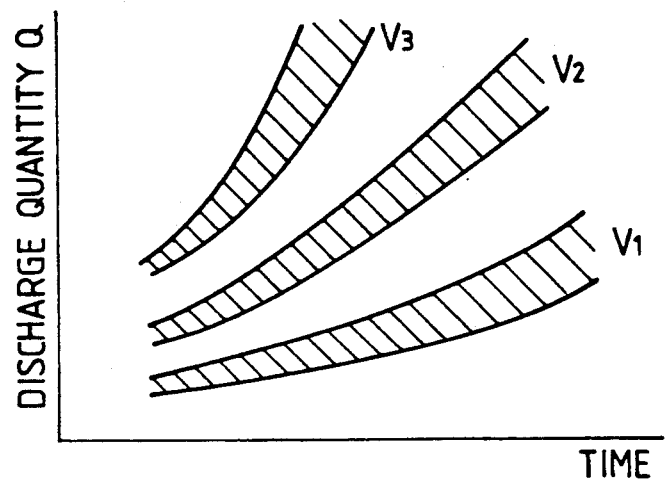
Figure 44:
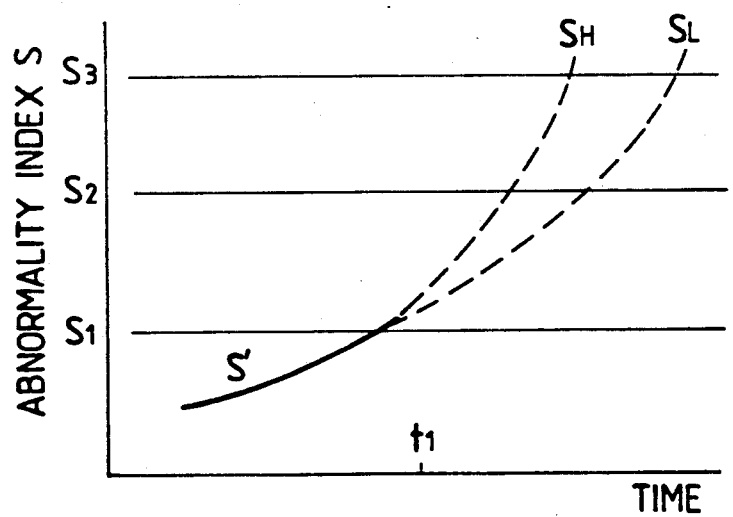
Figure 45:
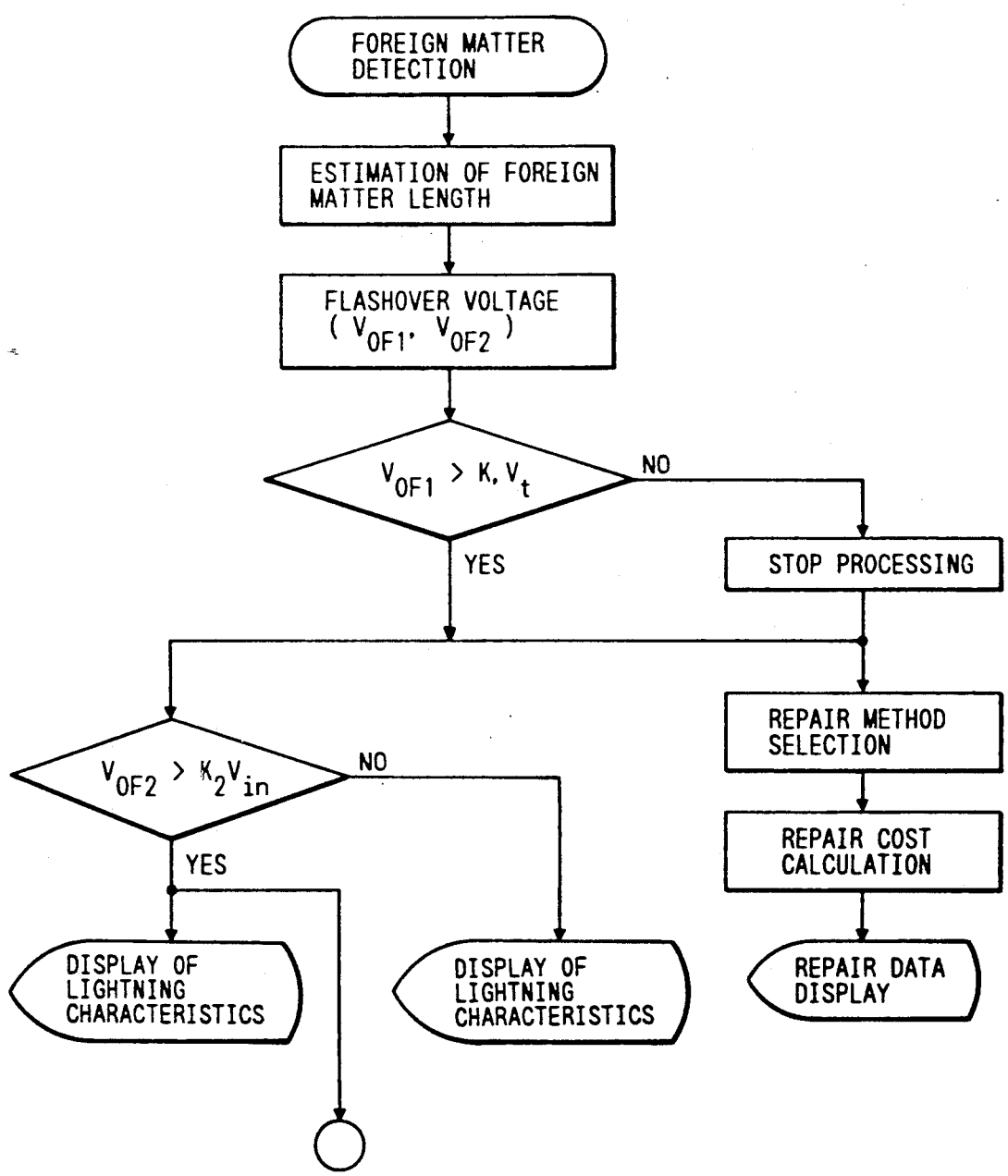
Figure 46:
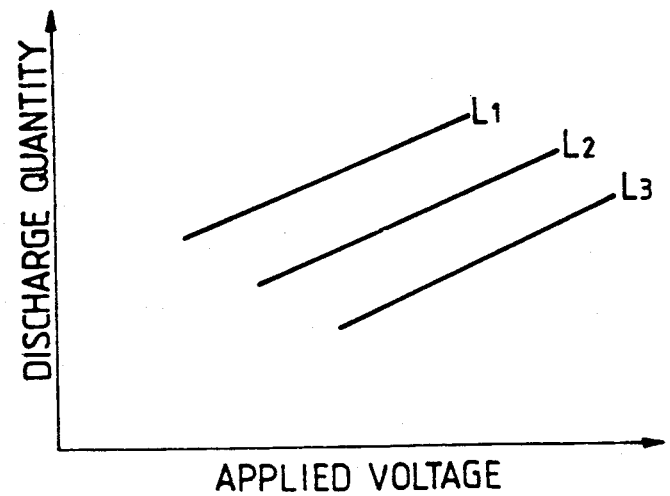
Figure 47:
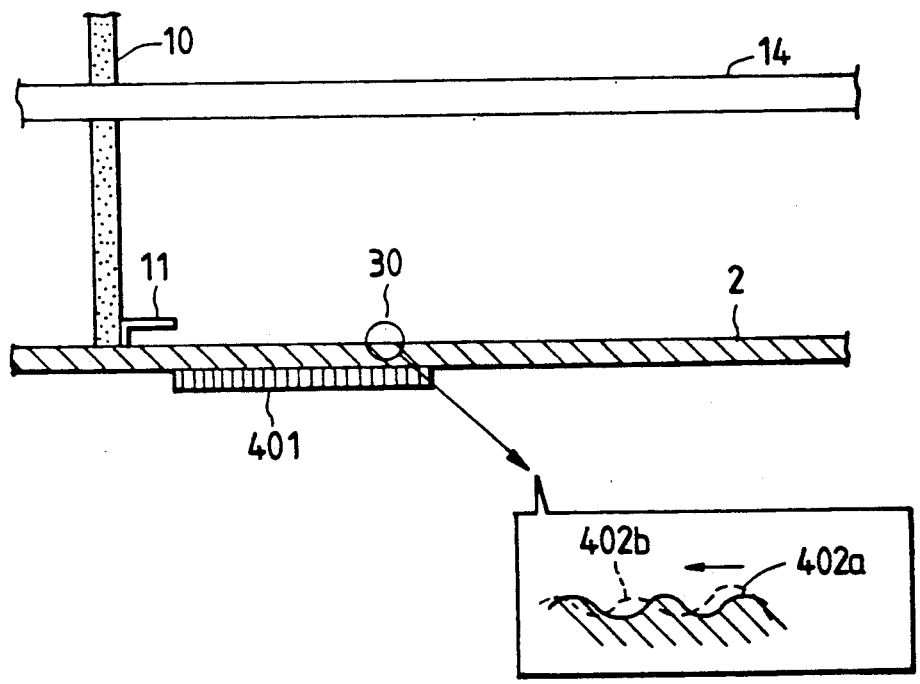
Figure 48:
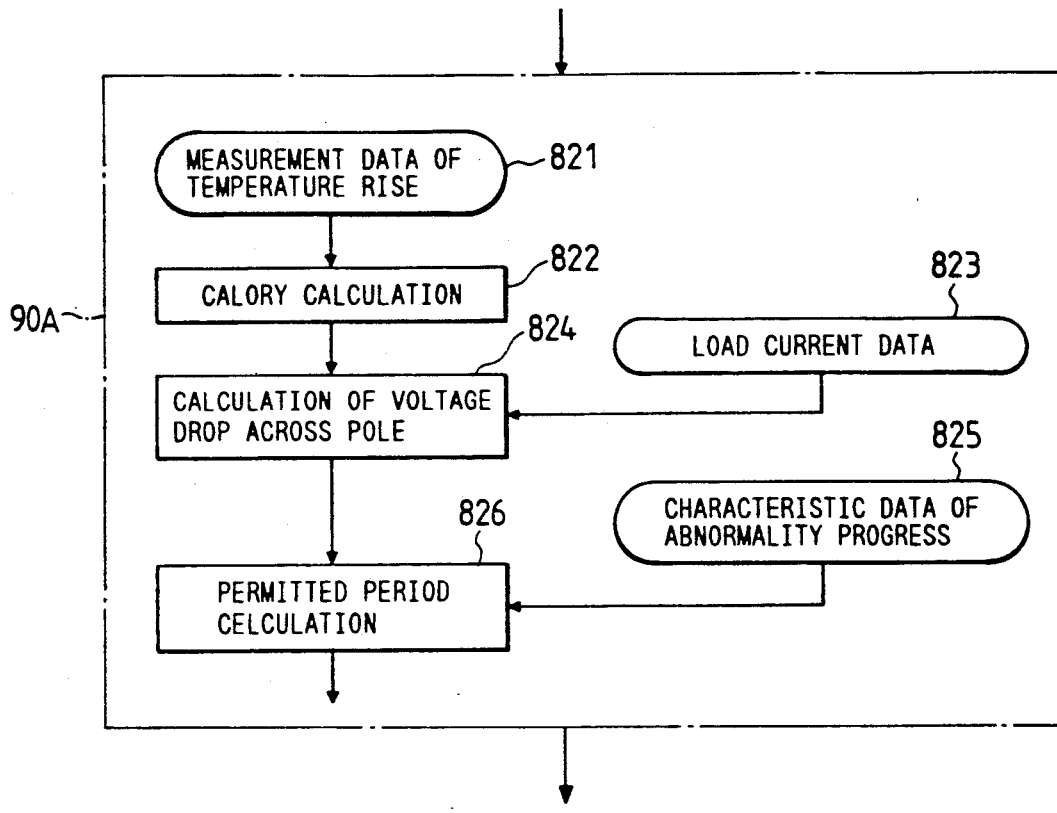
Figure 49:
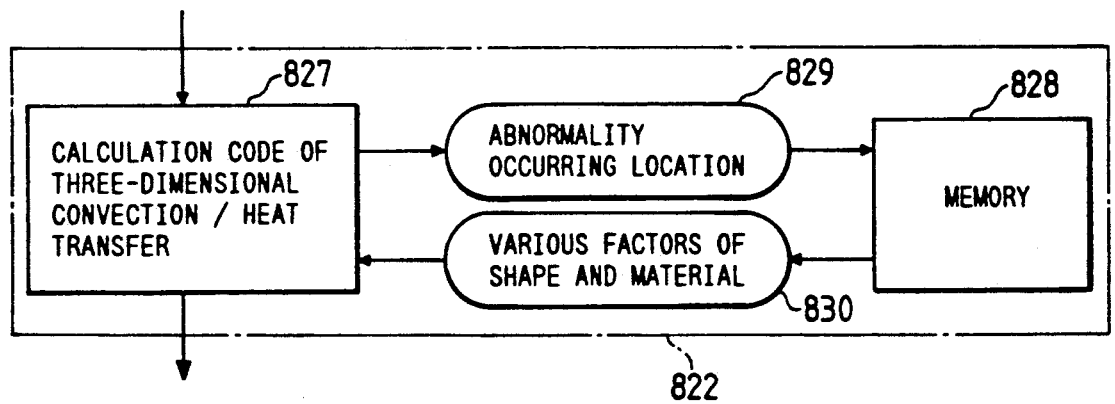
Figure 50:
Figure 51:
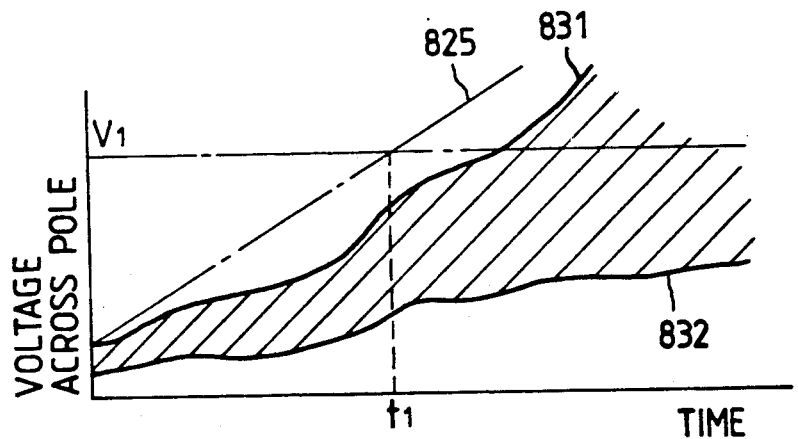
Figure 52:
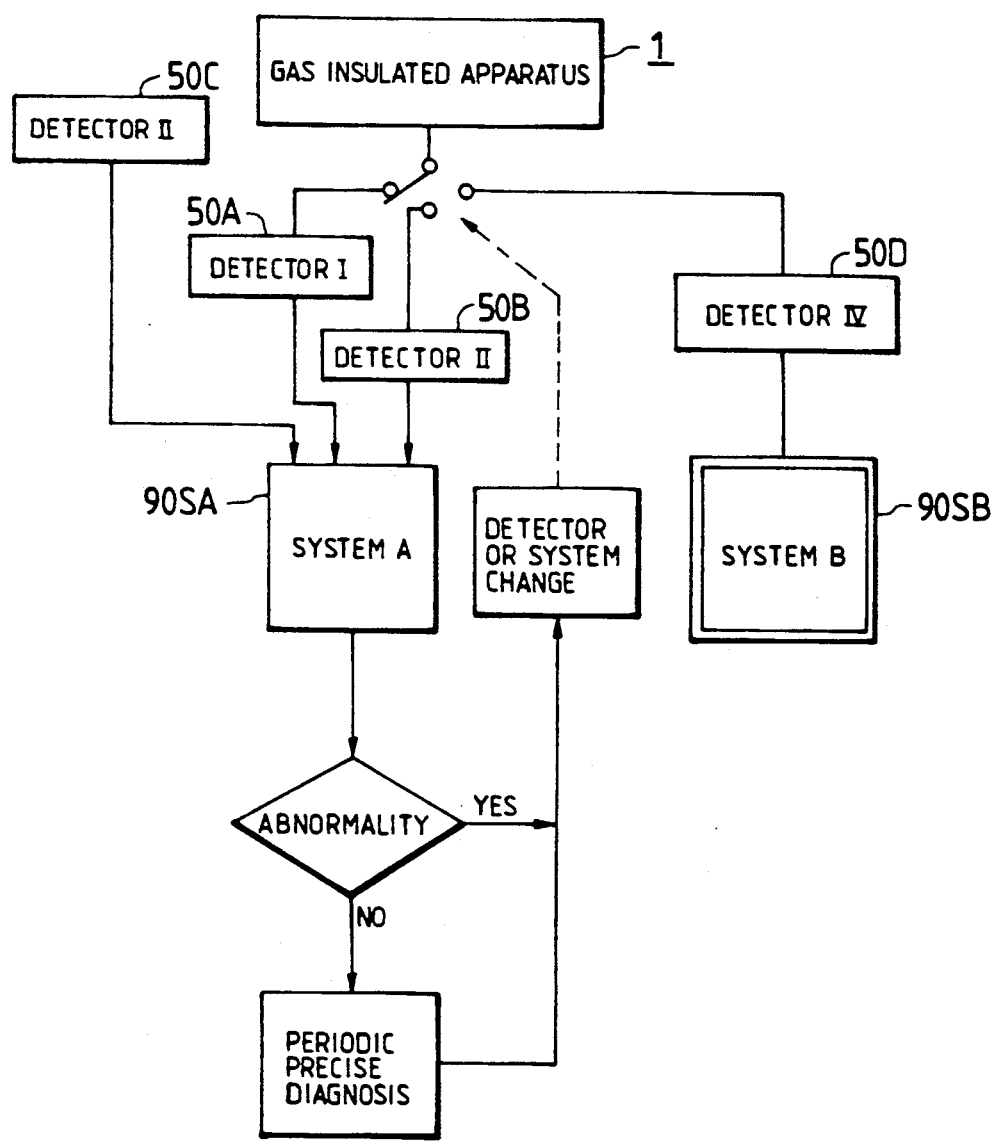
Figure 54:
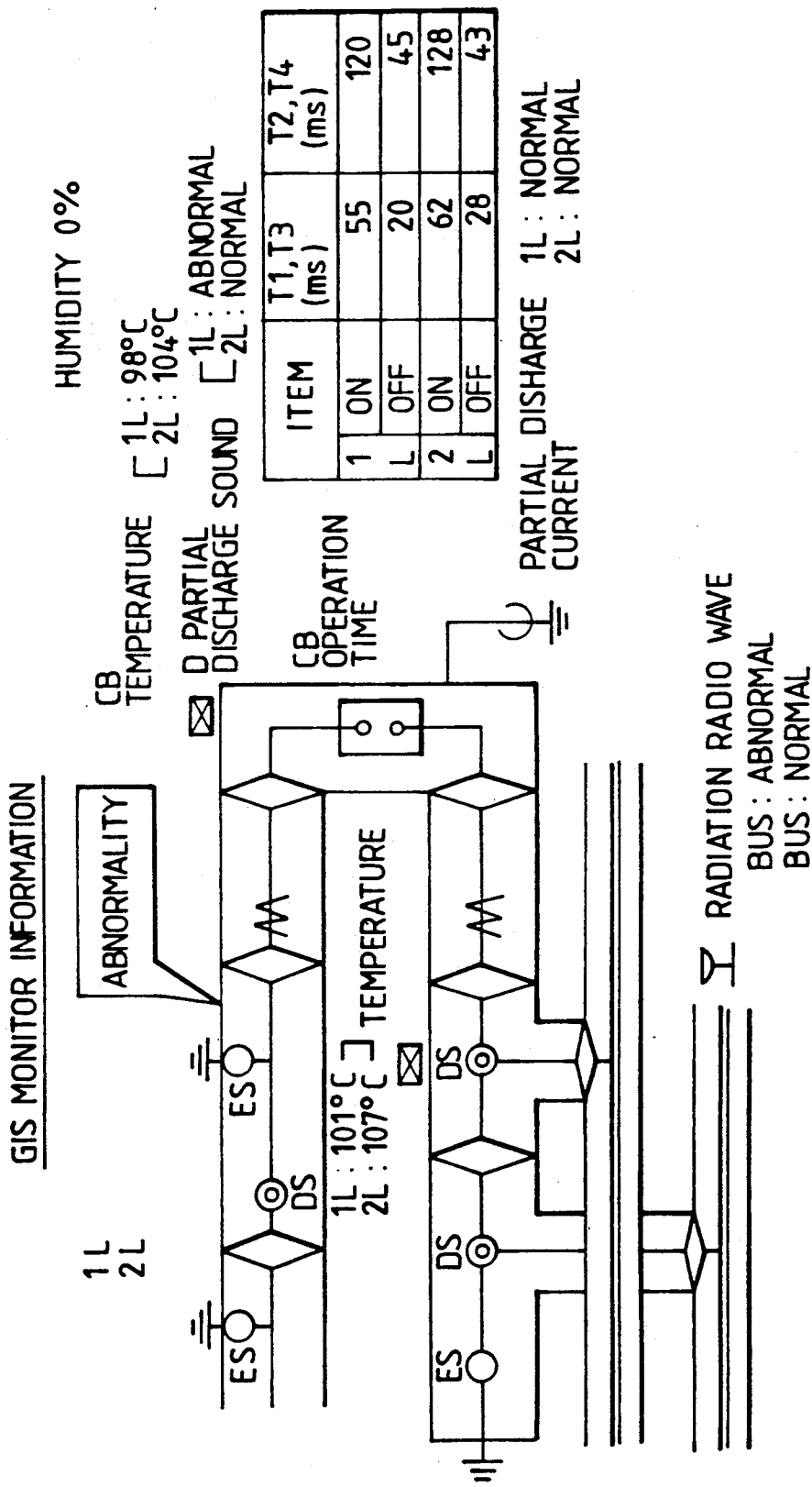
Figure 55:
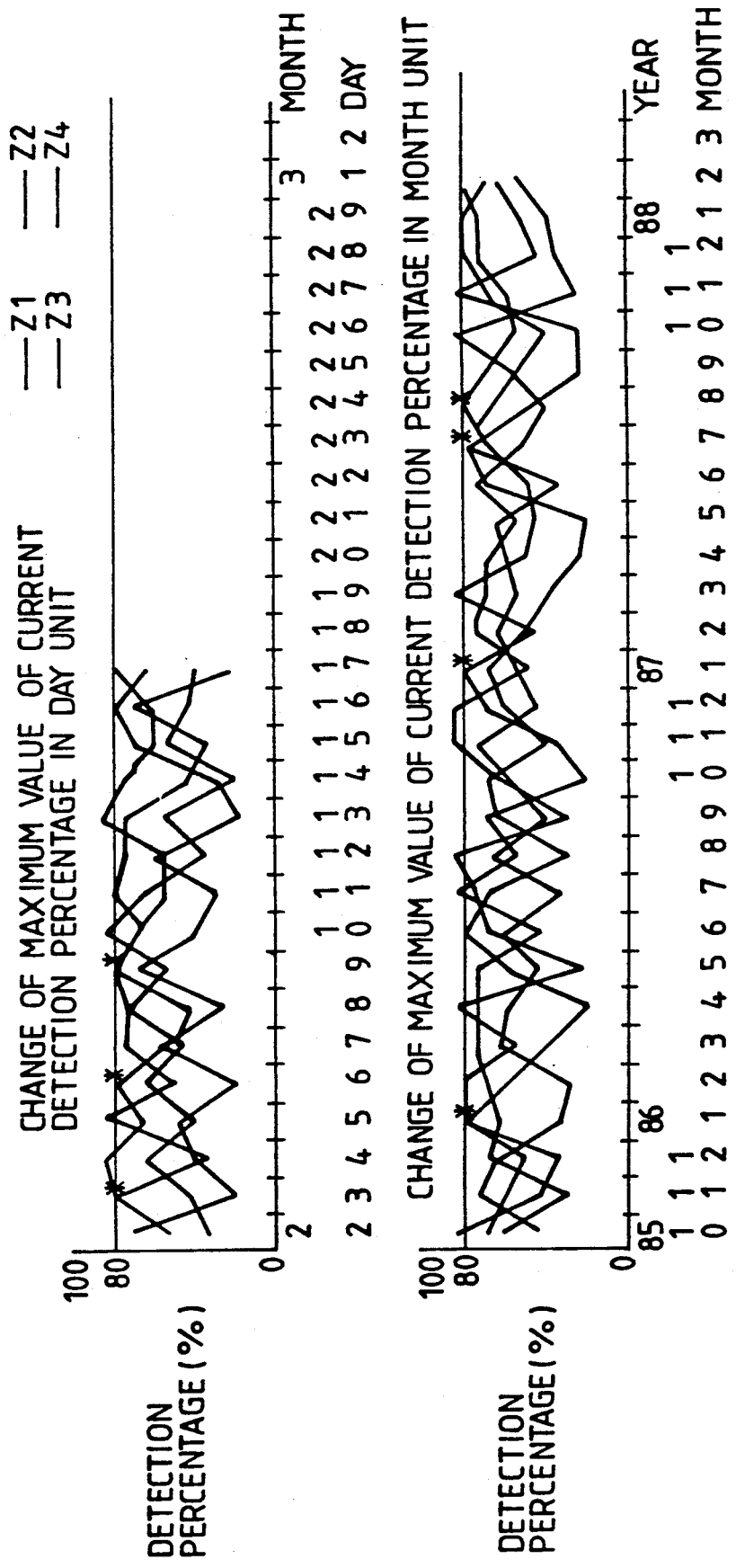

FIG. 36 shows a structural example of a local or field panel;

FIG. 37 shows an example of time division of information;

FIG. 38 shows an example of a signal transfer line;

FIG. 39(a)-39(b) show a real time type signal transfer system;

FIGS. 40(a)-40(c) show a hardware construction of the central monitoring panel;

FIG. 41 shows the processing content of softwares;

FIG. 42 shows an insulation abnormality diagnosis system;

FIG. 43 shows the time characteristics of a discharge quantity;

FIG. 44 shows the time characteristics of an abnormality index;

FIG. 45 is a flow chart of foreign matter detection processing;

FIG. 46 shows the relation between discharge quantity and an impressed or applied voltage;

FIG. 47 shows a foreign matter removal method;

FIG. 48 shows a calculation block for calculating power supply abnormality usable period;

FIG. 49 shows the function of a calorie calculation block and the relation between the tank temperature rise and the exothermic calorie;

FIG. 50 shows the relation between the tank temperature rise and the exothermic calorie;

FIG. 51 shows the time characteristics of an interpolar voltage;

FIG. 52 shows another embodiment of the diagnosis system of the present invention;

FIG. 53 shows the abnormality detection items and the display content for each item;

FIG. 54 shows an example of an insulation monitor display picture surface;

FIG. 55 shows an example of the trend display.

Figure 56:
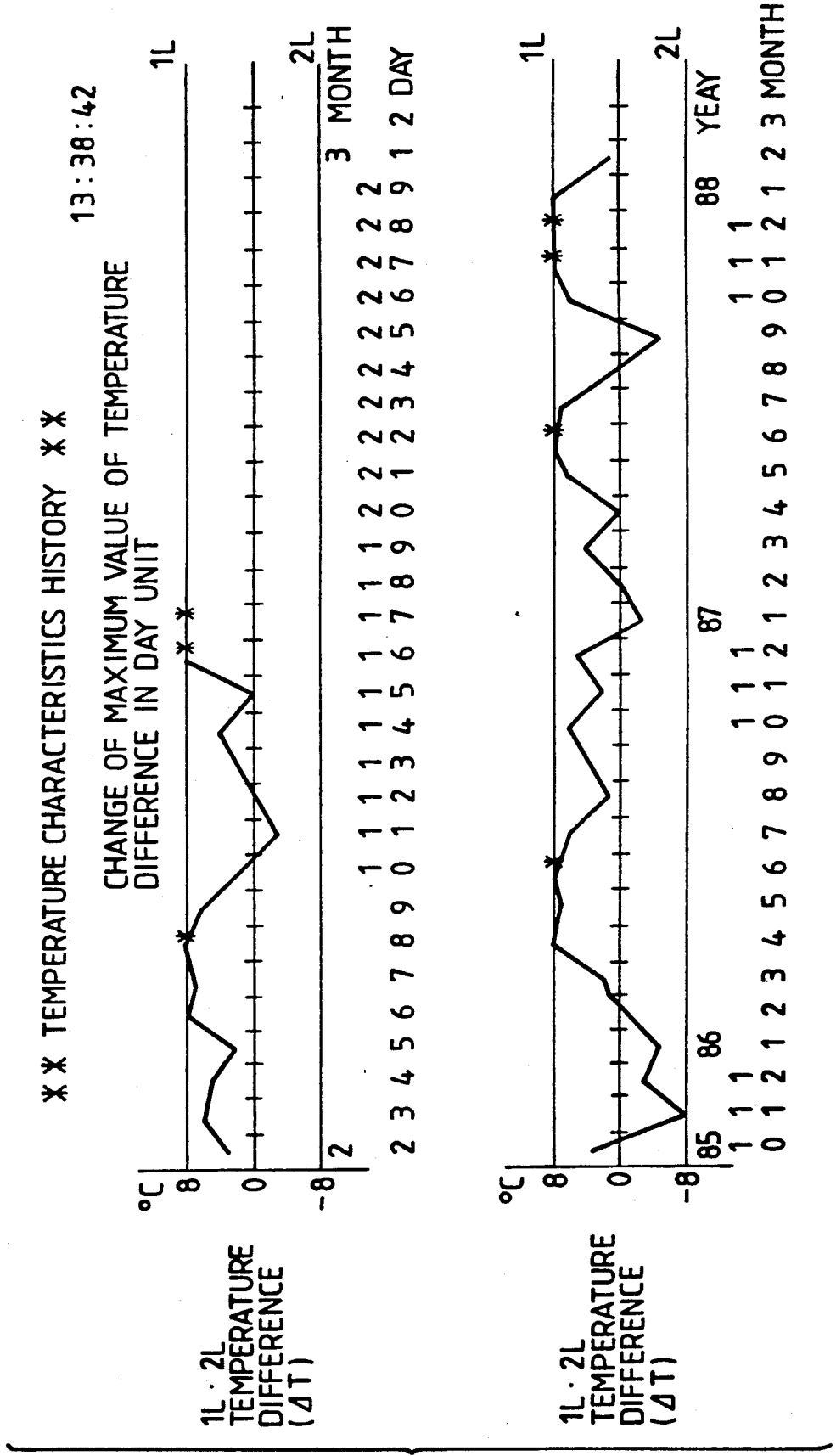

FIG. 56 shows an example of the temperature characteristics trend display picture surface; and FIG. 57 shows an example of a printer output of the stored data.

DETAILED DESCRIPTION OF THE PREFERRED EMBODIMENT

Figure 1:
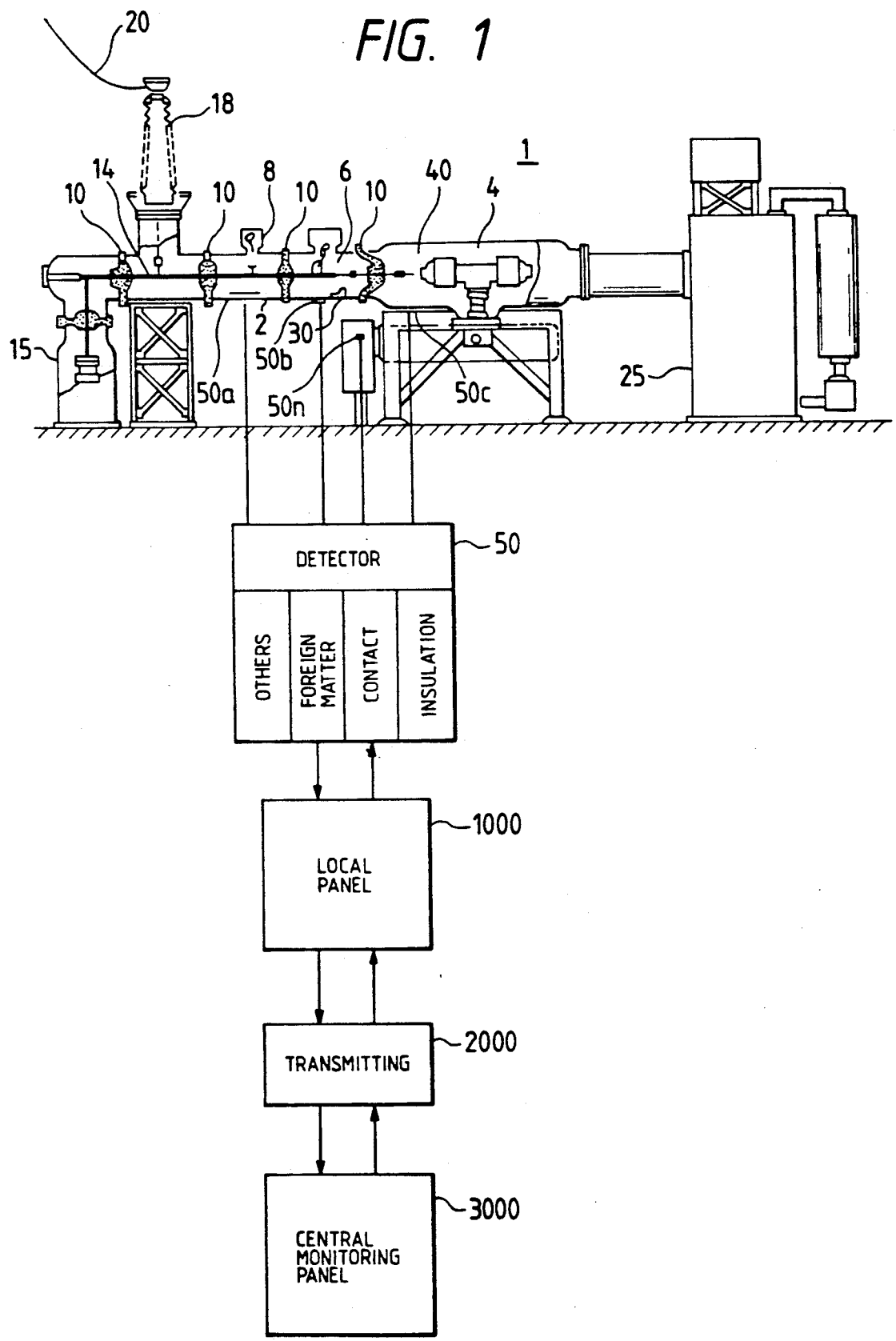
FIG. 1 is an overall structural view of the present invention.

FIG. 1 shows an overall hardware construction of the present invention and a gas insulated apparatus 1 is shown as an example of the high voltage power machinery. The system of the present invention comprises a detector 50 including sensors (50a, 50b, ... 50n) disposed at each part of the machinery to obtain various data, a local or field panel 1000 for processing these detection quantities, judging the abnormality values and diagnosing part of them and transferring the result to a diagnosing apparatus of an upper order, a transmitting unit 2000 for transferring the signals from the local panel to a remote place and a central monitoring panel 3000 for making collective diagnosis by processing the transmitted signals.

The gas insulated apparatus 1 includes various switches such as grounded switches 8 that are stored in a tank 2 at the ground potential as shown in FIG. 1 and an $SF_6$ gas having excellent insulation performance and arc extinction performance is sealed therein. Power is introduced into the apparatus by an aerial cable 20 through a bushing 18 and is sent to a transformer 25 through a bus consisting of a center conductor 14 supported by a spacer 10, a disconnecting switch 6, a breaker 4, and the like. A lightning arrestor 15 is generally disposed near the lead-in of the aerial cable 20 to suppress an overvoltage. The most serious problem with such a gas insulated apparatus 1 is an earth or grounding accident occurring inside the apparatus due to an insulation abnormality and a power supply abnormality, and it is very important to prevent the earth or grounding accident. Since there are factors resulting in such an earth accident, a large number of inspections and tests are conducted from the assembly in a factory till the on-the-site-installation to eliminate such an accident, but it is not possible to completely eliminate it. Accordingly, in order to improve reliability of the apparatus, it is important to monitor factors causing an earth accident even after the apparatus is in the operating state. The present invention provides a highly sensitive and highly accurate abnormality diagnosing system using primarily insulation abnormality detection, power supply abnormality detection, and the detection of fine conductive foreign matter which are most important factors during the operating state.

The insulation abnormality detection mainly provides for subtraction processing of the frequency distribution of electrical signals having a frequency up to some GHz detected by a plurality of sensors, and the diagnosis by the comparison of the distribution with an abnormality pattern and a set level. In addition, the data from acoustic sensors, oscillation sensors and decomposed gas sensors are added so that the factors of abnormality, determination of position and life anticipation can be made by the final diagnosis.

The power supply abnormality detection provides for the detection of tank oscillation of from 200 to 5,000 Hz by an oscillation sensor, and diagnosis of the power supply abnormality of a contact portion 40 such as the disconnecting switch 6, the breaker 4, etc., by the comparison of the signals which are some multiples of the commercial frequency with the patterns and the set level. The temperature distribution is detected by temperature sensors and infrared cameras and the internal status is detected by X-ray diagnosing apparatus. Furthermore, the condition of the insulation abnormality detection described above is taken into consideration so that the factors of the power supply abnormality, the position determination and the life anticipation can be made in the final diagnosis.

The fine conductive foreign matter detection provides for mainly division processing of tank oscillation signals of up to several MHz detected by a plurality of acoustic sensors and oscillation sensors and the identification of mixed foreign matter 30 inside the apparatus through comparison of the ratio of division processing with the set levels. The position determination and the life anticipation can be made finally by collective diagnosis with the insulation abnormality detection described above, and the like.

The signals from the detectors 50 are gathered to the local panels 1000 disposed near the gas insulated apparatus 1. The number of installation of the local panels 1000 is determined in accordance with the scale of the substation and the number of the sensors.

Each local panel 1000 operates in the following manner:

(1) It amplifies a fine sensor signal and makes it possible to make long distance transmission.

(2) It converts analog signals from the sensor to digital signals.

(3) It automatically diagnosis the soundness of the sensor in order to improve reliability of diagnosis.

(4) It insulates the noise, surge, etc., entering from the sensor from the central monitoring panel.

(5) It makes primary diagnosis of the existence of any abnormality of the apparatus in accordance with a predetermined algorithm.

(6) It stores and displays part of the measurement data.

The data thus processed by each local panel 1000 is transferred to the central monitoring panel 3000 which effects the collective diagnosis through the transmitting unit 2000.

An optical fiber system which is ordinarily not effected by electrical noise is used for the transmitting unit 2000. Utilization of electromagnetic waves is also possible at times.

The central monitoring panel 3000 is equipped with a portion for making the collective diagnosis on the basis of the abnormality judgement signals from the local panels 1000 and with a man-machine interface for displaying the result of diagnosis and the processing method. To make diagnosis with high reliability, it also includes a memory unit or the like for storing trend data of the detected values. It further includes a knowledge data base on the basis of the past accident cases and the application of an expert system is possible.

Figure 2:
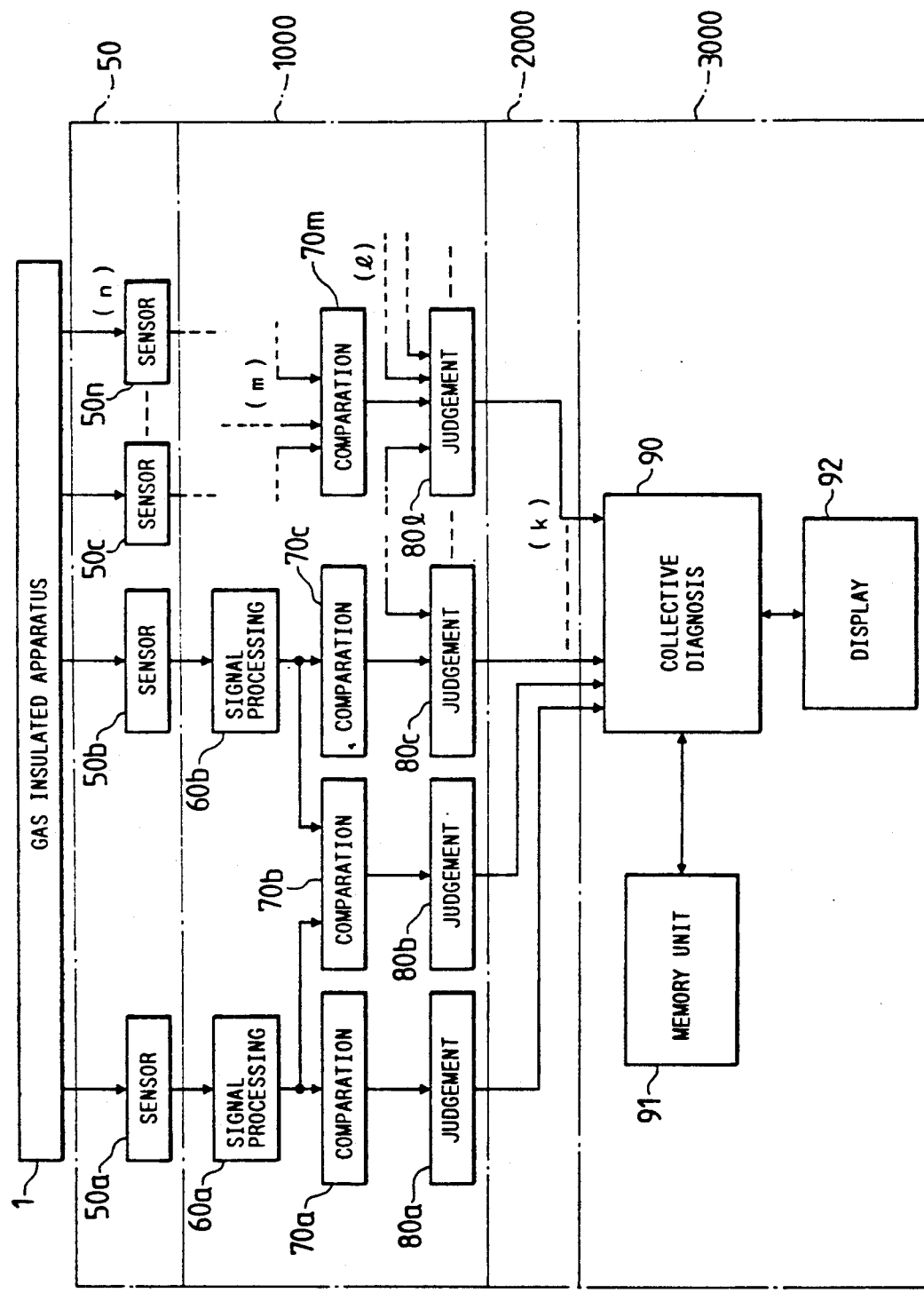
FIG. 2 is a functional structural view of an abnormality diagnosis system of the present invention.

FIG. 2 shows the overall construction of the abnormality diagnosing system in its functional aspect. Suitable signal processing units 60a, 60b, 60c, . . . in the various sensors 50a, 50b, 50c . . . 50n fitted to the gas insulated apparatus 1 so as to effect signal amplification, noise elimination and calculation. The result of the signal processing is described in the following two cases. In the first case, the signal is compared as a single signal with a set level by the judgement unit 70a, 70c, etc. disposed for each signal processing unit and is judged as the abnormality signal while in the second case, the existence of abnormality is judged on the basis of at least two signals as represented by the judgement unit 70b, 70m. Next, there is disposed a diagnosing unit 80 for determining the degree of abnormality and the position of occurrence of abnormality on the basis of the judgement result. In this case, too, there are the two cases, i.e., the case where the diagnosis is made by the signal data (80a, 80b) and the case where the diagnosis is made on the basis of at least two judgement results (80c, 80l), in the same way as in the judgement unit. The diagnosis judgments are sent into a collective diagnosing unit 90 and detailed abnormality diagnosis is made based upon a knowledge data base and past diagnosis results stored in the memory unit 91. Its result and processing method are displayed by the display unit 92. Incidentally, an expert system, for example, is introduced for the diagnosis at each diagnosing unit 80, 90.

In such an abnormality diagnosing system, in addition to the main detectors disposed so as to detect the original abnormalities such as the sensors relating to the insulation diagnosis, the sensors relating to the power supply abnormality diagnosis and the sensors relating to the foreign matter detection such as the sensors 50 shown in FIG. 1, auxiliary detectors are added at times in order to assist the abnormality diagnosis such detection of various signals for operation of the system, an abnormal voltage, atmospheric conditions, an unusual change of weather, etc. When the values detected by such auxiliary detectors exceed set levels, collective judgement based upon these signals is conducted and the judgement reference value of the main detector is changed. Alternatively, the detection interval is made shorter than the usual interval to improve detection accuracy. When, for example, the occurrence of an abnormal voltage by thunder or lightning is detected by the auxiliary detector, there is the high possibility that the insulation abnormality detector as the main detector outputs such occurrence, and processing is carried out with higher emphasis on the insulation abnormality diagnosis than the other abnormality factors.

Incidentally, if even a single abnormality judgement is found from the detection results of the detector 50, the detection interval is made shorter to improve diagnostic accuracy, but in this case, higher sensitivity can be obtained by changing the kind of detectors and not only by merely changing the detection interval or by introducing an abnormality diagnosing system of a higher order.

Hereinafter, the detection elements used for each abnormality diagnosis and the detail of the processing will be described.

I. Insulation Detection

Figure 3:
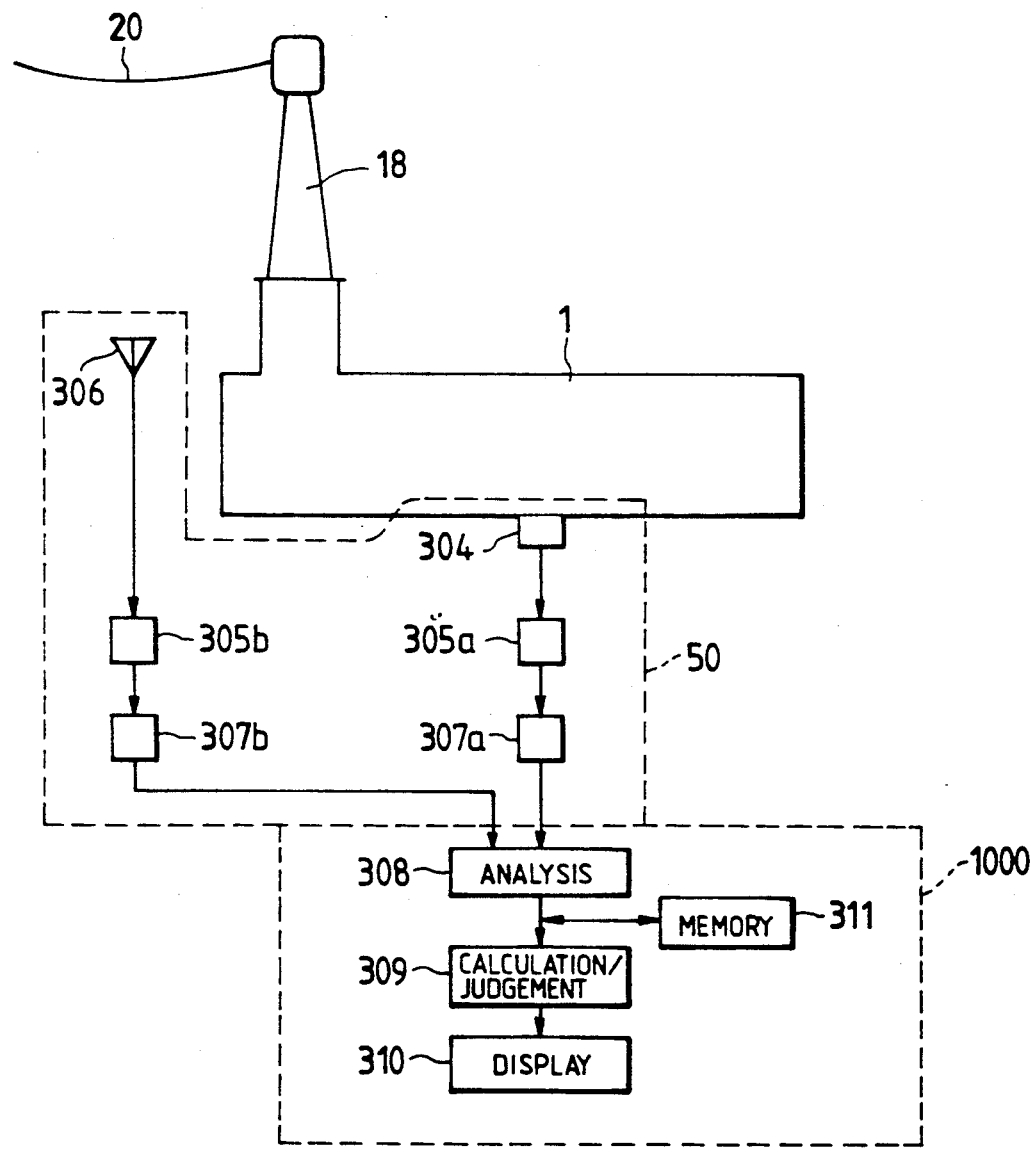
FIG. 3 is an overall schematic structural view of the insulation abnormality diagnosis system of the present invention.

In FIG. 3. reference numeral 1 represents the gas insulated apparatus which stores therein the high voltage unit and which is encompassed by a metal whose outside is grounded. The bushing 18 of this gas insulated apparatus 1 is connected to the aerial cable 20. When a partial discharge develops inside the gas insulated apparatus 1, electrical pulses occur in the gas insulated apparatus. This electrical pulse is detected by a partial discharge detector 304 mounted to the outer wall of the gas insulated apparatus 1 and is inputted to an amplifier 307a through a matching impedance 305a for impedance matching with a next stage circuit (amplifier 307a or connection cable to the amplifier 307a) of the partial discharge detector in order to transfer the detected pulse with fidelity. On the other hand, an antenna 306 is disposed adjacent to the gas insulated apparatus 1 in order to detect a partial discharge in air occurring in the aerial cable 20 and the bushing 18 and broadcasting-/communication electromagnetic waves propagating through the air and the detected signal is inputted to the amplifier 307b through the matching impedance 305b. The amplifier 307 (a and b) has a bandwidth of at least up to 1. GHz and amplifies the incoming signal with fidelity. The partial discharge detector 304, the matching impedance 305(a and b), the antenna 306, and the amplifier 307(a and b) correspond to the detector 50 shown in FIG. 1. The amplifier 307 amplifies the detection signal from the partial discharge detector 304 and the detection signal from the antenna 306, respectively, and a spectrum analyzer 308 alternately analyzes the frequency spectra of the detection signals described above. The result of analysis is stored temporarily in a memory 311 and at the same time, is inputted to a calculation comparison or judgement unit 309 of the next stage, where the partial discharge occurring inside the gas insulated apparatus 1 is distinguished from noise occurring in or propagating from outside the apparatus, the magnitude of the partial discharge occurring inside the gas insulated apparatus 1 and the degree of its harmfulness are judged and the result of judgement is displayed by a display unit 310. The spectrum analyzer 308, the calculation judgement unit 309, the display unit 310 and the memory 311 correspond to the local or field panel 1000 shown in FIG. 1.

Figure 4:
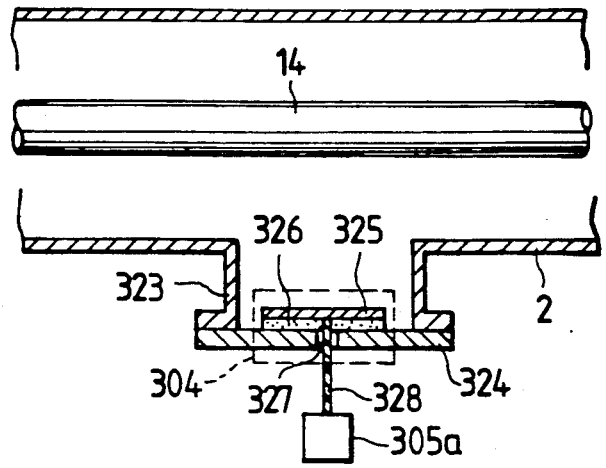
FIGS. 4 to 6 are views showing the schematic structure of a partial discharge detector of the present invention and its fitting structure.

The partial discharge detector 304 is constituted as shown in FIG. 4. A tank 2 made of a metal and grounded encompasses a high voltage center conductor 14. The tank 2 is equipped with a hand hole 323 for internal inspection and maintenance or for fitting an adsorbent for adsorbing any moisture and decomposed gases. An electrode 325 is fitted to the flange 324 of this hand hole 323 through an insulator 326, is insulated from the flange 324 by an insulation piece 327 and is connected to an external matching impedance 305a by a lead wire 328. The electrode 325 is disposed in such a manner as not to project towards the center conductor side of the high voltage beyond the inner peripheral surface of the tank 2, and electrostatic capacity voltage is divided by the electrostatic capacitance between the high voltage center conductor 14 and the electrode 325 and by the electrostatic capacitance between the electrode 325 and the flange 324 so as to detect the electrical pulse resulting from the partial discharge.

Figure 5:
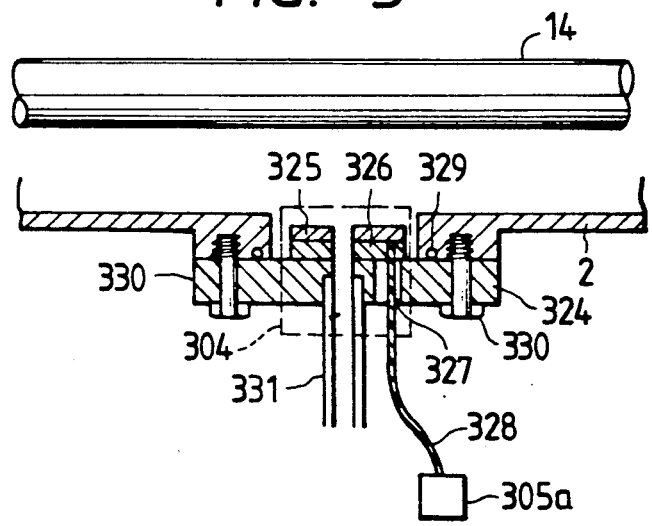

FIG. 5 shows the state where the partial discharge detector 304 is mounted to a gas charging port 330. A gas piping arrangement 331 is welded to the flange 324 for filling the gas. A through-hole is bored at the position of each of the electrode 325 and the insulator 326 corresponding to the outlet of the gas piping arrangement 331 so as not to prevent gas filling.

Figure 6:
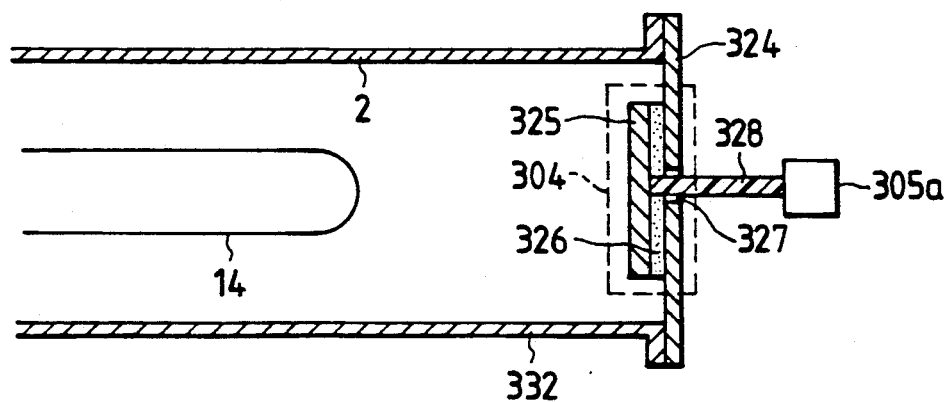

FIG. 6 shows the case where the partial discharge detector 304 is fitted to the terminal portion of the tank 2. In this case the electrode 325 is disposed in such a manner as to face the terminal end of the high voltage center conductor 14.

Figure 7:
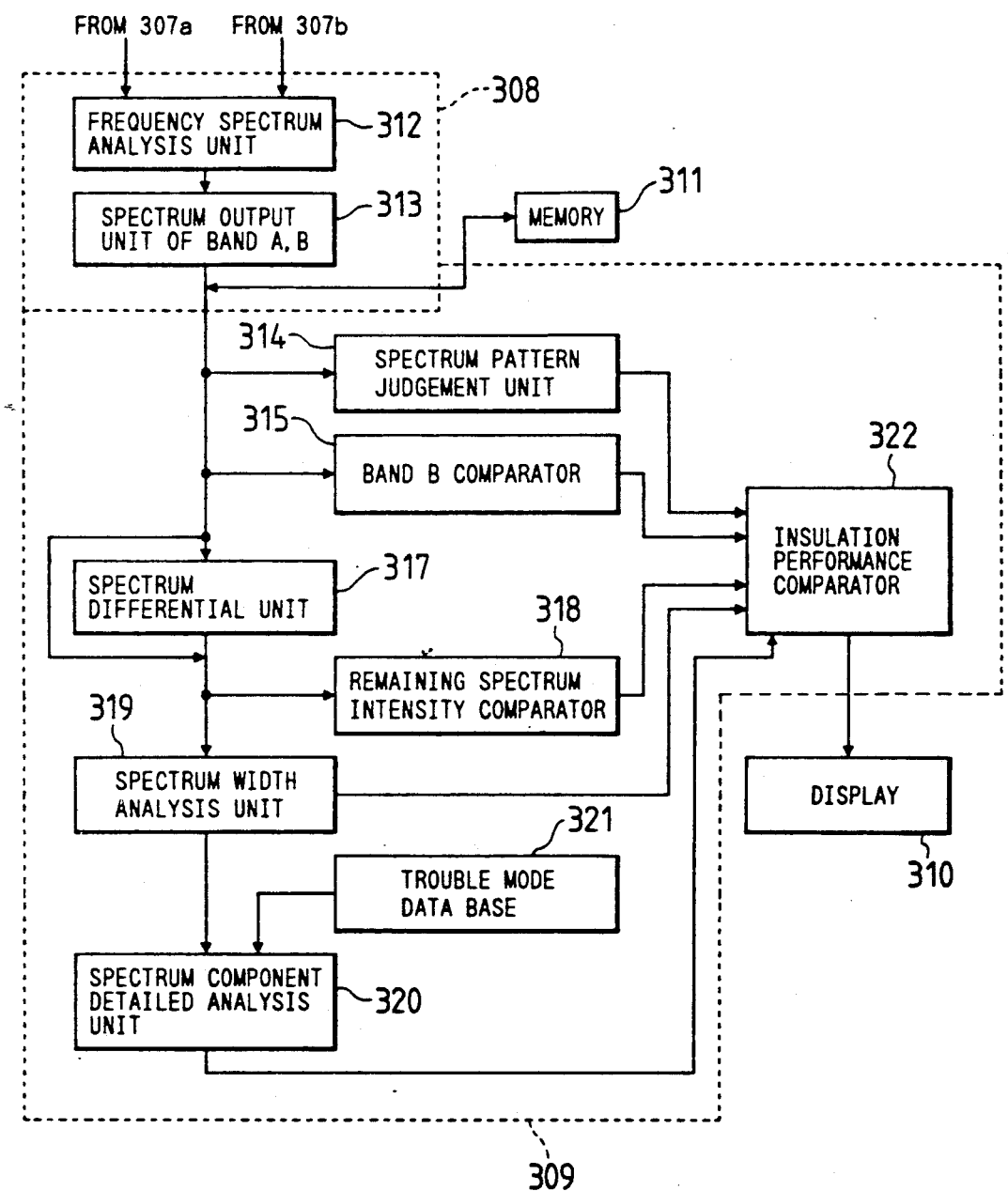
FIG. 7 is a schematic view showing the functions of a spectrum analyzer and a calculation judgement unit in an embodiment of the present invention.

FIG. 7 shows in further detail the local or field panel 1000 shown in FIG. 3. In the drawing, the electrical pulses and noises detected by the partial discharge detector 304 and the antenna 306 are decomposed to the spectra ranging from some dozens of KHz to 1.5 GHz by a frequency analyzing unit 312 in the spectrum analyzer 308, the spectral distributions of the later-appearing frequency bands A and B and their intensity are extracted by a spectrum extraction unit 313 and its result is stored in the memory 311. Incidentally, spectrum analysis is made alternately for the signal from the partial discharge detector 304 and for the signal from the antenna 306.

The electrical pulses detected by the partial discharge detector 304 contains noise due to the partial discharge that occurs in the gas insulated apparatus 1, and the partial discharge in the air generated by the aerial cable 20 and the bushing 18 by themselves and the noise of the broadcasting/ communication waves (generically referred to as the "external discharge") picked up by the aerial cable itself functioning as the antenna. Based upon experience, however, the external discharge results mainly from the partial discharge in the air, but when the charge quantity of discharge is below some hundreds of pC (pu Coulomb), it consists of frequency components of below 400 MHz as shown in FIG. 8(a). When the charge quantity of discharge exceeds 1,000 PC, a frequency spectrum appears at 500 to 1,500 MHz besides in addition to the frequency component of below 400 MHz as shown in FIG. 8(b). On the other hand, the partial discharge in the SF6 gas occurring inside the gas insulated apparatus consists of frequency components of 500 to 1,500 MHz (FIG. 8(c)). It can be specified from this that the frequency band A described above is a specific band belonging to 400 MHz or below and the band B is a specific band contained in 500 to 1,500 MHz.

The calculation judgement unit 309 is the section which distinguishes the partial discharge occurring inside the gas insulation apparatus 1 (referred to as the "internal discharge") from the external discharge, determines the magnitude of the internal discharge and judges the position of occurrence of the internal discharge by use of the result of analysis of the spectrum analyzer 308. FIG. 7 shows a flow chart for judgement. A spectrum pattern judgement unit 314 makes the next pattern recognition and discriminates the internal discharge from the external noise.

The output of the spectrum analyzer 308 is classified into five patterns (a) to (e) shown in FIG. 9. Among them, (a) to (c) are the same as (a) to (c) of FIG. 8 and when both of the internal discharge and the external discharge do not exist, the output becomes only white noise generated by the spectrum analyzer 308 and the amplifier 307 by themselves and the pattern becomes as illustrated in FIG. 9(a) without any spectrum. When the partial discharge occurs only in the air and moreover when the charge quantity of discharge is below some hundreds of pC, components below 400 MHz appear as shown in (b). When only the internal discharge occurs, the spectrum occurs in the band of 500 to 1,500 MHz as shown in (c). In contrast, FIG. 9(d) shows the case where a small external discharge and a great internal discharge coexist and the intensity $H_1$ of the spectrum below 400 MHz is smaller than the spectral intensity $H_2$ of 500 to 1,500 MHz. FIG. 9(e) shows the case where an external discharge above 1,000 PC and an internal discharge of a low level coexist and $H_1 > H_2$ in this case.

Therefore, the spectral pattern judgement unit 314 judges that the spectral pattern belongs to any of (a) to (e) of FIG. 9 and can judge the internal and external occurrence positions of the partial discharges in accordance with Table 1. In other words, in the cases of the types a and b, no abnormality exists, in the cases of the types c and d, an abnormality exists inside the gas insulated apparatus and in the case of the type e, it is not definite if any abnormality exists or not. Incidentally, the types a to e of Table 1 correspond to (a) to (e) of FIG. 9.

TABLE 1

| feature of frequency spectrum | judgement | | |
|---|---|---|---|
| | internal discharge | external discharge | abnormality of gas insulated apparatus |
| type a | nil | nil | nil |
| type b | nil | yes | |
| type c | yes | nil | yes |
| type d | yes | yes | |
| type e | yes | yes | not definite |

Particularly, in the case of the pattern of the type e, whether or not the spectral intensity $H_2$ exceeds the predetermined harmful level for the apparatus is compared by the band B comparison judgement unit 315 shown in FIG. 7 and if it does, judgement is made to the effect that there is the possibility of abnormality and if not, judgement is made that no abnormality exists. If the possibility of abnormality is judged, the flow proceeds to the next spectrum subtraction unit 317.

The spectrum subtraction unit 317 subjects the signal from the antenna 306 to the frequency spectrum analysis and subtracts it from the result of spectrum analysis result of the signal from the partial discharge detector 304 by use of the data that is stored in the memory 311. Since the antenna 306 detects the external discharge with high sensitivity, the spectrum of the external discharge can be removed by subtracting its spectrum.

FIG. 10 explains its principle. FIG. 10(a) shows the spectral distribution of the signals detected by the partial discharge detector 304 when the internal discharge and the external discharge occur simultaneously. It includes the components below 400 MHz and the components between 500 and 1,500 MHz and corresponds exactly to FIG. 9(d). In addition to the frequency component of below 400 MHz, the spectrum of the signals detected by the antenna 306 (FIG. 10(b)) contains frequency components between 500 to 1,500 MHz. A spectral distribution (FIG. 10(c)) free from the influences of the external discharge can be obtained by adjusting and subtracting the variation of (a) and (b).

The remaining spectral intensity judgement unit 318 shown in FIG. 7 compares the intensity of the spectrum remaining after subtraction processing with the predetermined detrimental level, judges the existence of an abnormality inside the gas insulated apparatus if the former exceeds the latter and at the same time, determines the charge quantity of discharge from the calibration curve of the predetermined spectral intensity and the charge quantity of discharge.

Furthermore, in the case of the type c in Table 1, the signal is inputted directly without spectrum subtraction to the spectrum width analyzing unit 319 and in the cases of the types d and e, the results of spectrum subtraction are inputted so that the spectrum width analysis can be made for at least two specific frequency bands to discriminate the position of occurrence of the internal discharge. In other words, although the internal discharge has the frequency components near both 700 MHz and 1,300 MHz, the band width of the spectra occurring near them is generally, different between the internal discharge in the gas space and the internal discharge along the spacer creep surface. In connection with the internal discharge of the gas space, the spectrum band width of near 700 MHz and the spectrum band width near 1,300 MHz are equivalent even though the charge quantity of discharge changes as represented by a white circle and a black circle in FIG. 11(a), respectively, but in the case of the internal discharge along the spacer creep surface, the spectrum band width near 1,300 MHz becomes greater as shown in FIG. 11(b). Therefore, whether the abnormality is that of the gas space or that of the spacer creep surface is judged by comparing these two band widths.

Incidentally, the distance between the position of the occurrence of the internal discharge and the partial discharge detector 304 becomes great in a large scale gas insulated apparatus such as a gas insulated substation. While the partial discharge pulse propagates through the inside of the gas insulated apparatus, it undergoes deformation and distortion due to the resistance and inductance of the high voltage center conductor 14 itself, due to the electrostatic capacitance between the high voltage center conductor 14 and the sheath 2 and due to the resistance and inductance of the sheath 2 itself so that the changes occur depending on the propagation distance when the pulse is detected by the partial discharge detector 304. This problem is solved in the following way. Simulated partial discharge is intentionally generated in advance at several portions of the gas insulated apparatus by paying specific attention to at least two specific frequency bands $F_2$, $F_2$, $F_3$ of the 500 to 1,500 MHz band and the absolute values of the intensity of $F_1$, $F_2$ and $F_3$ as well as their relative intensity $F_1/F_2$, $F_2/F_3$ and $F_3/F_1$ are measured. They are then stored as the standard patterns such as shown in FIG. 12 in a trouble mode data base 321 shown in FIG. 7. In FIG. 12, (a) corresponds to the abnormality of the disconnecting switch portion 6 in FIG. 1, (b) corresponds to the abnormality of the breaker 4 and (c) corresponds to the lightning arrester 15, by way of example. Next, the spectral intensity of each of $F_1$, $F_2$ and $F_3$ is extracted by the spectrum component detailed analysis portion 320 shown in FIG. 7 to determine its absolute value and each relative intensity $F_1/F_2$, $F_2/F_3$, $F_3/F_1$. They are then compared with the standard patterns stored in the trouble mode data base 321 to select the standard pattern having the highest analogy. The portion near the point of occurrence of the simulated internal discharge providing this standard pattern is judged as the position of occurrence of the internal discharge.

The judgement result from each judgement unit 314, 315, 318, 319, 320 in FIG. 7 is collectively judged by the collective judgement unit 322 and the existence of occurrence of the internal discharge, the position of occurrence of the internal discharge, whether the internal discharge occurs in the gas space or along the spacer creep surface, the harmfulness of the internal discharge and the charge quantity of the internal discharge are displayed on the display unit 310.

Although the antenna 306 is shown in FIG. 3 as the signal source for spectrum subtraction, it is possible to also use the signals from other phases, as shown in FIG. 13. The gas insulated apparatuses 1a, 1b and 1c correspond to the phases a, b and c, respectively, and have the same specification and the same performance for each phase. The bushing 18a, 18b, 18c and the aerial cables 20a, 20b, 20c connected to them have also the same specification and the same rating in the corresponding way. Since the external discharge appears with the same spectrum and with the same intensity for each of the phases a, b and c, the external discharge can be cancelled by subtracting them mutually. The phase c is stipulated as the reference phase and subtraction (phase a)-(phase c) and (phase b)-(phase c) is conducted and when the absolute value of its remaining spectrum exceeds a predetermined level, the occurrence of the internal discharge is judged and the phase of occurrence is determined in accordance with Table 2.

TABLE 2

| | level of remaining spectrum | | | |
|---|---|---|---|---|
| (phase a)-(phase c) | above | below | above | below |
| | | predetermined level | | |
| (phase b)-(phase c) | above | above | above | below |
| | | predetermined level | | |
| | phase a | phase b | phase c | no internal discharge |
| | phase of occurrence of internal discharge | | | |

TABLE 3

| | level of remaining spectrum | | | |
|---|---|---|---|---|
| (phase a)-(phase c) | great | small | great | small |
| (phase b)-(phase c) | small | great | great | small |
| | phase a | phase b | phase c | no internal discharge |
| | phase of occurrence of internal discharge | | | |

In Table 2, when, for example, the absolute value of the level of the remaining spectrum of [(phase a)-(phase c)] is above the predetermined level and the absolute value [(phase b) -(phase c)] is below the predetermined level, it means that greater partial discharge occurs in the phase a than in the phases b and c. Accordingly, the phase of occurrence of internal discharge is judged as the phase a. Judgement is made in the same way for the other combinations. Similar judgement can be made by merely comparing which of the level of the absolute value of the remaining spectrum of [(phase a)–(phase c)] and the level of the absolute value of the remaining spectrum of [(phase b)–(phase c)] is greater without stipulating the standard level as shown in Table 3.

II. Foreign matter detection

FIG. 14 is a block diagram of fine foreign matter detection unit for detecting fine foreign matter existing inside the gas insulated apparatus, particularly conductive foreign matter which will invite a drop of insulation performance. When a power is supplied to the gas insulation apparatus 1 shown in FIG. 1, a high field is applied inside its gas space so that the conductive foreign matter 30 jumps due to the Coulomb force and impinges against the tank 2. The fine foreign matter detection unit 4000 in FIG. 14 detects the impingement sound by acoustic sensors disposed on the outer surface of the tank 2 to determine the existence of any foreign matter 30. Although FIG. 14 shows only the fine foreign matter detection unit 4000, such may be considered as a part of the local or field panel 1000 of FIG. 1. This detection unit has the function of discriminating whether the detected sound is the impingement sound of fine foreign matter 30 as the detection object, the function of estimating the size of the fine foreign matter 30 and the function of determining the position of occurrence of the sound in addition to the detection function of the existence of the fine foreign matter 30.

In FIG. 14, an AE (acoustic emission) sensor 410 and an acceleration sensor 420 that are part of the detector 50 detect high frequency sound and low frequency sound on the surface of the tank 2, respectively. The respective sensor output signals are amplified by amplifiers 411, 421 and the signals of necessary frequency bands are extracted by bandpass filters 412, 422. Electric noise detectors 413, 423 detect impulse-like electric noise mixing into the detection signals and output their occurrence timing signals $t_1$ and $t_2$. Analog switches 414, 424 turn off the detection signals (the outputs of the bandpass filters 412, 422) only for the occurrence period of the electric noise determined by the occurrence timing signals $t_1$, $t_2$ to cut the electric noise. Detectors 415, 425 are circuits for extracting signals relating to the envelope of the detected acoustic signals. Sound source discrimination index calculator 460 calculates the sound source discrimination index as an index for discriminating the kind of the sound source from the high frequency sound and the low frequency sound as the outputs of the AE sensor 410 and the acceleration sensor 420. In addition to the sound source discrimination index signal 473, the output signals of this calculator 460 include the AE level signal 472, the acceleration level signal 474 and the sound generation timing signal 471. Time difference calculator 450 calculates the time difference of the output signals of a plurality of AE sensors 410 disposed on the surface of the tank 2 of the gas insulated apparatus 1 and the time difference of the occurrence timing of the electric noise and that of the acoustic signal. The signal 452 is the signal from other acoustic measuring systems. Foreign matter judgement device 470 judges the existence of any foreign matter on the basis of the output of the sound source discrimination index calculator 460. Foreign matter diagnoser 480 estimates the weight and material of the foreign matter 30 and its existing position.

The above explains the overall construction of the fine foreign matter detection unit 400 and next, the sound source discrimination index calculator 460, the time difference calculator 450, the foreign matter judgement device 470 and the foreign matter diagnoser 480 will be explained in further detail.

Besides the impingement sound of the fine foreign matter 30, the sound propagating on the surface of the tank 2 of the gas insulated apparatus 1 includes noise and impingement sound of rain. Since the conductive or metallic foreign matter 30 is relatively hard, the frequency components of its impingement sound extend up to a high frequency region. On the other hand, since rain is soft, its impingement sound has relatively large low frequency components. Since noise propagates in the air, the high frequency component attenuates rapidly and the sound propagating on the tank surface 2 consists mostly of the low frequency component. Therefore, it is possible to distinguish the impingement sound of the conductive foreign matter 30 as the detection object from sounds generated by other factors from the proportion of the low frequency component to the high frequency component of the detected sound. Therefore, the sound source discrimination index R is defined as $$R = \frac{\text{high frequency sound level}}{\text{low frequency sound level}}$$

and the impingement sound of the conductive foreign matter 30 as the detection object can be distinguished from the sound generated by other factors from the value of this sound source discrimination index. The high frequency sound is detected by the AE sensor 410 while the low frequency sound is detected by the acceleration sensor 420.

FIG. 15 is a detailed block diagram of the second source discrimination index calculator 460. When the output of the AE sensor 410 or the acceleration sensor 420 changes beyond the set value, acoustic detection circuit 461 generates a pulse having a time width sufficient for the impingement sound to attenuate. Peak holders 462, 463 hold and output the maximum values of the output the AE sensor 410 and acceleration sensor 420 within the time width of the output pulse of the acoustic detection circuit 461. Divider 465 calculates the output ratio of the peak holders 462 and 463, that is, the sound source discrimination index R. Timing circuit 464 generates a pulse of a predetermined width at the point of completion of peak hold. The circuit shown in FIG. 15 provides the peak signals 472 and 474 of the AE sensor 410 and acceleration sensor 420, the sound source discrimination signal 473 and the sound occurrence timing signal 471. FIG. 16 shows the result of calculation of the sound source discrimination index R of each of various sound sources by use of the sound source discrimination index calculator 460 shown in FIG. 15. The sound source Sa is the impingement sound of the foreign matter 30, Sb is the impingement sound of water droplet (corresponding to the rain) and Sc is the patting sound by hand. It can be understood that the sound source can be estimated by the sound source discrimination index R. It can be understood, too, that when the value of the sound source discrimination index R is small, it may be judged as the noise.

The time difference calculator 450 shown in FIG. 14 calculates the time differences between various signals. The combinations of the signals for the time difference calculation are the following four combinations:
(1) time difference of the output signals of sensors;
(2) time difference between the electric noise and the output signal of the AE sensor or acceleration sensor;
(3) delay of the output signal of the AE sensor or acceleration sensor to the reference timing of the commercial frequency;
(4) delay of the electric noise to the reference timing of the commercial frequency.

The timing at which the output of the AE sensor exceeds the positive or negative set value is used as the output occurrence timing of the AE sensor. Here, the reference timing of the commercial frequency is set to the zero-cross point of the change from negative to positive. Each of the time differences is determined by counting the number of clock pulses in the difference between the occurrence time of the respective signals. The combinations of the signals and the time difference of each combination are outputted as the signal 451.

When the sound occurrence timing signal 471 is "1" and the sound source discrimination index R exceeds the set value, the foreign matter judgement device 470 judges that the foreign matter exists and sets the level of the foreign matter judgement signal 475 to "1".

The foreign matter diagnosis 480 operates for a certain predetermined period when the foreign matter judgement signal 475 is "1" and diagnosis the following three items as well as the later-appearing four items:
(1) number of existence of foreign matter 30;
(2) position of existence of foreign matter 30;
(3) weight and material of foreign matter 30.

The number of existence of the foreign matter 30 is associated with its occurrence factor. The number of foreign matter 30, that mixes into the gas insulated apparatus during its assembly and has not been removed completely, if any, is small. On the other hand, when an extremely local portion is over-heated due to an insulation defect or the like, there is the possibility that a large number of fine metallic powdery particles occur. The frequency of the change of the foreign matter judgement signal 475 to "1" somewhat depends on the number of existence of foreign matter 30. Therefore, the foreign matter diagnoser 480 calculates therein the occurrence ratio of the foreign matter judgement signal 475 and displays the result on a display 310 of the field panel 1000.

Clarification of the position of existence of the foreign matter 30 is of utmost importance in order to judge if the foreign matter 30 exists at a crucial position and to execute a plan for the removal work of the foreign matter. There is the possibility that the rigid foreign matter 30 such as metallic pieces and sand are blown up at the time of a high wind and impinge against the tank surface. In this case, the wind velocity near the position of installation of the gas insulated apparatus 1 is related with the occurrence ratio of the foreign matter judgement signal 475. In other words, the occurrence ratio increases with an increasing wind velocity. Therefore, the foreign matter diagnoser 480 establishes the correlation between the wind velocity signal 485 and the occurrence ratio of the foreign matter judgement signal and when the intensity of the correlation exceeds the set value, the foreign matter 30 is judged as impinging against the outer surface of the tank 2. In other words, the judgement is made to the effect that no foreign matter 30 exists at the crucial position. If the judgement is made to the effect that the foreign matter 30 exists at the crucial position, that is, inside the tank 2, the position at which the foreign matter 30 exists is then examined. To this end, the result of calculation of the time difference calculator 450 is used. In other words, the position of the sound source, that is, the position of existence of the foreign matter 30, is estimated from the time difference of the outputs of the AE sensors disposed adjacent to one another. After diagnosis, the information on the existence of any critical foreign matter and its existence position are sent to the central monitoring panel 3000 through the signal transfer cable 482. If the foreign matter is judged existing, an alarm is raised and displayed on the display 310. At this time, the time change of the position of existence, of the foreign matter 30, also, is displayed on the display.

In principle, the greater the size of the conductive foreign matter, the greater the drop of insulation resulting therefrom. It is therefore very important to know the weight and material of the foreign matter. The level of the impingement sound of the foreign matter 30 jumping around due to the Coulomb force is distributed substantially from zero to a maximum value. The maximum value of the impingement sound level is determined by the weight of the foreign matter. The harder and smaller the impinging object, the greater the sound source discrimination index R. Therefore, it changes with the material of the foreign matter 30 even if the weight is the same. Accordingly, the method shown in FIG. 17 is employed to estimate the weight and material of the foreign matter. FIG. 17(a) shows the foreign matter mass-v-impingement sound level characteristics and (b) shows the characteristics of the foreign matter mass-v-foreign matter discrimination index R using the material $M_{at}$ of the impinging object as the parameter. These characteristics are measured in advance by placing simulated foreign matter 30 into the gas insulated apparatus 1. In the actual estimation of the foreign matter 30, the mass $M_1$ is estimated from the measured impingement sound level $V_{AE1}$ in accordance with FIG. 17(a). Then, the material $M_{at2}$ is estimated from the measured foreign matter discrimination index $R_1$ and the estimated mass $M_1$ in accordance with FIG. 17(b). The material $M_{at1}$ is aluminum, $M_{at2}$ is copper and $M_{at3}$ is iron. Here, the maximum value of the impingement sound level in a certain predetermined period is used as the impingement sound level $V_{AE}$ and the maximum value of R when the impingement sound level is the greatest is used as the foreign matter discrimination index R. This estimation information on the mass and material of the impinging object is sent to the display 310 inside the local or field panel 1000 and to the central monitoring panel 3000 through the transfer cable 482.

In addition to the diagnosing function of the foreign matter 30, the foreign matter diagnoser 480 has the function of diagnosing the sound resulting from other factors. This diagnosing function is effective for a certain predetermined period, not only when the sound occurrence timing signal 475 is "1", but also when the sound occurrence timing signal 471 is "1". The diagnosing function includes the following four items:
(1) stability of occurring phase of the output of the AE sensor and that of the acceleration sensor;
(2) stability of the occurrence time difference between the electric noise and the output of the AE sensor or the acceleration sensor;
(3) noise occurrence;

(4) estimation of sound source.

When the occurrence timing of the detection acoustic signal by the AE sensor 410 and the acceleration sensor 420 is in synchronism with the phase of the commercial frequency, the sound occurs with the partial discharge and the sound is assumed to be detected. Therefore, the diagnoser 480 has a calculation mechanism of the mean value of the occurrence phase of the sound and the standard deviation. Incidentally, the phase of each occurrence sound is already calculated by the time difference calculator 450.

When the difference of occurrence time difference between the electric noise and the detection sound is stable, the discharge sound is assumed to be detected. This can also be judged from the mean value of the time difference and the standard deviation. Therefore, the diagnoser has the calculation mechanism of the mean value of the time difference and the standard deviation.

To know the existence of a strong electromagnetic wave near the position of installation of the gas insulated apparatus 1 to such an extent that electric noise mixes into the measuring system is helpful in order to determine the operating conditions of other measuring systems. Therefore, only the occurrence of the electric noise is judged from the output of the time difference calculator 450.

The foreign matter diagnoser 480 has the function of diagnosing the sound sources other than for the impingement sound of the crucial conductive foreign matter 30. Such sound sources include the sound of the rain and the impingement sound of plastics. Diagnosis is made on the basis of the sound source measured in advance and the foreign matter discrimination index data. Whether the sound source is internal or external is judged by use of the aforementioned correlation with the wind velocity. As to the rain sound, however, it is judged as the external sound without relying on the correlation. If any foreign matter is detected as existing inside the tank 2, the inside of the apparatus is inspected in further detail at the time of regular inspection.

The results of the four diagnoses described above, that is, stability of the occurrence phase of the sound, stability of the electric noise and the occurrence time difference of the sound, the existence of only the electric noise and the estimation result of the sound source, are displayed on the display 310 of the field panel 100 and sent also to the central monitoring panel 3000 through the transfer cable 482.

In the foreign matter detection unit described above, acoustic detection is made by two sensors, but the same function can be accomplished by a single sensor if an AE sensor of a broad band is employed. All of the constituent elements can be constructed by commercially available circuit elements. Although the AE sensor 410 and the acceleration sensor 420 are of a piezoelectric type here, a strain gauge and device based on other principles can be employed. The function of the foreign matter diagnoser 480 can be achieved also inside the panel 3000.

III. Oscillation measurement (power supply abnormality)

FIG. 18 shows schematically the structure of the oscillation measuring function of the present invention and represents the case where the detection object is the breaker 4 and a piezoelectric type acceleration sensor 420 is used as the detector 50. The breaker 4 has the structure wherein the center conductors 14, 14' are supported insulatedly and hermetically by the bushings 18, 18' and sealing terminals 509, 509' to the tank 2 as the hermetic container at the ground potential, and are connected to the breaker portion 508 consisting of a movable electrode 506 and a fixed electrode 507. The members other than the sealing terminals 509, 509' are connected to the aerial cables of the power supply system or to other transmission substation equipment by the aerial cables 20, 20', thereby constituting a current path. Generally, the $SF_6$ gas is sealed as the insulating gas into the tank 2 at a pressure of about 5 Atms. In this structure, the power supply abnormality due to the following causes may happen:

i) wear and degradation of the breaker electrodes due to the excessive number of times of breaking of the current;

ii) inferior making due to trouble of an operator for driving the movable electrode;

iii) insufficient contact force due to degradation of a push spring at a tulip contact portion;

iv) insufficient fastening force of bolt at the conductor connection portion due to defective assembly.

It has been found that when the power supply abnormality develops due to these causes and proceeds, oscillation occurs at the contact portion at a relatively early stage. Here, the acceleration sensor 420 is disposed on the outer wall of the tank 2 in order to detect this oscillation. External diagnosis is preferred in order to detect the abnormality without spoiling reliability of power supply. The oscillation phenomenon dealt with in the present invention is relatively as large as from about 0.001 to about 0.1G and the frequency range is from about 200 to about 5,000 Hz. Therefore, a commercially available product can be used as such for the acceleration sensor 420. To fit the sensor 420, it is preferred to weld exclusive bosses to the tank 2 and to fix the sensor by bolts. In the case of a portable type, however, the sensor can be fixed conveniently by magnets to the magnetic portion of the tank 2. The sensor can be fixed by use of an adhesive if the tank is of the existing type having no exclusive bosses.

The output signal of the acceleration sensor 420 is sent to the amplifier 421 through the exclusive cable 511. Generally, the length of the cable 511 is limited to up to several meters due to the characteristics of the acceleration sensor 420. Therefore, the amplifier 421 is disposed near the acceleration sensor 420 or inside the local panel 1000. The output signal of the amplifier 421 is sent to a band filter 514, a cable 515 and an oscillation detector 516 inside the central monitoring panel 3000 through the transmitting or transfer unit 2000. If the oscillation detector 516 is disposed in the distance of some dozens of meters away from the acceleration sensor in order to dispose it inside the control room of the substation, it is possible to first convert the signal electro-optically and then convert it opto-electrically after its transfer through an optical fiber cable in order to improve S/N for an external surge. The band filter 514 is not essential for the present invention but the S/N ratio can be improved by cutting the signals below 200 Hz and above 5,000 Hz and abnormality detection accuracy can be improved, also. Particularly, many oscillations based on the commercial frequency and those frequency which are some multiples of the former as the fundamental tone exist in the environment where the breaker 4 is disposed. Therefore, cutting of the former frequency band provides a great effect.

Any detector may be used fundamentally so long as it can detect electric signals of 200 to 5,000 Hz. In a portable system where the detector is stored as a whole in one casing, an A.C. voltmeter can be used conveniently as the detector 516. It is necessary in this case to confirm that the frequency characteristics are insured. Determination of the center frequency of the occurring signal is an effective hint for stipulating the oscillation occurrence source. Therefore, a synchroscope and more preferably, a spectrum analyzer are used.

The number of measurement positions for the acceleration sensor 420 is preferably large from the aspect of abnormality detection reliability but in the case of the single breaker 4 shown in FIG. 1, the ordinary object can be accomplished by making one-point measurement near the center of the tank 2. In the case of a so-called "GIS structure" wherein a large number of transmission/substation apparatuses are connected by gas insulated buses, it is advisable to dispose approximately one measuring point in one gas zone as a standard. Spacers and the like are inserted between adjacent gas zones because the oscillation attenuates at their connection portions.

It is considered best to measure in advance the background noise at the normal time at each measuring point as the abnormality judgement standard and to set the standard to some multiples of the measured value. If such an information is not available, however, the intended object can be accomplished by setting the standard between 0.001 to 0.01 Ghz.

As a method of stipulating the occurrence source if any abnormal oscillation is detected, it is best to employ the method which measures simultaneously the oscillation waveforms at several points around the oscillation source and to judge the source by comparing their intensity. After the rough position is thus stipulated, the corresponding position may be confirmed by disintegration inspection. Incidentally, since the trace of fusion of a light degree remains at the abnormal portion when the oscillation described above occurs, the abnormal portion can be stipulated accurately even under the state of stoppage of power supply.

FIG. 19 shows the application of the present invention to a large scale breaker 4. In this embodiment, the breaker portions 508, 508' each consisting of the movable electrode 506 and the fixed electrode, 507 are fitted in series. Since the dimension of the tank 2 becomes greater, too, two acceleration sensors 420, 420' are disposed as the detectors. Since the oscillation occurring at the time of a power supply defect of a high potential conductor portion propagates mainly through the solid portion, the acceleration sensors 420, 420' are preferably disposed near the mechanical connection portions with the high conductor portion as shown in the drawing. In this embodiment they are disposed on a mirror plate 525 of the tank flange 524 to which the insulation support cylinder 523 for insulating and supporting the conductor 522 on the fixed electrode side is fixed. It is thus possible to detect the oscillation occurring from the power supply abnormality portion with high sensitivity even by the external diagnostic method.

FIG. 20 shows the application of the present invention to the GIS structure used in a gas insulated switching station. Center conductors 14, 14', 14'' are supported inside the tanks 4, 4', 4'' by spacers 10, 10, and through-conductors 529, 529'. Although a practical gas switching apparatus has a complicated construction consisting of various switches, measuring instruments, a lightning arrester, branching devices and the like, it is shown composed of the center conductor 14 for simplicity. In such a construction, the spacer 10, 10' corresponds to the mechanical connection mechanism between the high potential portion and the ground potential portion. Therefore, the acceleration sensor 420, 420' is preferably disposed on or near the spacer 10, 10'. In general gas insulated apparatuses, the spacer 10, 10' serves as the wall for partitioning the adjacent gas zones, and the position of the abnormality occurring portion can preferably be identified if any abnormality is detected. If the gas zone in which the abnormality exists can be identified in advance, only that zone may be disintegrated for inspection and the necessary labor can be drastically reduced. To this end, if the acceleration sensor is diagnosed on each spacer serving as the gas partition, the gas zone involving the abnormality can be identified easily by comparing the intensity levels of the oscillation signals detected by the acceleration sensors.

In addition to the method of improving detection sensitivity described above, another method of improving the abnormality detection sensitivity in the present invention includes the improvement of the S/N ratio. The noise generation source includes the electromagnetic force, magnetostriction effect and induction of the supply current of the commercial frequency itself. According to actual measurement, the insensitivity level which renders the problem for the oscillation detection as the object of the present invention is within the range of below 200 Hz. A desired S/N ratio can be obtained by cutting off the noise through the bandpass filter or the like as described already. In a rare case, relatively great oscillation such as magnetostriction oscillation occurs in the proximity of the transformer or the like. It is therefore advisable to measure and store the initial values when the abnormality detection apparatus is installed or the normal values of a portable system as the power supply current values and to use them as the reference values. Other noise sources include the contact/impingement sound of objects or human bodies. However, since they occur instantaneously, they can be eliminated as a small value rendering no practical problem by so-called averaging processing which determines the mean values of a plurality of data that are measured repeatedly. Continuous noise such as of wind and rain can be eliminated by the following means.

FIGS. 21 and 22 show output waveforms when a frequency analyzer is used as a detector 516. The ordinate represents the frequency f and the abscissa represents the logarithm of the oscillation intensity G. The waveform a in FIG. 22 represents the state where the power is supplied normally and external noise is relatively small. In the range of 200 Hz or below, the noise components of induction and electromagnetic force due to the supply current of the commercial frequency exist and are not suitable for abnormality detection. Therefore, the drawing shows the frequency range above it. The waveform b in FIG. 22 represents the state where the influence of the external noise such as wind and rain exists. This waveform has an upwardly shifted form with respect to the waveform a. Therefore, if a certain value is set as a judgement standard of power supply abnormality detection and if abnormality is judged simply when the signal level exceeds the set value, it involves the possibility of an erroneous operation when the external noise level becomes great, and this is dangerous.

The waveform shown in FIG. 21 represents the waveform when the power supply abnormality exists. As shown, the oscillation components exist in those frequency which are multiples by an even number of the power supply current frequency and the frequency components are relatively small in those frequency which are multiples by an odd number. The portions between these frequency components become valleys and the oscillation components are few. If the external noise such as wind and rain overlap with the waveform at the time of power supply abnormality, the resulting waveform is approximately the upwardly shifted waveform of the waveform of FIG. 21. Therefore, the judgement standard for the power supply abnormality detection should be expressed by how many times the component P, which is some multiples by an even number, of the power supply current frequency is the value L between the adjacent components which are some multiples of the power supply current frequency. A definite numeric value should be from two times to ten times or more. To improve detection reliability, similar verification is preferably made for a plurality of peaks and their AND or OR should be calculated. FIG. 23 shows an economical construction to cope with the case where the number of detection positions is great such as in a gas insulated switching station. In the same way as in the embodiment described above the acceleration sensor 420 is mounted to the outer wall of the tank 2 and the signal is passed through the amplifier 421 in the panel 1000 and processed by narrow-band bandpass filters 519, 519'. The center frequency of the bandpass filters 519, 519' is set to P and L of FIG. 21, respectively. For further simplification the bandpass filters 519, 519' may be constituted by a tuning circuit. The outputs of the bandpass filters 519, 519' are sent to a computer 520 of the central monitoring panel 3000 through the transfer unit 2000, where the existence of any abnormality is judged.

External continuous noise such as wind and rain can be eliminated by disposing a dummy reference plate near the tank, detecting the wind and rain by acceleration sensor disposed on the reference plate and performing the subtraction processing from the measurement signal of the normal acceleration sensor 420 or locking the abnormality alarm output of the abnormality detector 516.

High level oscillation noise, which is essentially analogous to the noise described above, is generated due to the oscillation in the operation of breakers and disconnecting switches or due to generation of the power of operation units, such as when a hydraulic pump is driven. Abnormality detection accuracy can be improved by inputting the operation signals of these apparatuses inside the sub-station and by locking the abnormality alarm output when the operation signal is generated.

Oscillation of 200 to 5,000 Hz generated generally from the abnormal portion at a relatively early stage in the process of development of power supply abnormality can be detected by, measuring the tank oscillation in accordance with the foregoing embodiments and a critical problem such as earthing or grounding of the gas insulation switches can be prevented in advance.

IV. Temperature detection (power supply abnormality)

FIG. 24 shows the principle of this detection method. The abscissa represents the time of day on a 24 hour clock and the ordinate represents the temperature difference between measuring points. The temperature difference represents the maximum value throughout the year by determining the interphase maximum temperature difference for the temperatures measured by cutting off the direct solar rays for a phase separation type GIS at the site of the sub-station. As a result, it has been found that the interphase temperature difference is extremely small such as below 0.5 C between 10 o'clock at night and 6 O'clock in the morning after sunset and is considerably large such as about 4 C in daytime. From this result, it is effective to measure the tank temperature at night and to judge the existence of abnormality when the interphase temperature difference exceeds a reference value which is set to at least 0.5 C in order to detect the local overheat and the tank temperature rise resulting from power supply abnormality.

FIG. 25 shows an embodiment of an example of the application of the concept described above to the phase separation type gas insulated apparatus having the GIS structure and shows the portions around the breaker storage unit. Tanks 2, 2', 2" which are for the respective independent phase and have a hermetic structure are disposed horizontally and sulfur hexafluoride as the insulating gas 802 is sealed in each tank. A high potential portion 805 consisting of a center conductor 14, 14' and a breaker unit 804 is insulated and supported by an insulation spacer or the like, not shown. An abnormality detector 806 is hereby directed to detect power supply abnormality due to the consumption of the electrode of the breaker 804 and a detector 50 consisting of thermocouple 807, 807', 807" is disposed immediately above the breaker 804 as the temperature detection means. An umbrella-like shade for cutting off solar radiation is not necessary because this embodiment is directed to measure the night temperature. However, a water-proofing cover for preventing the occurrence of rust, reinforcing means and insulation means for preventing invasion of surge at the time of earthing are necessary. The output of each thermocouple 807, 807', 807" is sent to the central monitoring panel 3000 consisting of a processor 811 through a local panel 1000 consisting of an amplifier 421 and an analog-digital convertor 810 and through the transfer unit 2000. The functions of the processor 811 are shown in FIG. 26. Prior to the judgement of abnormality, whether the time is 10 o'clock at night to 6 o'clock in the morning is judged, and if it is not within this range, abnormality judgement is not made for the measurement result. If the time is not within this range, the maximum temperature difference is determined for the temperatures $T_1$, $T_2$, $T_3$ measured by the thermocouples 807, 807', 807". Next, they are compared with the judgement standard (10 C in this embodiment) that is set in advance. If they are below the judgement standard, processing is complete as such and if it is above the standard, an alarm is raised.

As to the kind of alarms, this embodiment outputs only the time, the temperature measurement values, etc., by a printer of the processor, but it is possible to employ a system which reports the alarm by flash of lamps or alarm sound to service engineers of a nearby control station or instruction station. In a future system, an on-line system will be employed wherein the alarm is transferred as an abnormality signal to a central control computer controlling the operations of substation apparatuses. The processing is complete in the sequence described above and the processor repeats this routine with a suitable interval.

Although the temperature measuring points are three in the embodiment described above, they will be some hundreds of points in a future system which monitors exclusively a large scale substation. In such a case, the measuring points of analogous components are grouped together, the maximum temperature difference is obtained for each of these groups and compared with the respective judgement standard and in this manner, the influences of the ambient temperature can be reduced further.

FIG. 27 shows a different embodiment. Comparison is made with the same judgement standard 1 as that of the embodiment described above in the period of from 10 to 6 o'clock, but with the judgement standard 2 (5° C. in this embodiment) having a margin to the maximum value of the temperature distribution in the daytime in another time zone. In this embodiment a cover or a heat insulating material is necessary to prevent direct radiation of solar rays to the thermo-couples. This embodiment can detect critical abnormality which abruptly occurs in the daytime and will result in earthing within a few hours.

FIG. 28 further develops the concept of the embodiment described above. Judgement standard H(t) which is the sum of the maximum value of the temperature difference shown in FIG. 24 and the margin is stored as the function of time t in the processor to monitor the temperature measurement value from one minute to the next. This embodiment can cope with an accident described above in the same way but its effect is greater. The characteristics of the temperature difference shown in FIG. 24 vary with the topography, latitude, longitude, etc., of the substation where the breaker is disposed. Therefore, a greater effect can be obtained by measuring the similar characteristics to those of FIG. 24 after installation at the site and preparing the final judgement standard.

According to this embodiment the tank temperature is measured in the night and the judgement standard with which the measured time difference is to be compared can be set to a value below the temperature difference appearing at the time of the occurrence of abnormality. Accordingly, it is possible to avoid the erroneous operation due to the influences of the ambient temperature and moreover, to detect highly accurately the temperature difference based on the power supply abnormality.

V. Thermo-viewer

Hereinafter, an embodiment relating to a measuring method by an infrared radiation thermometer will be explained. If the temperature distribution on the tank surface of the gas breaker is measured by use of an infrared radiation thermometer, there is the problem that the measurement error becomes great due to the influences of the background temperature. Generally, the gas breaker has a horizontally coaxial shape and is disposed outdoors in the site of the 25 substation and an infrared camera as the measuring unit of the infrared radiation thermometer is disposed on the ground. Therefore, the gas breaker is viewed mostly from the horizontal direction. In such an arrangement, the measurement error becomes great irrespective of day and night, particularly at the time of fine weather and the upper temperature of the tank is measured lower than it actually is. As a result of intensive studies, the cause is found as follows. Namely, the infrared ray radiation ratio on the tank surface depends on the direction in which the infrared rays are radiated to the tank surface, and is large in the normal direction and becomes progressively smaller with an increasing inclination angle. FIG. 29 shows an actually measured example of the radiation ratio. The angle $\theta$ of the abscissa in FIG. 29($a$) corresponds to the angle of the direction 904 of the infrared camera 903 relative to the normal 902 of the tank surface 901 shown in FIG. 29($b$). The radiation ratio e of the ordinate represents the ratio of the energy radiated practically from the tank surface to the theoretical value of the infrared energy radiated from a black body having the same temperature as the tank. As shown in the diagram it has been found that the radiation ratio e becomes small by the measurement from the region where $\theta$ is great, that is, by the measurement from the oblique direction. If the radiation ratio e is small, the quantity of the infrared rays radiated from the tank decreases and the product of the energy incident into the tank from the environment and the reflection factor (reflection factor = 1 − radiation ratio) is reflected on the tank surface so that the apparent radiation energy changes, thereby causing a measurement error. If, at this time, the temperature difference between the ambient temperature and the object of measurement is small such as in the case of indoor measurement, the measurement error is small, but it becomes great in the case of the outdoor measurement at the time of fine weather because the blue sky has an equivalent temperature of as low as from −20° C. to −40° C. when viewed infrared-wise, and because the temperature difference with the tank is great. For the causes described above, when the coaxial tank is measured, there has been the problem that the measurement error is great around the tank peripheral portions where the viewing angle of the infrared camera with respect to the tank surface is great and the temperature is measured lower than it is actually.

If, for example, the infrared camera is disposed at a position viewing the tank as the object of measured at an elevation of 20°, the viewing angle $\theta$ of the infrared camera to the normal direction at the upper part of the tank is 70° and the radiation ratio e of 0.8 can be secured from FIG. 29($a$). If the elevation is 30°, the angle $\theta$ is 60° and the radiation ratio e is 0.9. In this manner the high radiation ratio can be secured at the upper part of the tank by disposing the infrared camera at a high place. On the other hand, if any power supply abnormality portion exists inside the tank and local overheating occurs, convection of the insulating gas such as sulfur hexafluoride sealed in the tank occurs and the temperature at the upper part of the tank immediately above the local overheating portion responds sensitively to this convection and rises. Therefore, if the infrared camera is disposed at a high place in order to secure the predetermined radiation ratio at the upper part of the tank, that is, to minimize the measurement error, the temperature rise of the tank due to the local overheating can be detected accurately at an early stage.

FIG. 30 shows the infrared camera 903 as the detector 50 which is fixed by utilizing an iron structure 905 disposed for fixing the lead-in port of the aerial cable in the site of the substation. The tanks 2, 2', 2'' as the object of measurement represent the longitudinal section of the phase separation type gas insulated switching apparatus and is fixed onto the ground 908 by legs 907. The elevation $\theta_1$ of the infrared camera 903 viewing the tank as the object of measurement is preferably at least 30° capable of securing the radiation ratio of 0.9 and even in the worst case, at least 20° to secure the radiation ratio of 0.8 even when there is any problem such as the limit to the place, in relation angle $\theta$ at the upper part of the tank and the radiation ratio e shown in FIG. 29(a). The temperature measurement errors corresponding thereto are about 3° C. and about 5° C., respectively, when the tank temperature is 10 C and the background (sky) temperature is −20° C., and they are the limit of the allowable errors permitted for the purpose of power supply abnormality detection.

The infrared camera 903 is stored in a protective case 909 having a water-proofing function and is driven by an elevation mechanism 913 consisting of a motor 910, a gear 911 and a roller 912 through a wire 915 guided by a roller 914, and a wheel 917 fixed to the case 909 is moved up and down inside a guide groove 916 formed on the iron structure. The object of elevation includes the adjustment of the field of the infrared camera 903, but elevation is made because the camera must be moved down to the ground every several hours in order to supplement the liquid nitrogen which is used for cooling an infrared device incorporated in the infrared camera 903. The main body of the processor having a similar function to that of the local panel 1000 for processing the measurement image by the infrared camera 903 is disposed inside a control chamber in a building 919 of the substation and is connected to the infrared camera by the measurement cable 920.

In accordance with this embodiment the present invention can be introduced easily into the existing substation by installing the infrared camera by use of the iron structure. Since the infrared camera is disposed at a high place, the coverage of a single set of cameras becomes wider and the number of necessary infrared cameras for monitoring the substation as a whole becomes smaller.

Besides the iron structure used as the support means for the infrared camera in the embodiment, any means can be employed without any limitation such as the building, a sound-proofing wall for storing the transformer, an exclusive support bed, and the like so long as they can secure a necessary height. They are selected in accordance with the construction of the substation as the object.

FIG. 31 shows a different embodiment. The tank 2 shown in the drawing is part of a phase separation type two-circuit gas insulated switching apparatus and is disposed on the ground 908 by legs 907. The infrared camera 903 is disposed through a stage 923 incorporating a mechanism for adjusting the swivel angle in both vertical and horizontal directions onto an exclusive pole 922 which is fixed onto the ground 908 by bolts 921. The measuring cable 920 and the control cable 924 of the rotary stage 923 are connected to the processor 918 placed in the control room through a duct 925 laid down in the ground. In this embodiment an electronic cooling system is used for cooling the infrared device to avoid troublesome maintenance. Although this system has a little lower measurement accuracy than the liquid nitrogen system, it can be used practically. Since the infrared camera is disposed between the circuits of the two-circuit gas insulated switching apparatus in this embodiment, the distance between the tank as the object of measurement and the infrared camera can be shortened and resolution of the resulting image becomes higher. Similar effects can be obtained when the camera is disposed between the phases. In this embodiment, too, the elevation $\theta_1$ of the viewing angle of the infrared camera is preferably 30° and must be at least 20° even in the worst case, inside the region as the object of measurement.

FIG. 32 shows still another embodiment. The tank 2 is disposed on the ground 908 by legs 907. The entire length of the tank 2 sometimes exceeds 100 m at the bus portion of the gas insulated apparatus or the like so that the total number of fixed cameras increases and the analytical processing of the measurement results becomes large. In this embodiment the infrared camera 903 is fixed to a free-run type truck 926 and wheels 930 are driven by a transmission belt 931 on a guide rail 928 fixed on the iron structure 927 disposed in parallel with the longitudinal direction of the tank 906 by a driving motor 929. Thus the camera can move freely. In this embodiment a single infrared camera can measure a wide range. Moreover, it is possible to keep the angle $\theta$ to the upper surface of the tank 2 shown in FIG. 29(a) can be kept near 0 for any measuring point, and the measurement error can thus be kept minimized.

FIG. 33 shows still another embodiment relating to marking which is useful for stipulating the measurement portion. The drawing is a top view of the tank 2. A sheath type heater 932 is connected to the tank surface by a lead wire 933 and is fixed by a metal 934 which is spot-welded to the tank 2. In this embodiment, the heat generation portion of the heater 932 is disposed in the proximity of the portions having the causes for the occurrence of the power supply abnormality such as the connection portion of the conductor stored in the tank, the switching portion and the like, but not immediately above such portions. If the exothermic calories of the heater 932 is sufficiently a few W for each position, it does not result in measurement error. In this manner, the measurement position can be identified easily from the infrared image both in daytime and night, even when the temperature distribution is small. If the object of measurement is large in scale and the number of measuring points becomes large, the shape, length, pitch, etc., of the heater 932 are changed for each measuring point and by so doing, the effect of this embodiment can be further improved.

FIG. 34 shows still another embodiment which relates to a connection method between the infrared camera 903 and the processor 918. In a large scale substation, a large number of infrared cameras 903 constituting the detector 50 become necessary in order to monitor a wide range. Correspondingly, the number of processors 918 having the functions of the local panel 1000 increases and analytical processing becomes great from the economic aspect, too. To avoid such a problem, this embodiment disposes a changeable branching unit 935 between a plurality of infrared cameras 903 and the processor 918 so as to sequentially change the infrared cameras 903 for monitoring. Accordingly, the operator can monitor sequentially the substation as a whole while being seated at a predetermined position. In a future automatic monitor system, a computer is connected to the processor and automatic monitoring will be effected by use of an image processing technique. This embodiment can be similarly applied to such a system, also.

According to this embodiment, the infrared camera is disposed at a position higher than the tank as the object of measurement so that the viewing angle of the camera above the tank can obtain a predetermined radiation ratio. It is thus possible to react sensitively to local overheating resulting from an internal power supply abnormality and to accurately measure the temperature distribution of the upper part of the tank which exhibits the temperature rise.

The processing contents of the local panel 1000 for each detector, and each detector output used in the present invention, are generally as described above. Next, the processing contents after the local panel 1000 will be described.

Generally, signals from the sensor are mostly weak and a method of processing the detection signal at the sensor portion fitted directly to the apparatus and sending it to a remote central monitoring apparatus 3000 is not practical from the aspects of power supply and the cost of apparatuses. In this case, it is better to employ a method which integrates the signals from the sensors on the way in accordance with the size of the apparatus as the monitor object, its arrangement and construction, the kind of sensors and their number and to transmit the result to an upper order system. FIG. 35 shows such an example. There is illustrated the method which integrates the signals so as to correspond to the individual apparatuses 1A-1E (FIG. 35 (a)), the method which integrates exclusively the apparatuses 1A-1E for several circuits (b), the method which integrates the apparatuses IA-1I in the same yard in the yard unit (c), and the like. These methods are selected in accordance with the kind of sensors, their number, the area of the yard, future expansion plan, etc., and the local panel 1000 exhibits the integration function.

A structural example of the local panel 1000 will be explained with reference to FIG. 36. Generally, the local or field panel 1000 consists of light electrical appliances using primarily a computer, and since these appliances are placed under the condition of the substation where the noise and surge environment is severe, sufficient attention must be paid to them. The signals from various sensors 50 are connected to a high withstand voltage isolation port 1002 through corresponding signal cables 1001. The port 1002 is the portion which protects the panel 1000 from an abnormal voltage entering through the signal cables 1001 to cause its burn-out or erroneous operation, and an insulation amplifier, a coupling transformer, a photo-coupler, etc. are employed in accordance with the signal properties.

Among the various sensor signals, those which are inputted in an analog quantity are converted to a digital quantity by an analog/digital convertor (A/D) 1005 through a filter 1003 and a signal switch 1004. Those signals which are inputted as the ON/OFF signals of the contact are received through a digital input circuit (D/I) 1006. The time is measured for those signals which measure the time difference between the sensor signals by a counter circuit 1007, and the measured value is received as the digital quantity. These digitized signals are processed by a central processing unit (CPU) 1009 through a common bus line 1008 and the data are stored in a memory unit 311.

The central processing unit 1009 processes the signals inputted by the signal processing program corresponding to the various sensors 50 and judges the existence of any abnormality on the basis of the predetermined abnormality judgement algorithm. The information on the judgement result and the like are edited to a predetermined format as transmission information by the communication unit 1013 and then converted to signals matching characteristics of the transfer or transmission line of unit 2000 by a modulator/demodulator (MODEM) 1014 and transferred to a monitoring apparatus 3000 of an upper order system. The information can also be confirmed by the display unit 310 through an interface 1011 so that the latest monitor data can be confirmed in the proximity of the apparatus at the time of inspection and maintenance.

When judgement is made to the effect that an abnormality exists in the apparatus, the abnormality is notified to the upper order system and the contact output can also be outputted to the panel 1000, from the digital output unit (D/o) 1015. This signal is used for panel display and in the case of a higher order system, is used as a start instruction for a high function mobile diagnosis car that stands by separately so that detailed data collection can be made immediately by high sensitivity sensors or the like.

When the apparatus as the object of monitoring exists in a non-manned substation, the utilization method of the functions of the local or field panel may be the following two. The first method transfers the information to a man-controlled control station at a remote place by its built-in communication unit 1013 and effects monitoring by its monitoring apparatus 3000. In this case, on-line management of monitoring information from a plurality of substations can be made at one place. The other method stores the monitoring information in the local or field panel 1000, collects the data at the time of periodical inspection and diagnosis soundness of the apparatus on the basis of the data. Collection of the stored data can be made by recovering the recording medium, by data collection utilizing a portable personal computer or by placing a small computer inside the panel and recovering the printed sheet. A suitable method may be selected in accordance with the mode of inspection and maintenance.

Since a plurality of kinds of information from a plurality of sensors are integrated in the panel 1000, the central processing unit 1009 processes them on a time division basis. In other words, when an abnormality occurs in the apparatus, such as partial discharge monitor, the information between the panel 1000 and the monitoring apparatus 3000 of the upper order system is mainly the UP information from the former to the latter. On the other hand, the reference values for making the abnormality judgement in the field panel 1000 needs instruction information, such as when the reference values must be changed in accordance with the environmental condition or with the condition of the apparatus or when fine monitoring must be effected consecutively after any abnormality is detected by rough monitoring and these instructions are transferred as DOWN information from the monitoring apparatus 3000 to the local or field panel 1000. The data storage quantity in the panel 1000 changes in accordance with the monitoring items.

Fundamentally, however, the memory capacity may be designed with some margins so that the information quantity can be stored till restoration if the transmission line of the unit 2000 is disconnected due to the occurrence of a trouble. Since a plurality of kinds of information from a plurality of sensors are integrated in the panel 1000, the central processing unit 1009 processes them on a time division basis. In other words, the diagnosis information includes those of types, such as the partial discharge monitoring information, whose abnormality symptom is detected consecutively when any abnormality occurs in the apparatus, and those of types such as the monitoring information of the switching time of CM or the like, or the measurement information of a thunder surge, whose occurrence is single and cannot be anticipated. All of such information are processed by sequentially actuating a plurality of tasks such as the basic task, the data processing task, transfer task, etc., as shown in FIG. 37. Processing of those sensor signals which cannot be processed by the task processing that are sequentially actuated, in relation to the processing time are processed by an exclusive processing unit disposed separately, e.g., a counter unit 1007 with predetermined time resolution, and the data after processing are inputted by the main task and subjected to data processing.

A program for checking the soundness of various sensors and soundness of the panel 1000 itself is incorporated as one of the individual tasks and reliability of the local panel as a whole can be maintained by making periodical checks.

Next, an embodiment of the transmission line of the transmission unit 2000 will be explained. To gather the information collected by the panel 1000 to the upper order system, the transmission line is formed in the substation. In this case, there occur the case where the diagnosis information at other field panels must be referred to on a real time basis in order to make the abnormality judgement in the panel 1000, and the case where it is not necessary. The construction of the transmission line differs between these cases. The latter can be accomplished by merely connecting a plurality of local field panels 1000 to the monitor apparatus 3000 of the upper order system on n:1 basis as shown in FIG. 38, and this can be constituted at a reduced cost from the aspect of economy.

In the former case, it is necessary to employ a construction so that the information exchange can be effected between the local or field panels 1000 such as a loop system shown in FIG. 39(A) or a start system using a star coupler shown in FIG. 39(B). The sequence of transfer becomes more complicated and the cost becomes also higher than the latter, but since interconnection can be established with other protective apparatuses and monitoring control apparatuses, it is effective for a higher monitoring system configuration. In either case, since the transmission line 2000 is extended throughout the substation, an optical transmission line using optical fibers is suitable from the aspect of resistance to noise.

FIG. 41 shows a hardware construction of the central monitoring panel 3000. A communication interface 3005 receives the data transferred from the field panels 1000 through the transfer unit 2000 and stores the data in a data unit 3003 in accordance with the instruction of the calculation unit 3001. The calculation unit 3001 effects judgement and processing from the data described above and the content of a rule unit 3002 and outputs its result to a display unit 3004 and to the I/O interface 3006. The I/O interface 3006 outputs the signals to an audio output 3007 and to a display lamp 3008. The data unit 3003 stores the real time data of the apparatus condition detected by the sensor 50 and processed by the panel 1000 in the time sequence arrangement from the past to the present. Furthermore, it stores the abnormality critical values necessary for the judgement and processing by the calculation unit 3001, the inspection/repair method, the repair cost and the data of the past trouble of each apparatus. The rule unit 3002 stores the rules for the calculation unit 3001 to judge collectively the soundness of the apparatuses under the operation at that point of time and to decide the subsequent processing. The display unit 3004 outputs the judgement result of the calculation unit 3001 in the form such that an operator can understand easily the judgement result. It uses a CRT or liquid crystal display.

Next, the processing content of the software in the central monitoring panel 3000 will be explained with reference to FIG. 40.

In FIG. 40(a), the collection data detected by the sensor unit 50N is judged by the judgement unit 70N of the local or field panel 1000 in accordance with the data of the reference values 70R as the standard, and the diagnosis unit 80N judges whether it is an abnormality value. The diagnosis result of the diagnosis unit 80N and the collected data are sent by the transfer unit 2000 to the central monitoring panel 3000 and the following processings are executed. The data collection work in the panel 1000 is made periodically by the instruction from the center panel 3000.

The storage unit 90L stores time-sequentially the data that transferred thereto in the item unit in the data unit 3003 shown in FIG. 41. If the result of the diagnosis unit 80N represents the existence of an abnormality, the next processing is executed. The estimation calculation unit 90A for the usable period estimates the period in which the apparatus can yet be used, although the sign of the abnormality appears, from the data collected at the time of the abnormality, the abnormality critical value 91A representing the critical values of the abnormality data at which the apparatus is operative and the past data trend values. In the case of the power supply function, for example, assuming that the temperature rise value of the abnormal portion is $T_1$ °C. and the usable temperature rise value is $T_0$ °C. (this $T_0$ °C. value is updated periodically depending on the ambient environment) judging from the ambient environment, the usable period tR can be estimated as follows with $D_T$ being the temperature rise ratio to the present point of time of that abnormal portion:

$$tR = (T_0 \times T_1) \times a / \Delta T$$

a: margin ratio

Next, a repair method judgement unit 90B judges the repair method and the period necessary for the repair from the data of the inspection/repair method data unit 91B storing therein the data of the integration/replacement and adjustment method when the inspection and repair are made for the portion at which the abnormality is detected and each constituent unit of the gas insulation apparatus 1. A calculation unit 90C for calculating the cost necessary for the repair calculates the cost necessary for the repair from the data of the repair, cost data unit 91C storing the data of the cost necessary for the repair of each constituent portion.

After the processings described above are completed, an output unit 92A constitutes the associated necessary information in one picture surface and outputs it as an output image 92a in consideration of the man-machine property. In the case of diagnosis of the power supply function, for example, it outputs the power supply abnormality portion 92a1, the operation continuable period (tR) 92a2, the disintegration/repair method 92a3, the estimated cost 92a4 for the repair, the temperature rise value ($T_1$) 92a5 measured at the time of abnormality, and the temperature rise limit ($T_0$) 92a6 onto one picture surface.

A modified example of the display output method of the result of diagnosis will be explained next with reference to FIG. 40(b). In this example the output picture surface is constituted in such a manner that the operator can easily judge the status or condition of the apparatus not only when the abnormality occurs, but also when the display request of the collected data is raised. A past trouble data unit 91D shown in 40(b) stores the content of trouble and its cause that had occurred in the past in each constituent unit, the data collected at that time, the name and data of the portion at which the abnormality was detected and the data of the portions associated electrically and mechanically with that portion. The content of the past trouble data unit 91D are updated automatically as the data are added thereto whenever any abnormality occurs. A processing sequence decision unit 90D for the calculation and analysis data will be explained first with reference to a case where any abnormality exists. This unit decides first the portion at which an abnormality occurs simultaneously from the data of the past trouble data unit 91D of the portion at which abnormality occurs and then the sequence of the portions having higher degree of electrical and mechanical association with the portion at which the abnormality occurs. A data processing unit 90E executes its processing first of the data of the abnormality occurring portion, next the data of the portion at which the abnormality had occurred simultaneously in the past and thereafter the data of the portions having a high degree of electrical and mechanical association. It estimates the progress of the abnormality in the same way as the estimation calculation 90A of the usable period. An image display data decision unit 90F decides the kind of data to be outputted to one picture surface from the sequence processed by the data processing unit 90E and from the content of the abnormality. An output unit 92B displays the data determined by the image display data decision unit 90F such as n output image 92b. In this example the position of the abnormal portion is displayed at 92b1, the trend of the abnormal portion and the estimation of the progress of abnormality (dotted line) at 92b2 and the abnormality associated portions having higher sequence, at 92b3 and 92b4.

Next, the case is described where the condition display of the A unit is requested by the operator, even though no abnormality occurs. In the same way as when the abnormality occurs, the portions that had simultaneously caused the abnormality in the past and the sequence of the portions having high electrical and mechanical association are determined by the past trouble data unit 90D and the processing sequence decision unit 90D for the calculation and analysis data with the designated A portion being the reference. The data are processed in accordance with the sequence determined by the data processing unit 90E. The image display data decision unit 90F decides the kind of data to be displayed on one picture surface with the designated A portion being the center. The output unit 92B displays it such as the output image 92C. The data of the designated A portion is displayed at 92c1 and then the data having higher association, at 92c2, 92c3 and 92c4, respectively. It is of course possible in this case to make display with different colors from the higher sequence of association.

Next, a method of improving further reliability of the abnormality judgement when any abnormality occurs will be explained with reference to FIG. 40(c). Even when the abnormality is judged by the panel 1000, there is a case where an abnormality results from the change of external environment. In such a case, an erroneous judgement will be made. To improve reliability of this diagnosis, a collective judgement unit 90G makes the following processing when the abnormality occurs.

The condition of the thunder or lightning solar radiation, rain, snow, dust, and the like, is detected by the sensor 50B at the same timing as the occurrence of the abnormality, and a change quantity detection unit 60N calculates the change quantity of its signal from before the occurrence of the abnormality. An external noise signal judgement unit 80P judges whether or not it involves with abnormality diagnosis and whether the result of abnormality diagnosis results actually from the internal abnormality of the gas insulation apparatus or from the external noise is judged from the signal from this external noise signal judgement unit 80P and from the signal from the diagnosis unit 80N. After the judgement of the collective judgement unit 90G, the reference change judgement unit 90H judges whether it is necessary to change the reference value 70R of the abnormality judgement and to effect judgement by collecting once again the data. If the change is not necessary, the result of diagnosis is outputted by the output unit 92D. When the reference value 70R must be changed, a sensor change judgement unit 90J judges next whether or not the kind of sensors must be changed. If the change is not necessary, a period change unit 90K changes the period for changing the period of data collection, and the data are collected by the same sensor system. Then, abnormality diagnosis is again effected. If accurate abnormality judgement cannot be made unless the data are collected by a separate sensor system, and when position identification of abnormality and its cause judgement are made by diagnosis of a higher degree, the separate sensor system unit 50C collects the data and the collective judgement unit 90G makes the judgement.

Next, an embodiment relating to collective judgement when a plurality of phenomena are detected simultaneously will be described.

Judgments shown in Table 4 are made in the collective judgement routine 90G inclusive of the external signals shown in FIG. 40(c).

TABLE 4

| Item | 1 | 2 | 3 | 4 | 5 | 6 | 7 |
|---|---|---|---|---|---|---|---|
| insulation abnormality | O | — | — | — | O | O | O |
| power supply abnormality | — | O | — | O | — | O | O |
| mixture of foreign matter | — | — | O | O | O | — | O |
| collective judgement | C | C | C | B | C | B | A |

When any abnormality is detected as described above, the counter-measures are determined in advance in accordance with the kind and number of abnormality. Table 4 represents an example which is determined for the bus portion of the gas insulated apparatus and the mode of collective judgement is determined individually in consideration of the characteristics of the object and the apparatus and their degree of importance. In addition to the examples of abnormality shown in Table 4, there are cases where the operation characteristics of the operation device of the switch unit are measured to detect the switching abnormality, the case where the gas pressure of the insulating gas sealed in the gas insulated apparatus such as the $SF_6$ gas is measured to detect the gas pressure abnormality, and so forth. The system described above makes the collective judgement including these kinds of abnormalities.

Next, the functions exhibited by the central monitoring panel 3000 when any abnormality is detected will be explained with reference to FIG. 42. Due to the partial discharge of the gas insulated apparatus 1, an electric pulse voltage, a voltage-like pulse current, sound, oscillation acceleration of the tank wall, light, decomposition of the SF$_6$ gas, etc., occur. The detectors 50a, 50b, 50c are fitted in order to detect at least one of these factors. The signal detected by each detector 50a, 50b, 50c is processed by the local or field panel 1000 and the processed data is then inputted to the central monitoring panel 3000 for each detector through the transmitting or transfer unit 2000. The central panel 3000 comprises a weighing instruction unit 351 for giving an instruction whether or not to give weight to the processed data by receiving it, an abnormality processing instruction unit 353 for putting weight to each processed data by the instruction from this instruction unit and instructing the countermeasures to be taken, an abnormality processed data base 354 storing therein the countermeasures in accordance with the degree and kind of abnormality, a remaining life diagnosis unit 356 for estimating and displaying the remaining life of the gas insulated apparatus 1, a remaining life data base 357 for providing the data for the estimation by this diagnosis unit 356 and a remaining life display unit 358 for displaying the result of remaining life diagnosis.

The weighing instruction unit 351 compares the processed data from the specific detector 50a with a predetermined threshold value and generates 0 as a weighing coefficient for the processed data from each detector 50a, 50b, 50c if the processed data is below the threshold value and generates a weighing coefficient other than 0 when the former exceeds the latter. The weighing coefficient W assumes a specific value for the detection object of each detector 50 and becomes greater for a detector having lower sensitivity. For example, the weighing coefficients Wa, Wb and Wc are determined as shown in Table 5 if the sensing quantities of the detectors 50a, 50b and 50c are the sensing quantities a, b and c, respectively, and their sensitiveness to abnormality is in the sequence of sensing quantities c, b and a. At this time $Wa > Wb > wc$.

TABLE 5

| sensing quantities | sensitivity | weighing coefficient | data level |
|---|---|---|---|
| a | low | Wa | Ta |
| b | medium | Wb | Tb |
| c | high | Wc | Tc |

The weighing judgement unit 352 calculates an abnormality index S by putting the weighing coefficient generated by the weighing instruction unit 351 to the levels Ta, Tb, Tc of the detectors 50a, 50b, 50c in accordance with the following equation:

$$S = WaTa + WbTb + WcTc$$

The abnormality processing instruction unit 353 ranks this abnormality index S as $S_1, S_2, S_3, \ldots$ ($S_1 < S_2 < S_3$) and instructs to find out the measure to be taken in accordance with each rank from among the abnormality processing data base 354. Since the measure to be taken varies with the kind of abnormality, the kinds of abnormality L, M, N are stored in the data base 354 as shown in Table 6. For instance, when the kind of abnormality is L and the abnormality index is $S_2$ the measure to be taken is $X_2$ and when the kind of abnormality is N and the abnormality index is $S_3$ the measure to be taken is $Z_3$ and they are made to correspond in the following way.

TABLE 6

| abnormality index S | | $S_1$ | $S_2$ | $S_3$ |
|---|---|---|---|---|
| measure | kind of abnormality L | $X_1$ | $X_2$ | $X_3$ |
| | kind of abnormality M | $Y_1$ | $Y_2$ | $Y_3$ |
| | kind of abnormality N | $Z_1$ | $Z_2$ | $Z_3$ |

When partial discharge occurs, its discharge quantity Q increases with time t as shown in FIG. 43. Its change changes generally with the impressed voltages $V_1$, $V_2$, $V_3$. This relation is determined in advance for each of the kinds of abnormality L, M, N and stored in the remaining life data base 357. In other words, as shown in Table 7, it is stored as a typical relational formula $Q = F_L(V, t)$, $F_M(V, t)$, $F_N(V, t)$ of the discharge quantity Q, the voltage V and the time t for the kinds of abnormality L, M, N.

TABLE 7

| kind of abnormality | L | M | N |
|---|---|---|---|
| Q | $F_L(V, t)$ | $F_M(V, t)$ | $F_N(V, t)$ |

Using the relational formula of Table 7 the remaining life diagnosis unit 356 calculates the estimated curve for the future time on the assumption that the same relation is established between the abnormality index S sensed at present, the voltage V and the time t and displays its result on the remaining life display unit 358. As shown in FIG. 44, the abnormality index S is plotted on the ordinate and the time t, on the abscissa and lines representing the rank $S_1$, $S_2$, $S_3$ of the abnormality index, the curve S' representing the change of the abnormality index up to the present, and the curves $S_L$, $S_H$ representing the future change of S estimated by the remaining life diagnosis unit 356 are displayed by the display unit. Here, $S_L$ and $S_H$ correspond to the fluctuation of the $Q-t$ curve of FIG. 43 and correspond to the longest life and the shortest life, respectively. It is possible to determine very easily from this display, after how many days the rank $S_2$ and the rank $S_3$ are exceeded from the present time $t_1$, and planned maintenance/inspection can be effected. Quite naturally, contrivances are made such as the separate use of solid line and dash line, different colors, etc., in order to distinguish the curve S' from $S_H$, $S_L$. The remaining life can be displayed more accurately by displaying the time necessary for exceeding each rank as the rank $S_1$ life, the rank $S_2$ life, the rank $S_3$ life on the picture surface or in the drawing besides the curves S', $S_H$, $S_L$.

FIG. 45 shows the flow of processing relating to the estimation of the usable period and to the provision of maintenance information when any foreign matter is detected. When the central monitoring panel 3000 receives the detection information of foreign matter from the local or field panel 1000, estimation of the length of the foreign matter 30 is first made.

If the conductive foreign matter 30 jumps inside the gas insulated apparatus due to the Coulomb force, the charge of the foreign matter 30 itself is emitted due to the impingement with the tank 2 or the like and the partial discharge detector 304 detects the discharge quantity. FIG. 46 show the impressed or applied voltage-discharge quantity characteristics of the gas insulated apparatus 1 using the lengths $L_1$, $L_2$, $L_3$ of the foreign matter 30 as the parameters. As can be seen from the diagram there is a close relation between the length of the foreign matter 30 and the discharge quantity. Since the discharge quantity is monitored continuously in the system of the present invention, the length of the foreign matter 30 can be estimated from the relation between the impressed voltage to the insulated apparatus 1 and the discharge quantity. The impressed or applied voltage-v-discharge quantity characteristics when the foreign matter 30 exists are measured in advance by simulation.

There is a case where no critical problem occurs for the continuation of operation of the gas insulated apparatus 1 even though foreign matter 30 exists, depending on the magnitude of the impressed or applied voltage. Therefore, the magnitude of the impressed voltage resulting in earthing, that is, flashover voltages $V_{OF1}$, $V_{OF2}$ is estimated. Here, $V_{OF1}$ is the flashover voltage when the commercial frequency is impressed. V OF2 is the flashover voltage when an impulse-like voltage is impressed or applied $V_{OF2}$. Since the length of the foreign matter 30 is known, $V_{OF1}$, $V_{OF2}$ can be estimated from the relation between the length of the foreign matter 30 and the flashover voltage $V_{OF1}$, $V_{OF21}$.

If the value $V_{OF1}$ is smaller than the product of the rated voltage $V_t$ of the gas insulated apparatus 1 by the safety ratio $k_1$, that is, if the flashover voltage $V_{OF1}$ and the rated voltage $V_t$ are approximately, the stop page processing of the gas insulated apparatus such as cut-off of the breaker is conducted. If the flashover voltage $V_{OF1}$ is greater than the rated voltage $V_t$ even when the safety ratio $k_1$ is taken into consideration, the following processing is conducted.

The comparison portion of $V_{OF2}$ and $k_2 \cdot V_{im}$ checks the possibility of occurrence of earthing due to the rise of the impressed voltage of the gas insulation apparatus 1 resulting from a lightning stroke. $V_{OF2}$ is the impulse-like flashover voltage, $k_2$ is the safety ratio in that case and $V_{im}$ the peak value of the impulse-like voltage anticipated by the lightning stroke. $V_{im}$ is determined empirically by the voltage change of the gas insulated apparatus 1 at that position in the past due to a lightning stroke, the voltage change of other facilities due to the lightning stroke, and the like. When $k_2 \cdot V_{im}$ is smaller than $V_{OF2}$ or, in other words, when earthing is not judged to occur even if the lightning stroke occurs, safety is displayed by adding the information such as the position and weight of the foreign matter. In the opposite case or if there is the possibility of earthing due to the lightning stroke, caution is displayed by adding the information such as the position and weight of the foreign matter, and the like. In this case, the information on the judgement result is sent to the collective judgement unit with the external information. When foreign matter 30 is detected, the repair method is selected and the repair cost is calculated even though the foreign matter 30 does not always result in earthing.

The repair method or the method of removing the foreign matter 30 varies with the material of the foreign matter 30. The foreign matter removal method includes the following three methods and is selected in accordance with the position and material of the foreign matter.

(1) A magnet is placed on the outer surface of the tank 2 so as to move the foreign matter to a particle trap which is generally disposed near the spacer.

(2) An ultrasonic motor consisting of an array of piezoelectric devices is placed on the outer surface of the tank 2 to move the foreign matter 30 to the particle trap while letting it jump by the Coulomb force.

(3) The gas insulated apparatus 1 is disassembled and the foreign matter 30 is washed away by a washing liquid.

If the tank 2 is made of a non-magnetic stainless steel or the like and the foreign matter 30 is estimated as a magnetic material, the method (1) having the lowest cost is selected. If there is any step in the tank 2, the method (3) is selected. If the tank 2 is made of a magnetic material or the foreign matter 30 is made of a non-magnetic material, the method (2) is selected. In this instance the diameter of the foreign matter 30 is estimated from the mass, length and material (density) of the foreign matter and the impressed voltage in the foreign matter removing work is estimated. When there is any step in the tank 2 and the foreign matter cannot be moved to the particle trap 11, the method (3) is selected.

The foreign matter removal method (2) will be explained with reference to FIG. 47. The foreign matter 30 exists between the center conductor 14 and the tank 2. The center conductor 14 is supported by the spacer 10 and the particle trap 11 is disposed near it. The piezoelectric device array 401 is disposed on the outer surface of the tank 2. The foreign matter 30 receives the Coulomb force due to the voltage applied between center conductor 14 and the tank 2 and jumps. The interior surface of the tank 2 oscillates as shown in an enlarged view and this wave moves towards the particle trap 11. Therefore, the jumping foreign matter 30 moves towards the particle trap 11 and is finally collected by it.

The repair cost depends on the repair method and the repair position. The cost is calculated from the cost table storing the data that are calculated and stored in advance, and from the moving distance of the foreign matter.

The selected repair method and the calculated repair cost are displayed together with the related information such as the position of the foreign matter.

The judgement result relating to use possibility and the judgement result relating to the repair described above become important data for efficiently operating the gas insulated apparatus 1.

Next, the usable period estimation calculation method at the time of power supply abnormality detection by a tank temperature rise measurement method will be explained. The block 90A shown in FIG. 48 corresponds to the usable period estimation calculation block in FIG. 40. This routine calculates 822 the exothermic calorie of the portion causing local overheating due to the power supply abnormality on the basis of the tank temperature rise measurement data 821 that is inputted from the detector disposed in the substation apparatus to the central monitoring panel. Next, the interpole voltage drop occurring in the power supply abnormality portion is calculated 824 on the basis of the calculation result described above and the power supply current data 823 flowing through the abnormality portion and inputted likewise from the substation apparatus to the center panel. The calculation result of the interpole voltage drop is compared with the data 825 relating to the abnormality progress characteristics that are in advance inputted and stored as the data in the central monitoring panel so as to determine the usable period (826) and this routine is finished. The calculation block described above will be explained in detail next.

In addition to the measurement method using infrared radiation thermometer and the thermocouple described already, various other measurement methods such as a platinum resistance wire system can be used without any particular limitation as the method of collecting the temperature rise measurement data 821. Basically, any method can be employed so long as resolution of about 0.50 C can be secured. However, the inherent problems to each measurement method must be examined to secure detection reliability and sufficient measurement accuracy must be obtained.

FIG. 49 shows the functions of the calorie calculation block 822. In the example shown in the drawing, it consists of a calculation code 827 having the function of convection analysis of the gas inside the tank and the external atmosphere, the function of calculating thermal transfer of the tank and the high potential conductor portion and determining the temperature distribution of each portion and a memory 828 storing the physical constants such as a thermal transfer factor by the shape and material of the tank and the high potential conductor portion. In this routine, the calculation code 827 gives the position information 829 of the abnormality occurring portion to the memory 828 prior to the start of calculation and various dimensions and receives the physical constants 830 corresponding to the abnormality occurring portion. On the basis of the data, the calculation code 827 continues calculation of the temperature rise measurement data of FIG. 48 by changing the exothermic calorie until the coincident temperature rise value can be obtained with predetermined accuracy. This routine is finished when the result is obtained and the flow proceeds to the next step. The time required for the calculation may become long depending on the capacity of the computer used. In this case, a more convenient method is employed sometimes such as a method which neglects the loss due to convection of atmosphere and a method which replaces three-dimensional calculation by two-dimensional calculation. As a further simplified method, it is possible to store the characteristics of the tank temperature rise for the calorie shown in FIG. 50 and to make reference to them. In practice, the temperature rise is determined by the Joule heat due to the power supply current flowing through the high potential conductor portion and the influences of the local exothermally from the power supply abnormality portion. However, since the term "temperature rise value" used herein means the temperature difference of the abnormality portion from the sound portion, it can be regarded as resulting from local exothermicity in the level of practical accuracy and the temperature rise due to the power supply current can be neglected.

The data 823 relating to the power supply current shown in FIG. 48 is the current itself that flows the abnormality portion and the current measured by a current transformer or the like that is generally fitted to a substation apparatus may be used without any problem. Since the power supply abnormality portion has the resistance characteristics, it can be obtained by dividing the calorie obtained in the above manner 10 obtained by the power supply current in accordance with the Ohm's law. The actually measured value is stored for the abnormality progress characteristic data 825. FIG. 51 shows the change characteristics with time of the interpolar voltage measured for the junction portion of the copper conductor as the object. Although the fluctuation of the upper and lower limits 831, 832 exists, the abnormality progress characteristic data 825 for estimating the usable period is determined with some additional margin to the upper limit 831 measured actually. To determine the interpolar voltage $v_1$ as the power supply limit, a melt voltage at which fusion due to the heat of the conductor material starts occurring should be employed and 0.43 V which is equal to the melt voltage of copper is hereby used as $V_1$. As to the concept of the melt voltage, refer to "Electrical Contact Technique" by Zenya Tsuchiya, published by Sogo Denshi Shuppan-Sha (July, 1980), and the like. The time $t_1$ at which power supply abnormality is detected and fusion of the electrode 30 material starts occurring is generally about one month. The usable period calculation block 826 shown in FIG. 1 determines the remaining usable period on the basis of the abnormality progress characteristic data described above while referring to the calculation result of the present interpolar voltage drop.

FIG. 52 shows another embodiment of the diagnosis system in accordance with the present invention. Unlike the detector 50 of the gas insulated apparatus 1 for detecting insulation abnormality, power supply abnormality and foreign matter, the detector 50C in FIGS. 40 and 52 is disposed in order to detect the abnormal voltages such as thunder, switching surge, etc., the meteorological conditions such as temperature, rainfall, wind force, etc., unusual weather such as an earthquake and the various control signals of the system and the substation. When an abnormality is judged by the abnormality judgement of the apparatus and the signal enters from (A), the detector makes the collective judgement together with the aforementioned various detectors 50C so as to change the judgement reference values, the detectors, the detection period and the system.

Examples of such a case are as follows:

(1) Even if the acoustic abnormality signal is detected from the apparatus, the collective judgement such as the change of the reference level is made in accordance with the existence of the operation control signal of the switch such as the breaker and the final judgement is then made (change of the reference value).

(2) If the abnormal voltage is detected, the period of insulation abnormality detection is shortened (change of detection period).

(3) When the temperature change of the apparatus becomes large, the detection interval is changed in accordance with the temperature change by the collective judgement with the atmospheric temperature. If the temperature difference is small, the interval is made short (change of detection period).

(4) When an abnormality such as insulation abnormality or power supply abnormality is detected, the properties of the gas are diagnosed by the decomposed gas detector or the like in order to improve accuracy of life diagnosis (change of detector: from detector 50A to detector 50B).

(5) When abnormality is detected, another system of a movable type is introduced to improve the accuracy of position determination or the like (change of system: from system 90SA to system 90SB).

Since the probability of occurrence of an abnormality occurring in the apparatus is generally extremely low, it is not economical to configure a large scale expensive system. In other words, a system minimizing the kinds of sensors and the fitting number of sensors is employed. FIG. 52 shows an example of a simplified system 90SA. Under such a condition, if the system 90SA makes an abnormality judgement, another system B90SB is sometimes used to make a two-dimensional precision diagnosis or to make periodical precision diagnosis of the apparatus. The system 90SB may be always installed in the same way as the system 90SA or may be of a portable type which is moved only at the time of periodical precision diagnosis. For instance, it is possible to employ the system configuration wherein the system 90SA is only the aforementioned insulation abnormality diagnosis system alone, and when abnormality is judged by this system, the collective diagnosis system of insulation, power supply, the foreign matter, and the like is introduced as the system 90SB. It is convenient to employ an exclusive portable type mounted onto a vehicle as the system 90CB and better economy can be obtained by using it for a plurality of substations. It is further possible to dispose the system B90SB in the form of a robot or the like inside the substation, which is operated upon abnormality detection by the system A90SA to make detailed diagnosis of the abnormality occurring portion.

FIGS. 53 to 57 show the information outputted to external output devices such as CRT, printer, etc., and provided to the operator when any abnormality is detected. Among them, FIG. 53 shows the abnormality detection items and the display content for each item. FIG. 54 shows an example of the insulation monitor display picture surface, FIG. 55 shows an example of the trend display picture surface of the stored data, FIG. 56 shows an example of the temperature characteristics trend display picture surface and FIG. 57 shows an example of the printer output of the stored data.

As described with reference to the foregoing embodiments, the present invention makes it possible to extract the most suitable frequency from the signals from the high sensitivity detectors fitted to the gas insulated apparatus, to transfer and input the suitable signals, to process the data in accordance with the algorithm by an expert system and to display the data. Accordingly, the present invention can make a high precision diagnosis of insulation property and power supply performance of the gas insulated apparatus and can provide a system and method which can give a suitable guidance for the counter-measure for abnormality, prevention measures such as life estimation and preservation of estimation.

What is claimed is;

1. An abnormality diagnosing system for a high-voltage power apparatus comprising:

a plurality of detectors for detecting abnormalities of the high-voltage power apparatus;

local panel means disposed proximate to the high-voltage power apparatus and including means for amplifying outputs of said plurality of detectors; and central monitoring panel means disposed at a location remote from the high-voltage power apparatus and including means responsive to the output signal supplied by said amplifying means of said local panel means through a signal transmitting means and for detecting abnormalities of the high-voltage power apparatus on the basis of the detected signals of said detectors and outputting an abnormality signal;

wherein said plurality of detectors detect a predetermined phenomena indicative of at least an insulation abnormality, power supply abnormality and foreign matter among abnormalities existing inside of the high-voltage power apparatus, at least one of said local panel means and said central monitoring panel means effecting frequency analysis on at least one of abnormality signals from said detectors, one of said local panel means and central monitoring panel means diagnosing the abnormality on the basis of at least one of a predetermined frequency component and a predetermined frequency band component of the frequency analysis result, and said central monitoring panel means providing at least one of an output and display indicative of abnormalities detected.

2. An abnormality diagnosing system according to claim 1, wherein said central monitoring panel means provides information including a type of an abnormality, a degree of abnormal signals, usable continuous operation period and repair method including operation stop, and cost necessary for repair in accordance with an abnormality detected.

3. An abnormality diagnosing system according to claim 1, wherein said plurality of detectors includes a first detector for detecting an occurrence of an abnormality inside the high-voltage power apparatus and a second detector for assisting an abnormality determination by said first detector, said local panel means changing one of a standard for determination of an abnormality of said first detector and a detection interval of said first detector in response to the output of said second detector.

4. An abnormality diagnosing system according to claim 1, wherein said plurality of detectors includes first detectors for detecting a partial discharge and second detectors for detecting a partial discharge and an electromagnetic wave in the atmosphere, and said local panel means includes means for effecting spectral analysis of the output of each of said first and second detectors so that a partial discharge inside the high-voltage power apparatus is identified from the spectrum determined in accordance with the difference between the outputs of said first and second detectors.

5. An abnormality diagnosing system according to claim 1, wherein said plurality of detectors includes plural detectors for detecting a partial discharge near one of each phase and each supply line of the high-voltage power apparatus, and said local panel means includes means for effecting spectral analysis of the output of each of said plural detectors so that a partial discharge inside the high-voltage power apparatus is identified from the spectrum determined in accordance with the difference between the outputs of said plural detectors.

6. An abnormality diagnosing system according to claim 1, wherein said plurality of detectors include an acoustic emission sensor disposed proximate to the high-voltage power apparatus and an acceleration sensor for detecting a signal of a frequency band lower than the detected frequency of the acoustic emission sensor, and said local panel means is responsive to the outputs of the acoustic emission sensor and the acceleration sensor for detecting foreign matter inside the high-voltage power apparatus in accordance with a ratio of the output of the acoustic emission sensor to the output of the acceleration sensor.

7. An abnormality diagnosing system according to claim 1, wherein said plurality of detectors includes an acceleration sensor, and said local means detects spectrum components which are even number multiples of a commercial frequency in the output frequency range of 200 Hz to 5000 Hz and determines power supply abnormality in accordance therewith.

8. An abnormality diagnosing system according to claim 1, wherein said local panel means effects frequency analysis on an output of one detector in said plurality of detectors and selects an output of other sets of detectors for confirmation of detection of the abnormality when an abnormality inside the high-voltage power apparatus is detected on the basis of one of a predetermined frequency component and a predetermined frequency band component.

9. An abnormality diagnosing system according to claim 1, wherein said detector includes a first detector for detecting insulation abnormality of the high-voltage power apparatus, a second detector for detecting power supply abnormality and a third detector for detecting foreign matter, and one of said local panel means and said central monitoring panel means effecting frequency analysis on outputs of one of said first, second, and third detectors or the outputs of said first and third detectors and determining one of whether continuous operation of the high-voltage power apparatus is possible and not possible on the basis of one of a predetermined frequency component and predetermined frequency band component, said central monitoring panel means providing at least one of an output and display of the result thereof.

10. An abnormality diagnosing system according to claim 1, wherein said central monitoring panel means stores an output signal of at least one of said plurality of detectors for a simulated abnormality and calculates a degree of analogy between the stored output signal of the simulated abnormality and an actually detected signal from the at least one of said plurality of detectors at the time of an actual occurrence of an abnormality and determines a place of abnormality occurrence.

11. An abnormality diagnosing system according to claim 1, wherein said plurality of detectors includes a detector for detecting temperature increase of the high-voltage power apparatus caused by power supply abnormality.

12. An abnormality diagnosing system according to claim 1, wherein said central monitoring panel means provides an emergency stop command when an insulation abnormality, power supply abnormality and foreign matter are detected, and said central monitoring panel means provides an emergency stop command after confirmation of the status when one of an insulation abnormality together with a power supply abnormality, and power supply abnormality together with foreign matter are detected.

13. An abnormality diagnosing method for a high voltage power system having a plurality of detectors for detecting abnormalities of the high-voltage power apparatus, a local panel means disposed proximate to the high-voltage power apparatus and including means for amplifying outputs of said plurality of detectors, and a central monitoring panel means disposed at a location remote from the high-voltage power apparatus and including means responsive to the output signals supplied by said amplifying means of said local panel means through a signal transmitting means and for detecting abnormalities of the high-voltage power apparatus on the basis of the detected signals of said detectors and outputting an abnormality signal, comprising the steps of:

detecting predetermined phenomena indicative of at least an insulation abnormality, power supply abnormality and foreign matter among abnormalities existing inside of the high-voltage power apparatus by said plurality of detectors;

performing a frequency analysis by at least one of said local panel means and said central monitoring panel means on at least one of abnormality signals from said detectors;

diagnosing the abnormality by at least one of said local panel means and said central monitoring panel means on the basis of at least one of a predetermined frequency component and a predetermined frequency band component of the frequency analysis result; and providing at least one of an output and display indicative of abnormalities detected by said central monitoring panel means.

14. An abnormality diagnosing method according to claim 13, wherein at least one of said steps of performing and diagnosing includes said central monitoring panel means providing information including a type of abnormality, a degree of abnormal signals, usable continuous operation period and repair method including operation stop, and cost necessary for repair in accordance with an abnormality detected.

15. An abnormality diagnosing method according to claim 13, wherein said plurality of detectors includes a first detector for detecting an occurrence of an abnormality inside the high-voltage power apparatus and a second detector for assisting an abnormality determination by said first detector, and at least one of said steps of performing and diagnosing includes said local panel means changing one of a standard for determination of an abnormality of said first detector and a detection interval of said first detector in response to the output of said second detector.

16. An abnormality diagnosing method according to claim 13, wherein said plurality of detectors includes first detectors for detecting a partial discharge and second detectors for detecting partial discharge and an electromagnetic wave in the atmosphere, and at least one of said steps of performing and diagnosing includes said local panel means effecting spectral analysis of the output of each of said first and second detectors so that a partial discharge inside the high-voltage power apparatus is identified from the spectrum determined in accordance with the difference between the outputs of said first and second detectors.

17. An abnormality diagnosing method according to claim 13, wherein said plurality of detectors includes plural detectors for detecting a partial discharge near one of each phase and each supply line of the high-voltage power apparatus, and at least one of said steps of performing and diagnosing includes said local panel means effecting spectral analysis of the output of each of said plural detectors so that a partial discharge inside the high-voltage power apparatus is identified from the spectrum determined in accordance with the difference between the outputs of said plural detectors.

18. An abnormality diagnosing method according to claim 13, wherein said plurality of detectors include an acoustic emission sensor disposed proximate to the high-voltage power apparatus and an acceleration sensor for detecting a signal of a frequency band lower than the detected frequency of the acoustic emission sensor, and at least one of said steps of detecting, performing and diagnosing includes said local panel means being responsive to the outputs of said acoustic emission sensor and said acceleration sensor for detecting foreign matter inside the high-voltage power apparatus in accordance with a ratio of the output of said acoustic emission sensor to the output of said acceleration sensor.

19. An abnormality diagnosing method according to claim 13, wherein said plurality of detectors includes an acceleration sensor, and at least one of said steps of detecting, performing and diagnosing includes said local panel means detecting spectrum components which are even number multiples of a commercial frequency in an output frequency range of 200 Hz to 5000 Hz and determining power supply abnormality in accordance therewith.

20. An abnormality diagnosing method according to claim 13, wherein at least one of said steps of performing and diagnosing includes said local panel means effecting frequency analysis on an output of one detector in said plurality of detectors and selecting an output of other sets of detectors for confirmation of detection of the abnormality when an abnormality inside the high-voltage power apparatus is detected on the basis of one of a predetermined frequency component and a predetermined frequency band component.

21. An abnormality diagnosing method according to claim 13, wherein said plurality of detectors include a first detector for detecting insulation abnormality of the high-voltage power apparatus, a second detector for detecting power supply abnormality and a third detector for detecting foreign matter, and at least one of said steps of performing, diagnosing and providing includes one of said local panel means and said central monitoring panel means effecting frequency analysis on one of outputs of one of said first, second, and third detectors and outputs of said first and third detectors and determining one of whether continuous operation of the high-voltage power apparatus is possible and not possible on the basis of a predetermined frequency component or predetermined frequency band component and said central monitoring panel means providing at least one of an output and display of the result thereof.

22. An abnormality diagnosing method according to claim 13, wherein at least one of said steps of performing and diagnosing includes said central monitoring panel means storing an output signal of at least one of said plurality of detectors for a simulated abnormality and calculating a degree of analogy between the stored output signal of the simulated abnormality and an actually detected signal from the detector at the time of an actual occurrence of an abnormality and determining a place of abnormality occurrence.

23. An abnormality diagnosing method according to claim 13, wherein said step of detecting includes providing said plurality of detectors with a detector for detecting temperature and detecting a temperature increase of the high-voltage power apparatus caused by power supply abnormality.

24. An abnormality diagnosing method according to claim 13, wherein said step of providing includes said central monitoring panel means providing an emergency stop command when an insulation abnormality, power supply abnormality and foreign matter are detected, and said central monitoring panel means providing an emergency stop command after confirmation of the status when one of an insulation abnormality together with a power supply abnormality, and a power supply abnormality together with foreign matter are detected.

* * * * *